(12) United States Patent
Kurata et al.

(10) Patent No.: US 8,933,471 B2
(45) Date of Patent: Jan. 13, 2015

(54) ORGANIC EL PANEL, DISPLAY DEVICE USING SAME, AND METHOD FOR PRODUCING ORGANIC EL PANEL

(75) Inventors: Keiko Kurata, Hyogo (JP); Noriyuki Matsusue, Osaka (JP); Kazuhiro Yoneda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/488,987

(22) Filed: Jun. 5, 2012

(65) Prior Publication Data

US 2012/0241780 A1    Sep. 27, 2012

Related U.S. Application Data

(63) Continuation of application No. PCT/JP2010/000087, filed on Jan. 8, 2010.

(51) Int. Cl.
| | | |
|---|---|---|
| H01L 29/20 | (2006.01) | |
| H01L 33/00 | (2010.01) | |
| H01L 29/18 | (2006.01) | |
| H01L 29/08 | (2006.01) | |
| H01L 21/00 | (2006.01) | |
| H01L 51/40 | (2006.01) | |

(Continued)

(52) U.S. Cl.
CPC ............ *H01L 27/3211* (2013.01); *H05B 33/02* (2013.01); *H05B 33/10* (2013.01)
USPC .................. 257/89; 257/88; 257/40; 257/98; 257/E51.022; 438/29; 438/35; 438/99; 313/504

(58) Field of Classification Search
USPC .................... 257/40, 79, 88–90, 98, E51.022, 257/E51.018, E27.119; 438/29, 34, 35, 99; 313/503–506
See application file for complete search history.

(56) References Cited

U.S. PATENT DOCUMENTS

| | | | |
|---|---|---|---|
| 5,443,922 A | 8/1995 | Nishizaki et al. | |
| 6,541,130 B2 | 4/2003 | Fukuda | |

(Continued)

FOREIGN PATENT DOCUMENTS

| | | |
|---|---|---|
| CN | 101138107 | 3/2008 |
| CN | 101582440 | 11/2009 |

(Continued)

OTHER PUBLICATIONS

International Search Report and Written Opinion in PCT/JP2010/000087, dated Feb. 2, 2010.

(Continued)

*Primary Examiner* — Fernando L Toledo
*Assistant Examiner* — Aaron Gray
(74) *Attorney, Agent, or Firm* — Greenblum & Bernstein, P.L.C.

(57) ABSTRACT

An organic EL panel includes reflective electrodes, a transparent electrode, organic light-emitting layers, and functional layers that are each provided between a corresponding one of the reflective electrodes and a corresponding one of the respective organic light-emitting layers. The film thicknesses of the respective functional layers of R, G, and B colors are each 60 nm or less such that a local maximum of light-emitting efficiency for a corresponding color is exhibited, and are substantially equal to each other. The optical distances between the respective organic light-emitting layers of the R, G, and B colors and the respective reflective electrodes are each 100 nm or less, and are substantially equal to each other.

40 Claims, 40 Drawing Sheets

(51) Int. Cl.
*H01J 1/62* (2006.01)
*H01J 63/04* (2006.01)
*H01L 27/32* (2006.01)
*H05B 33/02* (2006.01)
*H05B 33/10* (2006.01)

(56) References Cited

U.S. PATENT DOCUMENTS

| | | |
|---|---|---|
| 6,737,800 B1 | 5/2004 | Winters et al. |
| 7,132,789 B2 | 11/2006 | Kobayashi |
| 7,259,514 B2 | 8/2007 | Murayama et al. |
| 7,431,997 B2 | 10/2008 | Hwang et al. |
| 7,518,141 B2 | 4/2009 | Nakamura |
| 7,601,988 B2 | 10/2009 | Seo et al. |
| 7,605,535 B2 | 10/2009 | Kobayashi |
| 7,737,627 B2 | 6/2010 | Hwang et al. |
| 7,741,770 B2 | 6/2010 | Cok et al. |
| 7,851,989 B2 | 12/2010 | Noda |
| 7,872,256 B2 | 1/2011 | Sung et al. |
| 7,875,893 B2 | 1/2011 | Seo et al. |
| 7,960,908 B2 | 6/2011 | Okutani et al. |
| 7,973,319 B2 | 7/2011 | Kashiwabara et al. |
| 8,008,852 B2 | 8/2011 | Aratani et al. |
| 8,021,764 B2 | 9/2011 | Hwang et al. |
| 8,021,765 B2 | 9/2011 | Hwang et al. |
| 8,076,687 B2 | 12/2011 | Kobayashi et al. |
| 8,188,315 B2 | 5/2012 | Hwang et al. |
| 8,188,491 B2 | 5/2012 | Seo et al. |
| 8,203,158 B2 | 6/2012 | Yoshida et al. |
| 2003/0044639 A1 | 3/2003 | Fukuda |
| 2005/0099118 A1 | 5/2005 | Kobayashi |
| 2005/0221124 A1 | 10/2005 | Hwang et al. |
| 2005/0285508 A1 | 12/2005 | Murayama et al. |
| 2006/0020136 A1 | 1/2006 | Hwang et al. |
| 2006/0108919 A1 | 5/2006 | Kobayashi |
| 2006/0115680 A1 | 6/2006 | Hwang et al. |
| 2006/0121313 A1* | 6/2006 | Lee et al. ............... 428/690 |
| 2006/0232203 A1 | 10/2006 | Noda |
| 2007/0013282 A1 | 1/2007 | Okutani et al. |
| 2007/0057264 A1 | 3/2007 | Matsuda |
| 2007/0102737 A1 | 5/2007 | Kashiwabara et al. |
| 2007/0131948 A1 | 6/2007 | Seo et al. |
| 2007/0228367 A1 | 10/2007 | Nakamura |
| 2007/0231503 A1 | 10/2007 | Hwang et al. |
| 2007/0286944 A1 | 12/2007 | Yokoyama et al. |
| 2008/0030129 A1 | 2/2008 | Aratani et al. |
| 2008/0107919 A1 | 5/2008 | Hwang et al. |
| 2008/0203898 A1 | 8/2008 | Kobayashi |
| 2008/0252206 A1 | 10/2008 | Ryu |
| 2008/0258609 A1 | 10/2008 | Nakamura |
| 2009/0026921 A1 | 1/2009 | Kuma et al. |
| 2009/0072709 A1 | 3/2009 | Kobayashi |
| 2009/0081480 A1* | 3/2009 | Takeda et al. ............ 428/690 |
| 2009/0091238 A1 | 4/2009 | Cok et al. |
| 2009/0096358 A1 | 4/2009 | Lee et al. |
| 2009/0096359 A1 | 4/2009 | Lee et al. |
| 2009/0278450 A1 | 11/2009 | Sonoyama et al. |
| 2009/0283786 A1* | 11/2009 | Kobayashi et al. ............ 257/98 |
| 2010/0006872 A1 | 1/2010 | Seo et al. |
| 2010/0231484 A1 | 9/2010 | Cok et al. |
| 2011/0108864 A1 | 5/2011 | Seo et al. |
| 2011/0140101 A1 | 6/2011 | Noda |
| 2011/0241038 A1 | 10/2011 | Kashiwabara et al. |
| 2011/0316414 A1 | 12/2011 | Nendai |
| 2012/0025224 A1 | 2/2012 | Yuasa |
| 2012/0099312 A1 | 4/2012 | Yoshioka et al. |
| 2012/0104423 A1 | 5/2012 | Kurata et al. |
| 2012/0126272 A1 | 5/2012 | Kurata et al. |
| 2012/0205688 A1 | 8/2012 | Seo et al. |
| 2012/0211733 A1 | 8/2012 | Hwang et al. |
| 2013/0193419 A1 | 8/2013 | Mizuno |

FOREIGN PATENT DOCUMENTS

| | | |
|---|---|---|
| EP | 1052708 | 11/2000 |
| EP | 1862524 | 12/2007 |
| JP | 4-137485 | 5/1992 |
| JP | 4-328294 | 11/1992 |
| JP | 5-163488 | 6/1993 |
| JP | 2000-323277 | 11/2000 |
| JP | 2004-014360 | 1/2004 |
| JP | 2004-253389 | 9/2004 |
| JP | 2005-100946 | 4/2005 |
| JP | 2005-116516 | 4/2005 |
| JP | 2005-209421 | 8/2005 |
| JP | 2005-317255 | 11/2005 |
| JP | 2005-322435 | 11/2005 |
| JP | 2006-012579 | 1/2006 |
| JP | 2006-156344 | 6/2006 |
| JP | 2006-173089 | 6/2006 |
| JP | 2006-179780 | 7/2006 |
| JP | 2006179780 A * | 7/2006 |
| JP | 2006-303463 | 11/2006 |
| JP | 2007-027042 | 2/2007 |
| JP | 2007-157732 | 6/2007 |
| JP | 2007-280677 | 10/2007 |
| JP | 2007-318101 | 12/2007 |
| JP | 4-046948 | 2/2008 |
| JP | 2008-041925 | 2/2008 |
| JP | 4046948 | 2/2008 |
| JP | 2009-272150 | 11/2009 |
| JP | 2009-277507 | 11/2009 |
| JP | 2010-067482 | 3/2010 |
| JP | 2010-118163 | 5/2010 |
| JP | 2010-251156 | 11/2010 |
| WO | 2009/048520 | 4/2009 |

OTHER PUBLICATIONS

International Search Report and Written Opinion in PCT/JP2010/006862, dated Jan. 11, 2011, corrected version.
International Search Report and Written Opinion in PCT/JP2010/006859, dated Jan. 11, 2011.
International Search Report and Written Opinion in PCT/JP2010/006861, dated Jan. 11, 2011.
International Search Report and Written Opinion in PCT/JP2010/006860, dated Jan. 11, 2011.
U.S. Appl. No. 13/819,059 to Keiko Kurata et al., filed Feb. 26, 2013.
U.S. Appl. No. 13/819,062 to Keiko Kurata et al., filed Feb. 26, 2013.
U.S. Appl. No. 13/819,066 to Keiko Kurata et al., filed Feb. 26, 2013.
U.S. Appl. No. 13/818,797 to Keiko Kurata et al., filed Feb. 25, 2013.
International Search Report in PCT/JP2010/000087, dated Feb. 2, 2010.
International Preliminary Report on Patentability in PCT/JP2010/000087, dated Dec. 5, 2011.
Office Action from the Patent Office of the People's Republic of China in Chinese Patent Application No. 201080059449.5, dated Jun. 13, 2014, together with a partial English language translation thereof.
Office Action from U.S. Appl. No. 13/819,059, dated Jul. 7, 2014.
Office Action from U.S. Appl. No. 13/819,066, dated Jan. 10, 2014.
Office Action from U.S. Appl. No. 13/819,062, dated Feb. 6, 2014.
Office Action from U.S. Appl. No. 13/818,797, dated Apr. 14, 2014.
Office Action from U.S. Appl. No. 13/819,066, dated May 6, 2014.
Office Action from U.S. Appl. No. 13/819,059, dated Apr. 11, 2014.
International Preliminary Report on Patentability in PCT/JP2010/006862, dated Oct. 18, 2012, together with an English language translation thereof.
International Preliminary Report on Patentability in PCT/JP2010/006859, dated Oct. 17, 2012, together with an English language translation thereof.
International Preliminary Report on Patentability in PCT/JP2010/006861, dated Oct. 22, 2012, together with an English language translation thereof.
International Preliminary Report on Patentability in PCT/JP2010/006860, dated Oct. 17, 2012, together with an English language translation thereof.

* cited by examiner

FIG. 7

| | | Film thickness [nm] | | Film thickness margin [nm] | | Efficiency [cd/A] | Chromaticity (x, y) |
|---|---|---|---|---|---|---|---|
| | | Transparent conductive layer (ITO) | Hole transport layer | Tolerable limits of difference in film thickness | Tolerable margin width | | |
| Example 1 (1st cavity) | R | 20 | 25 | −15 to +10 | 25 (55%) | 2.1 | 0.66, 0.34 |
| | G | 20 | 15 | −15 to +7 | 22 (63%) | 4.9 | 0.29, 0.67 |
| | B | 20 | 10 | −20 to +8 | 28 (93%) | 0.49 | 0.13, 0.06 |
| Comparative example 1 (2nd cavity) | R | 20 | 220 | −8 to +6 | 14 (5.8%) | 1.4 | 0.67, 0.33 |
| | G | 20 | 172 | — | 0 | 4.2 | 0.29, 0.68 |
| | B | 20 | 155 | −10 to +7 | 17 (9.7%) | 0.23 | 0.13, 0.06 |

FIG. 8

| Efficiency variation in panel (%) | 20 |
|---|---|
| Chromaticity variation in panel | $\Delta x < 0.04$  $\Delta y < 0.04$ |
| Brightness | $\geq 90\%$ @30°<br>$\geq 80\%$ @45° |
| Brightness and chromaticity | $\Delta x < 0.04$ @50°<br>$\Delta y < 0.04$ @50° |

FIG. 9

| | | Film thickness [nm] | | Optical distance L [nm] | $\phi/2\pi$ | $2L/\lambda$ | m |
|---|---|---|---|---|---|---|---|
| | | Transparent conductive layer (ITO) | Hole transport layer | | | | |
| Example 1 (1st cavity) | R | 20 | 25 | 78.3 | −0.24 | 0.24 | 0 |
| | G | 20 | 15 | 65.1 | −0.24 | 0.24 | 0 |
| | B | 20 | 10 | 57.8 | −0.25 | 0.25 | 0 |
| Example 1' | R | 20 | 25 | 116.3 | −0.16 | 0.36 | 0+0.20 |
| | G | 20 | 15 | 104.7 | −0.18 | 0.39 | 0+0.21 |
| | B | 20 | 10 | 98.5 | −0.21 | 0.42 | 0+0.21 |
| Comparative example 1 (2nd cavity) | R | 20 | 220 | 394.4 | −0.24 | 1.24 | 1 |
| | G | 20 | 172 | 331.9 | −0.24 | 1.24 | 1 |
| | B | 20 | 155 | 293.5 | −0.25 | 1.25 | 1 |

Example 1 (1st cavity) brightness variation of Green

Comparative example 1 (2nd cavity) brightness variation of Green

Example 1 (1st cavity) chromaticity variation of Green

Comparative example 1 (2nd cavity) chromaticity variation of Green

Example 1 (1st cavity)
brightness variation of Red

Comparative example 1 (2nd cavity)
brightness variation of Red

Example 1 (1st cavity)
chromaticity variation of Red

Comparative example 1 (2nd cavity)
chromaticity variation of Red

Example 1 (1st cavity) brightness variation of Blue

Comparative example 1 (2nd cavity) brightness variation of Blue

Example 1 (1st cavity) chromaticity variation of Blue

Comparative example 1 (2nd cavity) chromaticity variation of Blue

FIG. 14

| | | Film thickness [nm] | | Film thickness margin [nm] | | Efficiency [cd/A] | Chromaticity (x, y) |
|---|---|---|---|---|---|---|---|
| | | Transparent conductive layer (ITO) | Hole transport layer | Tolerable limits of difference in film thickness | Tolerable margin width | | |
| Example 2 (1st cavity) | R | 15 | 13 | −4 to +20 | 24 (86%) | 1.7 | 0.67, 0.33 |
| | G | 15 | 12 | −11 to +16 | 27 (100%) | 6.0 | 0.29, 0.66 |
| | B | 15 | 11 | −10 to +9 | 19 (73%) | 0.42 | 0.13, 0.06 |
| Comparative example 2 (2nd cavity) | R | 15 | 195 | −8 to +8 | 16 (7.6%) | 1.4 | 0.67, 0.33 |
| | G | 15 | 170 | — | 0 | 5.4 | 0.29, 0.67 |
| | B | 15 | 148 | −8 to +10 | 18 (11%) | 0.33 | 0.13, 0.07 |

FIG. 15

| | | Film thickness [nm] | | Optical distance L [nm] | $\phi/2\pi$ | $2L/\lambda$ | m |
|---|---|---|---|---|---|---|---|
| | | Transparent conductive layer (ITO) | Hole transport layer | | | | |
| Example 2 (1st cavity) | R | 15 | 13 | 50.7 | −0.16 | 0.16 | 0 |
| | G | 15 | 12 | 48.9 | −0.18 | 0.18 | 0 |
| | B | 15 | 11 | 48.8 | −0.21 | 0.21 | 0 |
| Example 2' | R | 15 | 13 | 88.7 | −0.16 | 0.28 | 0+0.12 |
| | G | 15 | 12 | 86.9 | −0.18 | 0.32 | 0+0.15 |
| | B | 15 | 11 | 88.8 | −0.21 | 0.38 | 0+0.17 |
| Comparative example 2 (2nd cavity) | R | 15 | 195 | 360.0 | −0.16 | 1.13 | 1 |
| | G | 15 | 170 | 317.5 | −0.18 | 1.19 | 1 |
| | B | 15 | 148 | 281.6 | −0.21 | 1.20 | 1 |

Example 2 (1st cavity) brightness variation of Green

Comparative example 2 (2nd cavity) brightness variation of Green

Example 2 (1st cavity) chromaticity variation of Green

Comparative example 2 (2nd cavity) chromaticity variation of Green

Example 2 (1st cavity)
brightness variation of Red

Comparative example 2 (2nd cavity)
brightness variation of Red

Example 2 (1st cavity)
chromaticity variation of Red

Comparative example 2 (2nd cavity)
chromaticity variation of Red

FIG. 20

| | | Film thickness [nm] | | Film thickness margin [nm] | | Efficiency [cd/A] | Chromaticity (x, y) |
|---|---|---|---|---|---|---|---|
| | | Transparent conductive layer (IZO) | Hole transport layer | Tolerable limits of difference in film thickness | Tolerable margin width | | |
| Example 3 (1st cavity) | R | 20 | 30 | −10 to +13 | 23 (46%) | 2.0 | 0.66, 0.34 |
| | G | 20 | 21 | −10 to +11 | 21 (51%) | 4.7 | 0.29, 0.67 |
| | B | 20 | 15 | −15 to +11 | 26 (74%) | 0.49 | 0.13, 0.06 |
| Comparative example 3 (2nd cavity) | R | 20 | 217 | −5 to +8 | 13 (5.5%) | 1.6 | 0.66, 0.34 |
| | G | 20 | 185 | — | 0 | 3.9 | 0.29, 0.68 |
| | B | 20 | 152 | −3 to +10 | 13 (7.6%) | 0.38 | 0.13, 0.06 |

FIG. 21

| | | Film thickness [nm] | | Optical distance L [nm] | $\phi/2\pi$ | $2L/\lambda$ | m |
|---|---|---|---|---|---|---|---|
| | | Transparent conductive layer (IZO) | Hole transport layer | | | | |
| Example 3 (1st cavity) | R | 20 | 30 | 89.3 | -0.28 | 0.28 | 0 |
| | G | 20 | 21 | 73.7 | -0.28 | 0.28 | 0 |
| | B | 20 | 15 | 65.7 | -0.28 | 0.28 | 0 |
| Example 3' | R | 20 | 30 | 127.3 | -0.28 | 0.40 | 0+0.12 |
| | G | 20 | 21 | 111.7 | -0.28 | 0.42 | 0+0.14 |
| | B | 20 | 15 | 105.7 | -0.28 | 0.45 | 0+0.17 |
| Comparative example 3 (2nd cavity) | R | 20 | 217 | 409.1 | -0.28 | 1.28 | 1 |
| | G | 20 | 185 | 343.0 | -0.28 | 1.28 | 1 |
| | B | 20 | 152 | 299.9 | -0.28 | 1.28 | 1 |

Example 3 (1st cavity) brightness variation of Green

Comparative example 3 (2nd cavity) brightness variation of Green

Example 3 (1st cavity) chromaticity variation of Green

Comparative example 3 (2nd cavity) chromaticity variation of Green

Example 3 (1st cavity) brightness variation of Red

Comparative example 3 (2nd cavity) brightness variation of Red

Example 3 (1st cavity) chromaticity variation of Red

Comparative example 3 (2nd cavity) chromaticity variation of Red

Example 3 (1st cavity) brightness variation of Blue

Comparative example 3 (2nd cavity) brightness variation of Blue

Example 3 (1st cavity) chromaticity variation of Blue

Comparative example 3 (2nd cavity) chromaticity variation of Blue

FIG. 26

| | | Film thickness [nm] | | | Film thickness margin [nm] | | Efficiency [cd/A] | Chromaticity (x, y) |
|---|---|---|---|---|---|---|---|---|
| | | Transparent conductive layer (IZO) | Hole transport layer | Hole injection layer | Tolerable limits of difference in film thickness | Tolerable margin width | | |
| Example 4 (1st cavity) | R | 20 | 25 | 5 | −13 to +13 | 26 (50%) | 1.9 | 0.66, 0.34 |
| | G | 20 | 16 | 5 | −17 to +11 | 28 (68%) | 4.7 | 0.29, 0.67 |
| | B | 20 | 9 | 5 | −14 to +12 | 26 (74%) | 0.49 | 0.13, 0.06 |
| Comparative example 4 (2nd cavity) | R | 20 | 212 | 5 | −3 to +10 | 13 (5.5%) | 1.6 | 0.66, 0.34 |
| | G | 20 | 180 | 5 | — | 0 | 4.0 | 0.28, 0.69 |
| | B | 20 | 146 | 5 | −3 to +10 | 13 (7.6%) | 0.38 | 0.13, 0.06 |

FIG. 27

| | | Film thickness [nm] | | | Optical distance L [nm] | $\phi/2\pi$ | $2L/\lambda$ | m |
|---|---|---|---|---|---|---|---|---|
| | | Transparent conductive layer (IZO) | Hole transport layer | Hole injection layer | | | | |
| Example 4 (1st cavity) | R | 20 | 25 | 5 | 90.1 | -0.28 | 0.28 | 0 |
| | G | 20 | 16 | 5 | 75.2 | -0.28 | 0.28 | 0 |
| | B | 20 | 9 | 5 | 65.4 | -0.28 | 0.28 | 0 |
| Example 4' | R | 20 | 25 | 5 | 128.1 | -0.28 | 0.40 | 0+0.12 |
| | G | 20 | 16 | 5 | 113.2 | -0.28 | 0.42 | 0+0.14 |
| | B | 20 | 9 | 5 | 105.4 | -0.28 | 0.45 | 0+0.17 |
| Comparative example 4 (2nd cavity) | R | 20 | 212 | 5 | 408.0 | -0.28 | 1.28 | 1 |
| | G | 20 | 173 | 5 | 342.1 | -0.28 | 1.28 | 1 |
| | B | 20 | 146 | 5 | 299.7 | -0.28 | 1.28 | 1 |

Example 4 (1st cavity)
brightness variation of Green

Comparative example 4 (2nd cavity)
brightness variation of Green

Example 4 (1st cavity)
chromaticity variation of Green

Comparative example 4 (2nd cavity)
chromaticity variation of Green

Example 4 (1st cavity) brightness variation of Red

Comparative example 4 (2nd cavity) brightness variation of Red

Example 4 (1st cavity) chromaticity variation of Red

Comparative example 4 (2nd cavity) chromaticity variation of Red

Example 4 (1st cavity) brightness variation of Blue

Comparative example 4 (2nd cavity) brightness variation of Blue

Example 4 (1st cavity) chromaticity variation of Blue

Comparative example 4 (2nd cavity) chromaticity variation of Blue

FIG. 32

| | | Film thickness [nm] | | | Film thickness margin [nm] | | Efficiency [cd/A] | Chromaticity (x, y) |
|---|---|---|---|---|---|---|---|---|
| | | Transparent conductive layer (ITO) | Hole transport layer | Hole injection layer | Tolerable limits of difference in film thickness | Tolerable margin width | | |
| Example 5 (1st cavity) | R | 20 | 15 | 5 | −13 to +10 | 23 (57%) | 2.1 | 0.66, 0.34 |
| | G | 20 | 9 | 5 | −12 to +8 | 20 (59%) | 5.0 | 0.29, 0.67 |
| | B | 20 | 5 | 5 | −14 to +6 | 67% | 0.49 | 0.13, 0.06 |
| Comparative example 5 (2nd cavity) | R | 20 | 213 | 5 | −7 to +4 | 11 (4.6%) | 1.5 | 0.67, 0.33 |
| | G | 20 | 166 | 5 | — | 0 | 4.2 | 0.29, 0.68 |
| | B | 20 | 143 | 5 | −9 to +6 | 15 (8.9%) | 0.35 | 0.13, 0.06 |

FIG. 33

| | | Film thickness [nm] | | | Optical distance L [nm] | φ/2π | 2L/λ | m |
|---|---|---|---|---|---|---|---|---|
| | | Transparent conductive layer (ITO) | Hole transport layer | Hole injection layer | | | | |
| Example 5 (1st cavity) | R | 20 | 15 | 5 | 76.2 | -0.24 | 0.24 | 0 |
| | G | 20 | 9 | 5 | 64.9 | -0.24 | 0.24 | 0 |
| | B | 20 | 5 | 5 | 58.6 | -0.25 | 0.25 | 0 |
| Example 5' | R | 20 | 15 | 5 | 118.2 | -0.24 | 0.37 | 0+0.13 |
| | G | 20 | 9 | 5 | 104.5 | -0.24 | 0.39 | 0+0.15 |
| | B | 20 | 5 | 5 | 98.6 | -0.25 | 0.42 | 0+0.17 |
| Comparative example 5 (2nd cavity) | R | 20 | 213 | 5 | 394.9 | -0.24 | 1.24 | 1 |
| | G | 20 | 166 | 5 | 331.7 | -0.24 | 1.24 | 1 |
| | B | 20 | 143 | 5 | 293.1 | -0.25 | 1.25 | 1 |

Example 5 (1st cavity) brightness variation of Green

Comparative example 5 (2nd cavity) brightness variation of Green

Example 5 (1st cavity) chromaticity variation of Green

Comparative example 5 (2nd cavity) chromaticity variation of Green

Example 5 (1st cavity) brightness variation of Red

Comparative example 5 (2nd cavity) brightness variation of Red

Example 5 (1st cavity) chromaticity variation of Red

Comparative example 5 (2nd cavity) chromaticity variation of Red

Example 5 (1st cavity) brightness variation of Blue

Comparative example 5 (2nd cavity) brightness variation of Blue

Example 5 (1st cavity) chromaticity variation of Blue

Comparative example 5 (2nd cavity) chromaticity variation of Blue

FIG. 37

| | Functional layer | RED [nm] | | | GREEN [nm] | | | BLUE [nm] | | |
|---|---|---|---|---|---|---|---|---|---|---|
| | | Film thickness d | Total of d | Optical distance L | Film thickness d | Total of d | Optical distance L | Film thickness d | Total of d | Optical distance L |
| Example 1 (1st cavity) | Hole transport layer | 25 | 45 | 78.3 | 15 | 35 | 65.1 | 10 | 30 | 57.8 |
| | Transparent conductive layer (ITO) | 20 | | | 20 | | | 20 | | |
| Example 2 (1st cavity) | Hole transport layer | 13 | 28 | 50.7 | 12 | 27 | 48.9 | 11 | 26 | 48.8 |
| | Transparent conductive layer (ITO) | 15 | | | 15 | | | 15 | | |
| Example 3 (1st cavity) | Hole transport layer | 30 | 50 | 89.3 | 21 | 41 | 73.7 | 15 | 35 | 65.7 |
| | Transparent conductive layer (IZO) | 20 | | | 20 | | | 20 | | |
| Example 4 (1st cavity) | Hole injection layer | 25 | 50 | 90.1 | 16 | 41 | 75.2 | 9 | 34 | 65.4 |
| | Transparent conductive layer (IZO) | 5 | | | 5 | | | 5 | | |
| | | 20 | | | 20 | | | 20 | | |
| Example 5 (1st cavity) | Hole transport layer | 15 | 40 | 76.2 | 9 | 34 | 64.9 | 5 | 30 | 58.6 |
| | Hole injection layer | 5 | | | 5 | | | 5 | | |
| | Transparent conductive layer (ITO) | 20 | | | 20 | | | 20 | | |
| Comparative example 1 (2nd cavity) | Hole transport layer | 220 | 240 | 394.4 | 172 | 192 | 331.9 | 155 | 175 | 293.5 |
| | Transparent conductive layer (ITO) | 20 | | | 20 | | | 20 | | |
| Comparative example 2 (2nd cavity) | Hole transport layer | 195 | 210 | 360 | 170 | 185 | 317.5 | 148 | 163 | 281.6 |
| | Transparent conductive layer (ITO) | 15 | | | 15 | | | 15 | | |
| Comparative example 3 (2nd cavity) | Hole transport layer | 217 | 237 | 409.1 | 185 | 205 | 343 | 152 | 172 | 299.9 |
| | Transparent conductive layer (IZO) | 20 | | | 20 | | | 20 | | |
| Comparative example 4 (2nd cavity) | Hole injection layer | 212 | 237 | 408 | 173 | 198 | 342.1 | 146 | 171 | 299.7 |
| | Transparent conductive layer (IZO) | 5 | | | 5 | | | 5 | | |
| | | 20 | | | 20 | | | 20 | | |
| Comparative example 5 (2nd cavity) | Hole transport layer | 213 | 238 | 394.9 | 166 | 191 | 331.7 | 143 | 168 | 293.1 |
| | Hole injection layer | 5 | | | 5 | | | 5 | | |
| | Transparent conductive layer (ITO) | 20 | | | 20 | | | 20 | | |

FIG. 38

| | Functional layer | ΔRG (RED-GREEN) [nm] | | ΔGB (GREEN-BLUE) [nm] | | ΔRB (RED-BLUE) [nm] | |
|---|---|---|---|---|---|---|---|
| | | Δd | Total of Δd | ΔL | Δd | Total of Δd | ΔL | Δd | Total of Δd | ΔL |
| Example 1 (1st cavity) | Hole transport layer | 10 | 10 | 13.2 | 5 | 5 | 7.3 | 15 | 15 | 20.5 |
| | Transparent conductive layer (ITO) | 0 | | | 0 | | | 0 | | |
| Example 2 (1st cavity) | Hole transport layer | 1 | 1 | 1.8 | 1 | 1 | 0.1 | 2 | 2 | 1.9 |
| | Transparent conductive layer (ITO) | 0 | | | 0 | | | 0 | | |
| Example 3 (1st cavity) | Hole transport layer | 9 | 9 | 15.6 | 6 | 6 | 8 | 15 | 15 | 23.6 |
| | Transparent conductive layer (IZO) | 0 | | | 0 | | | 0 | | |
| Example 4 (1st cavity) | Hole transport layer | 9 | 9 | 14.9 | 7 | 7 | 9.8 | 16 | 16 | 24.7 |
| | Hole injection layer | 0 | | | 0 | | | 0 | | |
| | Transparent conductive layer (IZO) | 0 | | | 0 | | | 0 | | |
| Example 5 (1st cavity) | Hole transport layer | 6 | 6 | 11.3 | 4 | 4 | 6.3 | 10 | 10 | 17.6 |
| | Hole injection layer | 0 | | | 0 | | | 0 | | |
| | Transparent conductive layer (ITO) | 0 | | | 0 | | | 0 | | |
| Comparative example 1 (2nd cavity) | Hole transport layer | 48 | 48 | 62.5 | 17 | 17 | 38.4 | 65 | 65 | 100.9 |
| | Transparent conductive layer (ITO) | 0 | | | 0 | | | 0 | | |
| Comparative example 2 (2nd cavity) | Hole transport layer | 25 | 25 | 42.5 | 22 | 22 | 35.9 | 47 | 47 | 78.4 |
| | Transparent conductive layer (IZO) | 0 | | | 0 | | | 0 | | |
| Comparative example 3 (2nd cavity) | Hole transport layer | 32 | 32 | 66.1 | 33 | 33 | 43.1 | 65 | 65 | 109.2 |
| | Transparent conductive layer (IZO) | 0 | | | 0 | | | 0 | | |
| Comparative example 4 (2nd cavity) | Hole transport layer | 39 | 39 | 65.9 | 27 | 27 | 42.4 | 66 | 66 | 108.3 |
| | Hole injection layer | 0 | | | 0 | | | 0 | | |
| | Transparent conductive layer (IZO) | 0 | | | 0 | | | 0 | | |
| Comparative example 5 (2nd cavity) | Hole transport layer | 47 | 47 | 63.2 | 23 | 23 | 38.6 | 70 | 70 | 101.8 |
| | Hole injection layer | 0 | | | 0 | | | 0 | | |
| | Transparent conductive layer (ITO) | 0 | | | 0 | | | 0 | | |

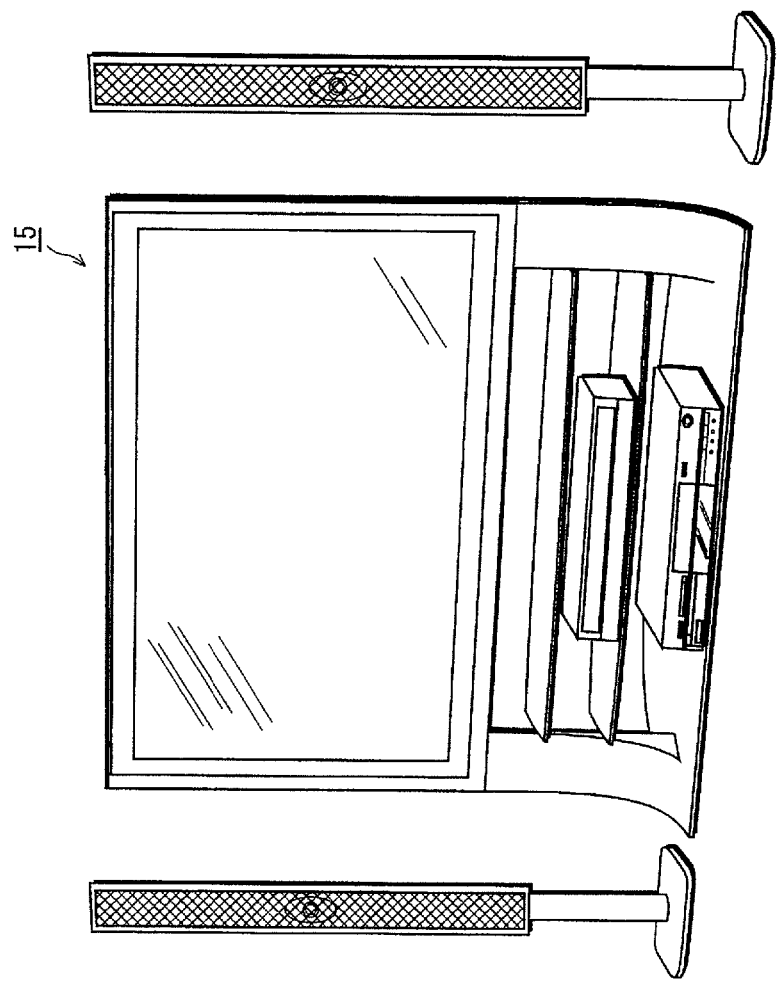

US 8,933,471 B2

ORGANIC EL PANEL, DISPLAY DEVICE USING SAME, AND METHOD FOR PRODUCING ORGANIC EL PANEL

CROSS REFERENCE TO RELATED APPLICATION

This is a continuation application of PCT Application No. PCT/JP2010/000087 filed Jan. 8, 2010, designating the United States of America, the disclosure of which, including the specification, drawings and claims, is incorporated herein by reference in its entirety.

TECHNICAL FIELD

The present invention relates to an organic EL panel that relies on electroluminescence phenomenon of organic materials, a display device with the organic EL panel, and a method of manufacturing the organic EL panel.

DESCRIPTION OF THE RELATED ART

In recent years, there has been proposed adoption of organic Electro Luminescence (EL) panels that rely on electroluminescence phenomenon of organic materials as display panels for display devices such as digital televisions. A matrix of respective organic light-emitting elements of R (red), G (green), and B (blue) colors is arranged in a substrate of an organic EL panel.

It is important to improve light-extraction efficiency of the organic light-emitting element of each of the R, G, and B colors, from the standpoint of reducing power consumption, increasing service life of the organic EL panel, and the like. To this end, Patent Literature 1 proposes an art of increasing transmitted-light intensity of an organic light-emitting element constituted from a reflecting film, an inter-layer insulating film, a first transparent electrode, a hole transport layer, an organic light-emitting layer, an electron injection layer, and a second transparent electrode that are layered on a substrate. Transmitted-light intensity is increased by using the phenomenon of interference between direct light that travels directly from the organic light-emitting layer towards the second transparent electrode and reflective light that reflects off the reflecting film after being emitted from the organic light-emitting layer and then travels towards the second transparent electrode (paragraphs 0022-0024). Specifically, Patent Literature 1 describes that the respective organic light-emitting layers of the R, G, and B colors are adjusted to have a film thickness of 245 nm, a film thickness of 563 nm, and a film thickness of 503 nm, respectively such that respective differences in optical path for the R, G, and B colors between direct light and reflective light are 1. 5 times, 3. 5 times, and 3. 5 times of a wavelength of light, respectively (paragraphs 0041-0046). This Patent Literature 1 describes that the above structure enables to increase the transmitted-light intensity for each of the R, G, and B colors.

CITATION LIST

Patent Literature

[Patent Literature 1] Japanese Patent No. 4046948

SUMMARY

However, according to the above conventional art, the layers from the organic light-emitting layer to the reflecting film each differ in film thickness between the R, G, and B colors by up to 318 nm. This causes a problem that it is troublesome to adjust the film thickness for each of the R, G, and B colors.

In view of this problem, one non-limiting and exemplary embodiment provides an organic EL panel, a display device with the organic EL panel, and a method of manufacturing the organic EL panel according to which light-extraction efficiency is improved due to light interference phenomenon, and the film thickness is simply adjusted for each of the R, G, and B colors compared with conventional arts.

In one general aspect, the techniques disclosed here feature; an organic EL panel, comprising: first electrodes that reflect incident light; a second electrode that faces the first electrodes, and transmits incident light therethrough; an organic light-emitting layer of each of R (red), G (green), and B (blue) colors that is disposed between a corresponding one of the first electrodes and the second electrode, and emits light of a corresponding color due to voltage application between the corresponding first electrode and the second electrode; a functional layer of each of the R, G, and B colors that is composed of one or more layers, and is disposed between a corresponding one of the first electrodes and the organic light-emitting layer of a corresponding color, wherein a first portion of light of each of the R, G, and B colors emitted from the organic light-emitting layer of the corresponding color travels through the second electrode instead of towards the corresponding first electrode, and is emitted externally after passing through the second electrode, a second portion of the light of each of the R, G, and B colors travels through the functional layer of the corresponding color towards the corresponding first electrode, strikes and is reflected by the corresponding first electrode, and is emitted externally after passing through the functional layer of the corresponding color, the organic light-emitting layer of the corresponding color, and the second electrode, the respective functional layers of the R, G, and B colors have substantially a same film thickness of 60 nm or less and corresponds to a local maximum of light-emitting efficiency of the corresponding color, and respective optical distances between the respective organic light-emitting layers of the R, G, and B colors and the respective first electrodes are each 100 nm or less and are substantially equal to each other.

According to the organic EL panel that is one aspect of the present invention, the film thickness of the functional layer provided between the organic light-emitting layer and the first electrode is adjusted so as to correspond to a local maximum of light-emitting efficiency. This improves light-extraction efficiency for each of the R, G, and B colors. Also, the respective functional layers of the R, G, and B colors have substantially the same film thickness, and accordingly the film thickness is simply adjusted for each of the R, G, and B colors compared with conventional arts.

Note that there has especially proved a drastic improvement of viewing angle characteristics of a G (green) organic EL element in the above organic EL panel.

These general and specific aspects may be implemented using a manufacturing method.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF DRAWINGS

FIG. 7 shows comparison of adoption of the 1st cavity with adoption of the 2nd cavity for organic EL elements under the same conditions as those in FIG. 5.

FIG. 8 shows allowable ranges of difference in brightness and chromaticity.

FIG. 9 shows parameters of Equation 1 in Example 1 and Comparative example 1.

FIG. 10C and FIG. 10D show viewing angle dependence of chromaticity in Example 1 and Comparative example 1, respectively.

FIG. 11C and FIG. 11D show viewing angle dependence of chromaticity in Example 1 and Comparative example 1, respectively.

FIG. 12C and FIG. 12D show viewing angle dependence of chromaticity in Example 1 and Comparative example 1, respectively.

FIG. 14 shows comparison of adoption of the 1st cavity with adoption of the 2nd cavity for organic EL elements under the same conditions as those in FIG. 13.

FIG. 15 shows parameters of Equation 1 in Example 2 and Comparative example 2.

FIG. 16C and FIG. 16D show viewing angle dependence of chromaticity in Example 2 and Comparative example 2, respectively.

FIG. 17C and FIG. 17D show viewing angle dependence of chromaticity in Example 2 and Comparative example 1, respectively.

FIG. 18C and FIG. 18D show viewing angle dependence of chromaticity in Example 2 and Comparative example 2, respectively.

FIG. 20 shows comparison of adoption of the 1st cavity with adoption of the 2nd cavity for organic EL elements under the same conditions as those in FIG. 19.

FIG. 21 shows parameters of Equation 1 in Example 3 and Comparative example 3.

FIG. 22C and FIG. 22D show viewing angle dependence of chromaticity in Example 3 and Comparative example 3, respectively.

FIG. 23C and FIG. 23D show viewing angle dependence of chromaticity in Example 3 and Comparative example 3, respectively.

FIG. 24C and FIG. 24D show viewing angle dependence of chromaticity in Example 3 and Comparative example 3, respectively.

FIG. 26 shows comparison of adoption of the 1st cavity with adoption of the 2nd cavity for organic EL elements under the same conditions as those in FIG. 25.

FIG. 27 shows parameters of Equation 1 in Example 4 and Comparative example 4.

FIG. 28C and FIG. 28D show viewing angle dependence of chromaticity in Example 4 and Comparative example 4, respectively.

FIG. 29C and FIG. 29D show viewing angle dependence of chromaticity in Example 4 and Comparative example 4, respectively.

FIG. 30C and FIG. 30D show viewing angle dependence of chromaticity in Example 4 and Comparative example 4, respectively.

FIG. 32 shows comparison of adoption of the 1st cavity with adoption of the 2nd cavity for organic EL elements under the same conditions as those in FIG. 31.

FIG. 33 shows parameters of Equation 1 in Example 5 and Comparative example 5.

FIG. 34C and FIG. 34D show viewing angle dependence of chromaticity in Example 5 and Comparative example 5, respectively.

FIG. 35C and FIG. 35D show viewing angle dependence of chromaticity in Example 5 and Comparative example 5, respectively.

FIG. 36C and FIG. 36D show viewing angle dependence of chromaticity in Example 5 and Comparative example 5, respectively.

FIG. 37 is a list of film thickness of the functional layer of each of the R, G, and B colors obtained in the first to fifth simulations.

FIG. 38 is a list of difference in film thickness of the functional layers of between the R and G colors, between the G and B colors, and between the R and B colors obtained in the first to fifth simulations.

FIG. 39 shows an external view of a display device according to the embodiment of the present invention.

DETAILED EMBODIMENTS

[Process by which Aspects of the Present Invention was Achieved]

Before concretely describing aspects of the present invention, the following describes the process by which the aspects of the present invention were achieved.

The following method for film thickness calculation has been used in conventional general arts of optical design. Firstly, a film thickness of each of layers constituting a functional layer is temporarily determined such that stable film formation is realized. Then, a film thickness, which is at the neighborhood of the temporarily determined film thickness and corresponds to a local maximum of light-emitting efficiency, is calculated through simulations. Also, in order to realize stable film formation, the functional layer is considered to have a film thickness of more than 100 nm with the recognition that each of the layers constituting the functional layer needs to have a certain film thickness. Accordingly, conventional general technical expertise in the art shows that the functional layer has an optimal film thickness of more than 100 nm. In fact, Patent Literature 1 describes that respective functional layers of the R, G, and B colors have an optimal film thickness of 245 nm, an optimal film thickness of 563 nm, and an optimal film thickness of 503 nm, respectively.

The present inventors applied a hole transport layer having a film thickness of 100 nm or more as a functional layer, and performed simulations with respect to variation of light-emitting efficiency when varying the film thickness of the functional layer.

Figure 1:
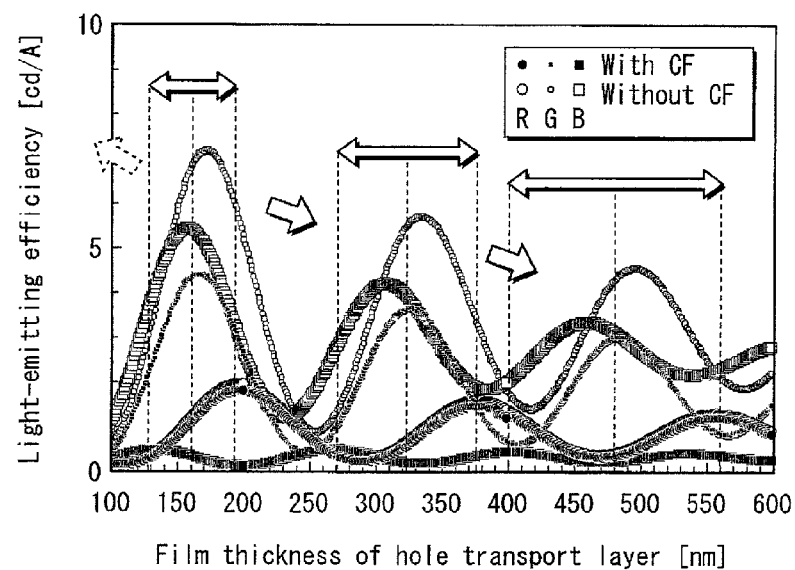
FIG. 1 explains the process by which one aspect of the present invention was achieved.

Results of the simulations are shown in FIG. 1. FIG. 1 shows variation of light-emitting efficiency in cd/A when setting the film thickness of the transparent conductive layer to 20 nm and varying the film thickness of the hole transport layer from 100 nm to 600 nm. The present inventors proved based on FIG. 1 that the light-emitting efficiency varies periodically with respect to the variation of the film thickness of the functional layer, and furthermore proved that as the film thickness of the functional layer increases, the light-emitting efficiency for each of the R, G, and B colors decreases and the difference in film thickness of the respective functional layers between the R, G, and B colors increases, each which correspond to a local maximum of light-emitting efficiency (indicated by arrows of solid lines in FIG. 1).

As shown in FIG. 1, there exists a wave in which when the local maximum of light-emitting efficiency is exhibited, the difference in film thickness of the respective hole transport layers between the R, G, and B colors is the smallest (the hole transport layers each have a film thickness of 100 nm to 250 nm). After consideration in light of the results of the simulations, the present inventors assumed that there exists an unknown wave shape (indicated by an arrow of dashed lines in FIG. 1) in which when a further higher light-emitting efficiency than the local maximum of light-emitting efficiency is exhibited, the difference in film thickness of the respective hole transport layers between the R, G, and B colors is further smaller than the smallest.

As a result, the present inventors determined to perform further simulations with respect to a range of 100 nm or less, which is considered to be a range that a person skilled in the art will hesitate to perform active consideration, without sticking to the conventional technical expertise.

Figure 2:
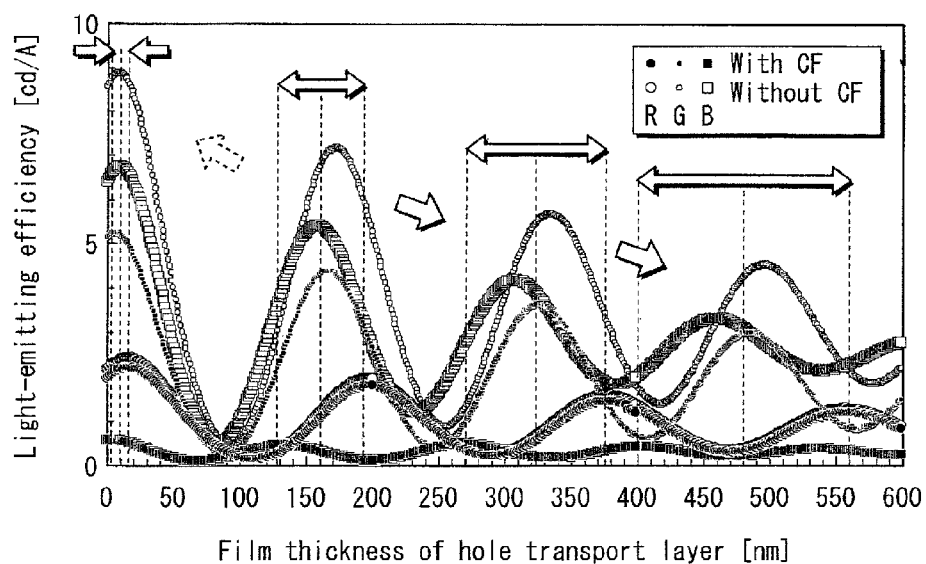
FIG. 2 explains the process by which the aspect of the present invention was achieved.

As a result of the further simulations, the present inventors proved, as shown in FIG. 2, that a large local maximum of light-emitting efficiency appears in the range of the film thickness of the functional layer of 60 nm or less, and this large local maximum of light-emitting efficiency is the actual highest light-emitting efficiency. Moreover, the present inventors proved that as long as the functional layers each have a film thickness within this range, the difference in film thickness of the respective hole transport layers between the R, G, and B colors is the actual smallest, and the respective hole transport layers of the R, G, and B colors have substantially the same film thickness.

The present inventors achieved the structure of the organic EL panel that is the one aspect of the present invention after the expertises and considerations as described above.

[Outline of Aspects of the Present Invention]

The first aspect of the present invention provides an organic EL panel, comprising: first electrodes that reflect incident light; a second electrode that faces the first electrodes, and transmits incident light therethrough; an organic light-emitting layer of each of R (red), G (green), and B (blue) colors that is disposed between a corresponding one of the first electrodes and the second electrode, and emits light of a corresponding color due to voltage application between the corresponding first electrode and the second electrode; a functional layer of each of the R, G, and B colors that is composed of one or more layers, and is disposed between a corresponding one of the first electrodes and the organic light-emitting layer of a corresponding color, wherein a first portion of light of each of the R, G, and B colors emitted from the organic light-emitting layer of the corresponding color travels through the second electrode instead of towards the corresponding first electrode, and is emitted externally after passing through the second electrode, a second portion of the light of each of the R, G, and B colors travels through the functional layer of the corresponding color towards the corresponding first electrode, strikes and is reflected by the corresponding first electrode, and is emitted externally after passing through the functional layer of the corresponding color, the organic light-emitting layer of the corresponding color, and the second electrode, the respective functional layers of the R, G, and B colors have substantially a same film thickness of 60 nm or less and corresponds to a local maximum of light-emitting efficiency of the corresponding color, and respective optical distances between the respective organic light-emitting layers of the R, G, and B colors and the respective first electrodes are each 100 nm or less and are substantially equal to each other.

With the above structure, the film thickness of the functional layer provided between the organic light-emitting layer and the first electrode is adjusted so as to correspond to a local maximum of light-emitting efficiency. This increases the light-extraction efficiency for each of the R, G, and B colors. Furthermore, the respective functional layers of the R, G, and B colors have substantially the same film thickness, and accordingly the film thickness is simply performed for each of the R, G, and B colors compared with conventional arts.

Also, the respective functional layers of the R, G, and B colors may be composed of transparent conductive layers of the R, G, and B colors formed on the respective first electrodes, and hole transport layers of the R, G, and B colors formed on the respective transparent conductive layers, respectively.

With the above structure, the functional layer includes only two layers. Accordingly, under the restrictions that the film thickness of the functional layer needs to be 60 nm or less, each of the two layers can have a certain degree of film thickness. This leads to stable formation of each of the layers.

Also, the respective hole transport layers of the R, G, and B colors may have substantially a same film thickness, and the respective transparent conductive layers of the R, G, and B colors may have a same film thickness.

With the above structure, it is possible to finely adjust the film thickness of the functional layer by finely adjusting the film thickness of the hole transport layer for each of the R, G, and B colors. The above structure is effective especially in a case where the transparent conductive layers are formed by vapor deposition or sputtering with which fine adjustment on the film thickness for each of the R, G, and B colors is difficult, and the hole transport layers are formed by the inkjet method with which fine adjustment on the film thickness for of the R, G, and B colors is simple.

Also, the respective hole transport layers of the R, G, and B colors may each have a different film thickness, and the respective transparent conductive layers of the R, G, and B colors may have a same film thickness.

With the above structure, in order to further improve optical characteristics, it is possible to form the respective functional layers of the R, G, and B colors so as to each have a different film thickness within substantially the same range. The respective transparent conductive layers of the R, G, and B colors have the same film thickness and the respective hole transport layers of the R, G, and B colors each have a different thickness based on the assumptions that while the transparent conductive layers are formed by vapor deposition or sputtering, the hole transport layers are formed by the inkjet method. According to the inkjet method, only by adjusting the number of drops of ink to drop, it is possible to adjust the film thickness of the hole transport layer of each of the R, G, and B colors. This leads to simple adjustment of film thickness for each of the R, G, and B colors compared with the vapor deposition and sputtering. For this reason, by forming the respective hole transport layers of the R, G, and B colors to each have a different film thickness, it is possible to perform fine adjustment of the film thicknesses of the functional layers with simplicity and accuracy, thereby further improving the optical characteristics.

Also, the respective hole transport layers of the R, G, and B colors may have a film thickness of 13 nm to 30 nm, a film thickness of 12 nm to 21 nm, and a film thickness of 10 nm to 15 nm, respectively and the respective transparent conductive layers of the R, G, and B colors may each have a film thickness of 15 nm to 20 nm.

With the above structure, it is possible to realize simple adjustment of film thickness while increasing the light-extraction efficiency.

Also, the respective hole transport layers of the R, G, and B colors may each have a function of injecting holes into the organic light-emitting layer of the corresponding color, in addition to a function of transporting the holes.

With the above structure, even in the case where the functional layer includes only two layers, it is possible to improve the hole injection properties.

Also, the respective functional layers of the R, G, and B colors may be composed of transparent conductive layers of the R, G, and B colors formed on the respective first electrodes, hole injection layers of the R, G, and B colors formed on the respective transparent conductive layers of the R, G, and B colors, and hole transport layers of the R, G, and B colors formed on the respective hole injection layer of the R, G, and B colors, respectively.

With the above structure, it is possible to improve the hole injection properties compared with the case where the functional layer includes the transparent conductive layer and the hole transport layer.

Also, the respective hole transport layers of the R, G, and B colors may have substantially a same film thickness, the respective transparent conductive layers of the R, G, and B colors may have a same film thickness, and the respective hole injection layers of the R, G, and B colors may have a same film thickness.

With the above structure, it is possible to finely adjust the film thickness of the functional layer by finely adjusting the film thickness of the hole transport layer for each of the R, G, and B colors. The above structure is effective especially in a case where the transparent conductive layers and the hole injection layers are formed by vapor deposition or sputtering with which fine adjustment on the film thickness for each of the R, G, and B colors is difficult, and the hole transport layers are formed by the inkjet method with which fine adjustment on the film thickness for each of the R, G, and B colors is simple.

Also, the respective hole transport layers of the R, G, and B colors may each have a different film thickness, the respective transparent conductive layers of the R, G, and B colors may have a same film thickness, and the respective hole injection layers of the R, G, and B colors may have a same film thickness.

With the above structure, in order to further improve the optical characteristics, it is possible to form the respective functional layers of the R, G, and B colors so as to each have a different film thickness within substantially the same range. The respective transparent conductive layers of R, G, and B have the same film thickness, the respective hole injection layers of R, G, and B have the same film thickness, and the respective hole transport layers of R, G, and B each have a different thickness based on the assumptions that while the transparent conductive layers and the hole injection layers are formed by vapor deposition or sputtering, the hole transport layers are formed by the inkjet method. According to the inkjet method, only by adjusting the number of drops of ink to drop, it is possible to adjust the film thickness of the hole transport layer of each of the R, G, and B colors. This leads to simple adjustment of film thickness for each of the R, G, and B colors compared with the vapor deposition and sputtering. For this reason, by forming the respective hole transport layers of the R, G, and B colors to each have a different film thickness, it is possible to perform fine adjustment of the film thicknesses of the functional layers with simplicity and accuracy, thereby further improving the optical characteristics.

Also, the respective hole injection layers of the R, G, and B colors may each have a film thickness of greater than 0 nm to 5 nm, the respective hole transport layers of the R, G, and B colors may have a film thickness of 15 nm to 25 nm, a film thickness of 9 nm to 16 nm, and a film thickness of 5 nm to 9 nm, respectively, and the respective transparent conductive layers of the R, G, and B colors may each have a film thickness of 15 nm to 20 nm.

With the above structure, it is possible to realize simple adjustment of film thickness while increasing the light-extraction efficiency.

Also, the respective functional layers of the R, G, and B colors may have a film thickness of 28 nm to 50 nm, a film thickness of 27 nm to 41 nm, and a film thickness of 26 nm to 35 mm, respectively.

With the above structure, it is possible to realize simple adjustment of film thickness while increasing the light-extraction efficiency.

The second aspect of the present invention provides an organic EL panel, comprising: first electrodes that reflect incident light; a second electrode that faces the first electrodes, and transmits incident light therethrough; an organic light-emitting layer of each of R (red), G (green), and B (blue) colors that is disposed between a corresponding one of the first electrodes and the second electrode, and emits light of a corresponding color due to voltage application between the corresponding first electrode and the second electrode; a functional layer of each of the R, G, and B colors that is composed of one or more layers, and is disposed between a corresponding one of the first electrodes and the organic light-emitting layer of a corresponding color, wherein a first portion of light of each of the R, G, and B colors emitted from the organic light-emitting layer of the corresponding color travels through the second electrode instead of towards the corresponding first electrode, and is emitted externally after passing through the second electrode, a second portion of the light of each of the R, G, and B colors travels through the functional layer of the corresponding color towards the corresponding first electrode, strikes and is reflected by the corresponding first electrode, and is emitted externally after passing through the functional layer of the corresponding color, the organic light-emitting layer of the corresponding color and the second electrode, the respective functional layers of the R, G, and B colors each have a different film thickness of 26 nm to 50 nm that corresponds to a local maximum of light-emitting efficiency and predetermined chromaticity of the corresponding color, the respective functional layers of the R, G, and B colors differ in film thickness by 1 nm to 16 nm between the R and G colors, between the G and B colors, and between the R and B colors, the respective organic light-emitting layers of the R, G, and B colors each have an optical distance of 49 nm to 90 nm from the corresponding first electrode, and, the respective functional layers of the R, G, and B colors differ in optical distance from the respective first electrodes by 0 nm to 25 nm between the R and G colors, between the G and B colors, and between the R and B colors.

With the above structure, the film thickness of the functional layer provided between the organic light-emitting layer and the first electrode is adjusted so as to correspond to a local maximum of light-emitting efficiency. This increases the light-extraction efficiency with respect to each of the R, G, and B colors. Furthermore, the respective functional layers of the R, G, and B colors have substantially the same film thickness, and accordingly the film thickness is simply performed for each of the R, G, and B colors compared with conventional arts.

The third aspect of the present invention provides a display device comprising the organic EL panel and a drive circuit that applies voltage between each of the first electrodes and the second electrode.

The fourth aspect of the present invention provides a method of manufacturing an organic EL panel, comprising: a first step of preparing first electrodes that reflect incident light; a second step of disposing a functional layer of each of R (red), G (green), and B (blue) colors, which is composed of one or more layers, on a corresponding one of the first electrodes; a third step of an organic light-emitting layer of each of the R, G, and B colors, which emits light of a corresponding color, on the functional layer of a corresponding color; and a fourth step of disposing a second electrode, which transmits incident light therethrough, above the respective first electrodes with the organic light-emitting layers of the R, G, and B colors being interposed therebetween, wherein in the second step, the respective functional layers of the R, G, and B colors are formed so as to have substantially a same film thickness of 60 nm or less that corresponds to a local maximum of light-emitting efficiency of the corresponding color, and respective optical distances between the respective organic light-emitting layers of the R, G, and B colors and the respective first electrodes are each 100 nm or less and are substantially equal to each other.

With the above structure, it is possible to manufacture the organic EL panel according to the above first aspect.

The fifth aspect of the present invention provides a method of manufacturing an organic EL panel, comprising: a first step of preparing first electrodes that reflect incident light; a second step of disposing a functional layer of each of R (red), G (green), and B (blue) colors, which is composed of one or more layers, on a corresponding one of the first electrodes; a third step of an organic light-emitting layer of each of the R, G, and B colors, which emits light of a corresponding color, on the functional layer of a corresponding color; and a fourth step of disposing a second electrode, which transmits incident light therethrough, above the respective first electrodes with the organic light-emitting layers of the R, G, and B colors being interposed therebetween, wherein in the second step, the respective functional layers of the R, G, and B colors are formed so as to differ in film thickness by 1 nm to 16 nm between the R and G colors, between the G and B colors, and between the R and B colors, the respective organic light-emitting layers of the R, G, and B colors each have an optical distance of 49 nm to 90 nm from the corresponding first electrode, and the respective functional layers of the R, G, and B colors differ in optical distance from the respective first electrodes by 0 nm to 25 nm between the R and G colors, between the G and B colors, and between the R and B colors.

With the above structure, it is possible to manufacture the organic EL panel according to the above second aspect.

In the present specification, the "film thickness corresponding to a local maximum of light-emitting efficiency" indicates a film thickness within a range of ±10% of a film thickness corresponding to a local maximum of light-emitting efficiency. Also, the "substantially the same for the R, G, and B colors" indicates that the following conditions (1) to (3) are satisfied, and the "same for the R, G, and B colors" indicates that the following conditions (1) and (2) are satisfied:

(1) the respective functional layers of the R, G, and B colors have the same designed value of film thickness and have the same measured value of film thickness;

(2) the respective functional layers of the R, G, and B colors have the same designed value of film thickness, and each have a different measured value of film thickness within a manufacturing error range (±5 nm per layer); and (3) the respective functional layers of the R, G, and B colors each have a different designed value of film thickness under the conditions that the allowable ranges of difference in brightness and chromaticity are satisfied.

Furthermore, in the present specification, specific numerical values of film thickness are each a designed value. Accordingly, there is a case where the respective functional layers of the R, G, and B colors each have a different measured value of film thickness within a manufacturing error range (±5 nm per layer).

[Pixel Structure of Organic EL Panel]

Figure 3:
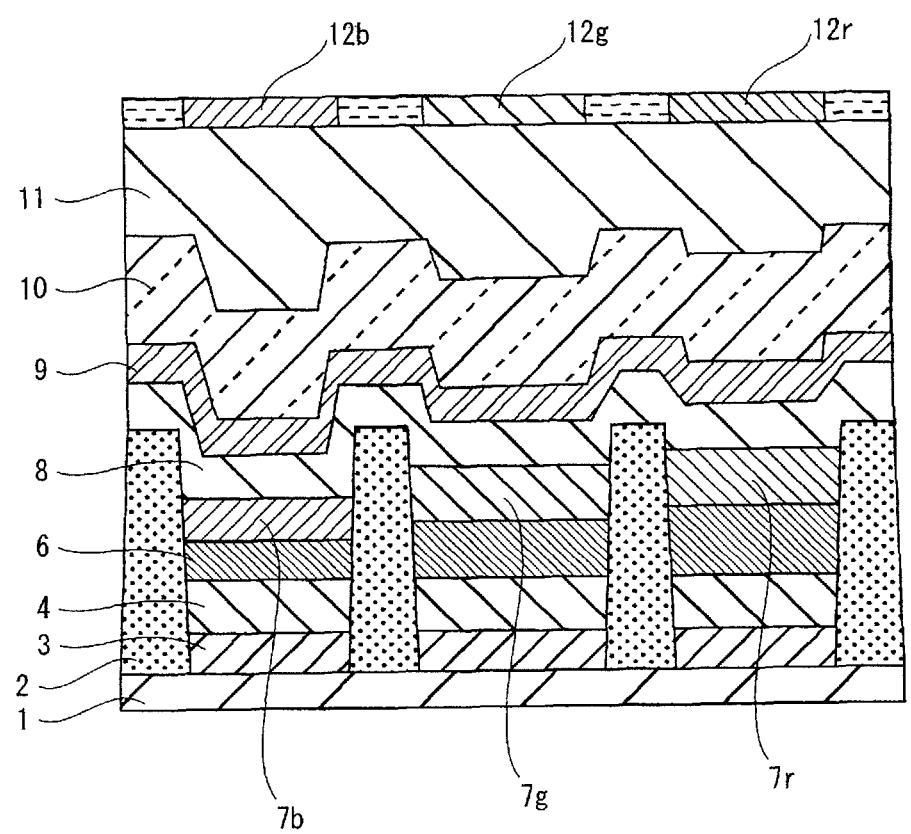
FIG. 3 is a cross-sectional diagram schematically showing the pixel structure of an organic EL panel according to an embodiment of the present invention.

FIG. 3 is a cross-sectional diagram schematically showing the pixel structure of an organic EL panel according to an embodiment of the present invention. The organic EL panel has R (red), G (green), and B (blue) pixels arranged regularly in a matrix of rows and columns. Each pixel is formed by an organic EL element with use of an organic material.

The blue organic EL element includes a substrate 1, a reflective electrode 3, a transparent conductive layer 4, a hole transport layer 6, an organic light-emitting layer 7b, an electron transport layer 8, a transparent electrode 9, a thin-film passivation layer 10, a resin passivation layer 11, and a color filter (CF) 12b. The organic light-emitting layer 7b is provided between the reflective electrode 3 and the transparent electrode 9. Also in this example, the transparent conductive layer 4 and the hole transport layer 6 are provided between the reflective electrode 3 and the organic light-emitting layer 7b (hereinafter, at least one layer provided between the reflective electrode and the organic light-emitting layer is referred to as a "functional layer").

The green organic EL element has the same structure as the blue organic EL element, except for an organic light-emitting layer 7g and a color filter 12g. The red organic EL element also has the same structure as the blue organic EL element, except for an organic light-emitting layer 7r and a color filter 12r. In this example, the substrate 1, the electron transport layer 8, the transparent electrode 9, the thin-film passivation layer 10, and the resin passivation layer 11 are shared by the respective organic light-emitting elements of the R, G, and B colors, whereas other layers are partitioned by banks 2.

Also, in the organic EL element of each of the R, G, and B colors, a cavity structure is realized by providing the corresponding reflective electrode 3. Two optical paths are formed in the organic EL element. One is a first optical path, in which a portion of light emitted from the organic light-emitting layer 7 travels through the transparent electrode 9 instead of towards the reflective electrode 3, and then is emitted externally after passing through the transparent electrode 9. The other is a second optical path, in which a remaining portion of the light emitted from the organic light-emitting layer 7 travels through the functional layer towards the reflective electrode 3, strikes and is reflected by the reflective electrode 3, and then is emitted externally after passing through the functional layer, the organic light-emitting layer 7, and the transparent electrode 9. Light-extraction efficiency of the organic EL element is increased by adjusting the distance between each of the organic light-emitting layers 7b, 7g, and 7r and the reflective electrode 3 such that direct light traveling the first optical path and reflective light traveling the second optical path strengthen each other through the interference effect. The distance can be adjusted by adjusting the thickness of the functional layer.

Specifically, the film thicknesses of the respective functional layers of the R, G, and B colors are each set to be 60 nm or less such that a local maximum of light-emitting efficiency for a corresponding color is exhibited, and are also adjusted so as to be substantially equal to each other. Also, the optical distances between the respective organic light-emitting layers 7 of the R, G, and B colors and the respective reflective electrodes 3 are each 100 nm or less, and are also adjusted so as to be substantially equal to each other. Note that for a single layer structure, the optical distance is the product of a film thickness and a refractive index, and for a multilayer structure with two or more layers, the optical distance is the sum of the product of the film thickness and the refractive index for each layer.

Figure 4:
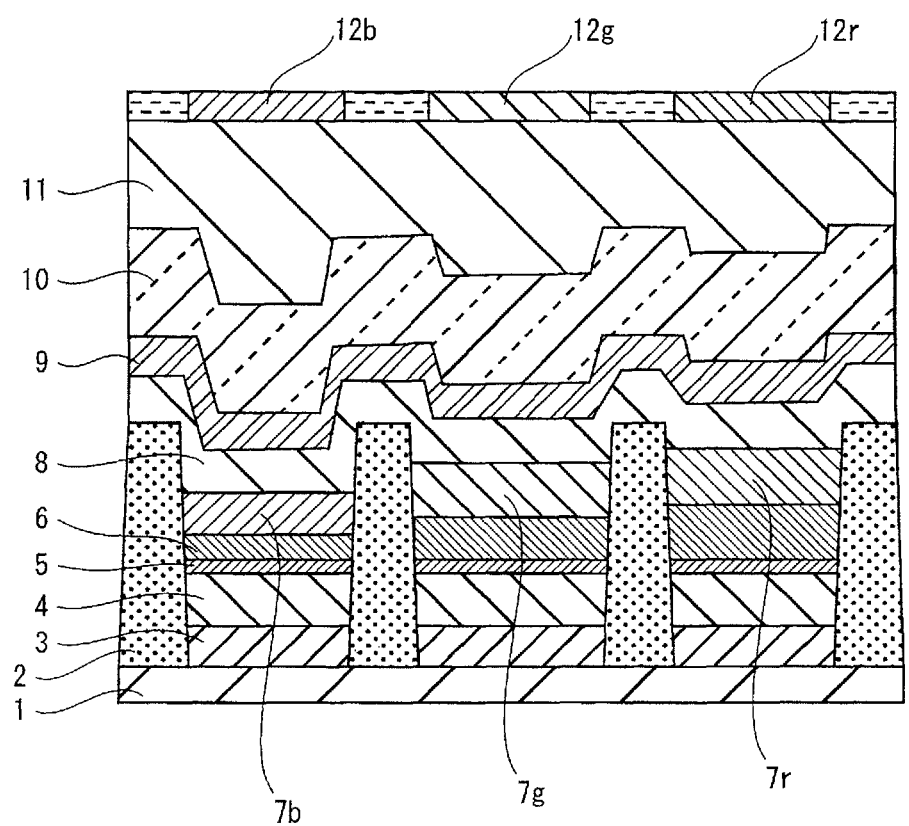
FIG. 4 is a cross-sectional diagram schematically showing the pixel structure of an organic EL panel according to the embodiment of the present invention.

As shown in FIG. 4, the organic EL element of each of the R, G, and B colors may have the structure in which the hole injection layer 5 is inserted between the transparent conductive layer 4 and the hole transport layer 6. In this example, the functional layer has a three-layer structure of the transparent conductive layer 4, the hole injection layer 5, and the hole transport layer 6. Alternatively, the organic EL element of each of the R, G, and B colors having the structure shown in FIG. 3 may include the hole transport layer 6 having a hole injection function.

The following describes five types of simulations on the film thickness of the functional layer of each of the R, G, and B colors, and then describes the optimal range of film thickness of the functional layer resulting from these simulations.

[First Simulation]
<Conditions>

In the first simulation, a functional layer has a two-layer structure of a transparent conductive layer and a hole transport layer. Also, the transparent conductive layer is formed from ITO (Indium Tin Oxide), the hole transport layer is formed from an organic material, a reflective electrode is formed from silver, and respective organic light emitting layers of the R, G, and B colors are formed from RP158, GP1200, and BP105 manufactured by Sumation Co., Ltd. respectively.

<Light-Emitting Efficiency and Simplicity of Film Thickness Adjustment>

Figure 5:
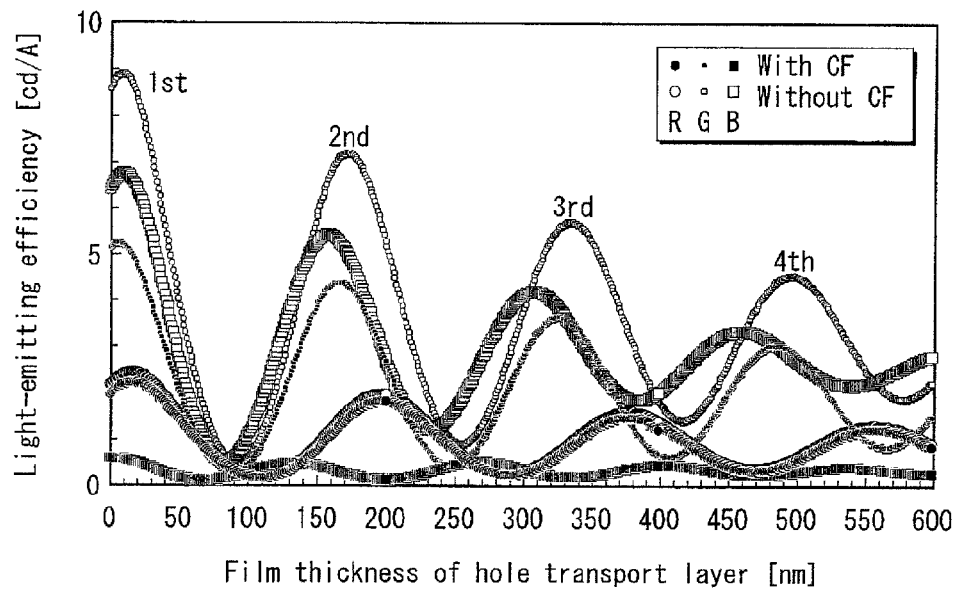
FIG. 5 shows variation of light-emitting efficiency in cd/A when setting a film thickness of a transparent conductive layer to 20 nm and varying a film thickness of a hole transport layer from 0 nm to 600 nm under the conditions in the first simulation.

FIG. 5 shows variation of light-emitting efficiency in cd/A when setting the film thickness of the transparent conductive layer to 20 nm and varying the film thickness of the hole transport layer from 0 nm to 600 nm under the above conditions. As shown in FIG. 5, by varying the film thickness of the hole transport layer, the light-emitting efficiency varies periodically due to light interference phenomenon. FIG. 5 also shows that the light-emitting efficiency for each of the R, G, and B colors reaches four local maximum values when the hole transport layer has a film thickness within a range of 0 nm to 600 nm.

Figure 6:
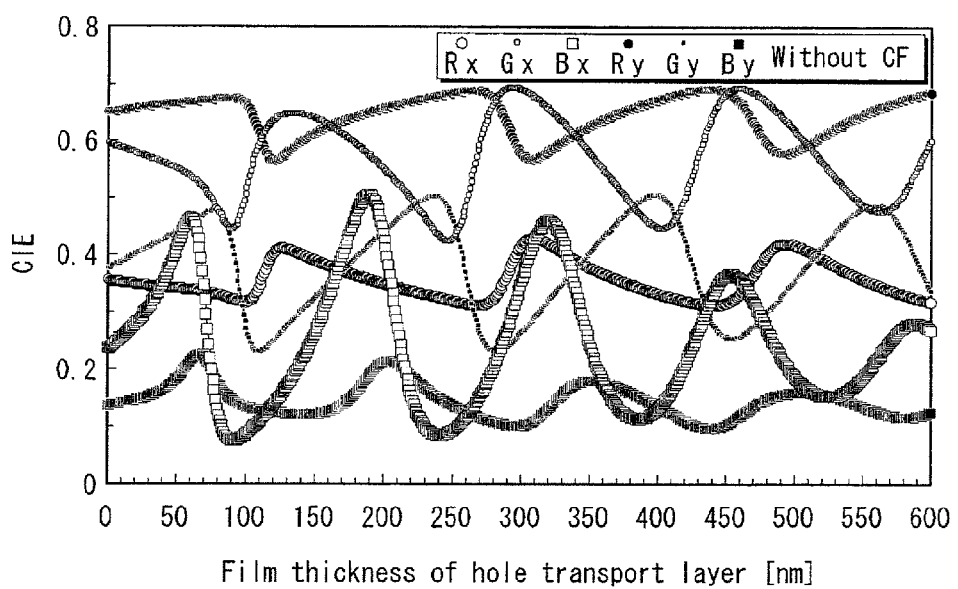
FIG. 6 shows variation of chromaticity for each of the R, G, and B colors when varying the film thickness of the hole transport layer from 0 nm to 600 nm under the same conditions as those in FIG. 5.

FIG. 6 shows variation of chromaticity for each of the R, G, and B colors when varying the film thickness of the hole transport layer from 0 nm to 600 nm under the same conditions as those in FIG. 5. In an organic EL element, a film thickness corresponding to a local maximum of light-emitting efficiency is not necessarily equal to a film thickness corresponding to an optimal chromaticity (x,y) for each of the R, G, and B colors. Accordingly, in consideration of the chromaticity, the functional layer is adjusted so as to have a film thickness at the neighborhood of the film thickness corresponding to a local maximum of light-emitting efficiency (a range of ±10% of the local maximum value).

In this way, by adjusting the functional layer so as to have a film thickness at the neighborhood of a film thickness corresponding to a local maximum of light-emitting efficiency, it is possible to realize the cavity structure. In the present description, cavity structures are referred to as the 1st cavity, the 2nd cavity, the 3rd cavity, and the 4th cavity in order of increasing the film thickness of the functional layer.

As shown in FIG. 5, the 1st cavity exhibits a higher light-emitting efficiency than the 2nd cavity. Accordingly, adoption of the 1st cavity leads to a higher light-emitting efficiency of organic EL elements compared with adoption of the 2nd cavity.

FIG. 5 also shows that the 1st cavity exhibits a local maximum of light-emitting efficiency for each of the R, G, and B colors when the hole transport layer of each of the R, G, and B colors has a film thickness within a narrow range of 0 nm to 40 nm (the functional layer has a film thickness within a range of 0 nm to 60 nm). Compared with this, the 2nd cavity exhibits a local maximum of light-emitting efficiency for each of the R, G, and B colors when the hole transport layer of each of the R, G, and B colors has a film thickness within a wide range of 100 nm to 250 nm. Accordingly, with adoption of the 1st cavity for the respective organic EL elements of the R, G, and B colors, it is much less necessary to separately manufacture respective hole transport layers of the R, G, and B colors, compared with adoption of the 2nd cavity. This simplifies the film thickness adjustment during the manufacturing process.

FIG. 7 shows comparison of adoption of the 1st cavity with adoption of the 2nd cavity for organic EL elements under the same conditions as those in FIG. 5.

In Example 1 (the 1st cavity), respective transparent conductive layers of the R, G, and B colors each have a film thickness of 20 nm in common, respective hole transport layers of the R, G, and B colors have a film thickness of 25 nm, a film thickness of 15 nm, and a film thickness of 10 nm, respectively. The chromaticity for each of the R, G, and B colors is adjusted so as to fall within an appropriate range with use of the CF (color filter).

Here, the respective light-emitting efficiencies for the R, G, and B colors are 2.1 cd/A, 4.9 cd/A, and 0.49 cd/A, respectively. Also, respective functional layers of the R, G, and B colors have tolerable limits of difference in film thickness of −15 to +10 nm, tolerable limits of difference in film thickness of −15 to +7 nm, and tolerable limits of difference in film thickness of −20 to +8 nm, respectively. Furthermore, the respective functional layers of the R, G, and B colors have a tolerable margin width of 25 nm, a tolerable margin width of 22 nm, and a tolerable margin width of 28 nm, respectively. The "tolerable limits of difference in film thickness" indicate the tolerable limits of difference in film thickness of the functional layer from the optimal value under the conditions that allowable ranges shown in FIG. 8 are satisfied. FIG. 8 shows the following allowable ranges of;

(1) 20% or lower variation of light-emitting efficiency at a surface of the organic EL panel;

(2) variation of chromaticity of x of 0.04 or less and y of 0.04 or less at the surface of the organic EL panel;

(3) a brightness of 90% or higher at a viewing angle of 30° with respect to a brightness at a viewing angle of 0° and a brightness of 80% or higher at a viewing angle of 45° with respect to a brightness at a viewing angle of 0°; and (4) difference in chromaticity of x of 0.04 or less and y of 0.04 or less between a viewing angle of 50° and a viewing angle of 0°.

As the tolerable limits of difference in film thickness increases, an allowable range of manufacturing error increases with respect to the film thickness of the functional layer. This simplifies the adjustment of the film thickness of the functional layer during the manufacturing process. The "tolerable margin width" indicates a difference between the upper limit and the lower limit in the tolerable limits of difference in film thickness (for example, the R functional layer in Example 1 has a tolerable margin width of 25, which is the difference between the upper limit of +10 and the lower limit of −15).

In Comparative example 1 (the 2nd cavity), respective transparent conductive layers of the R, G, and B colors each have a film thickness of 20 nm in common, respective hole transport layers of the R, G, and B colors have a film thickness of 220 nm, a film thickness of 172 nm, and a film thickness of 155 nm, respectively. The chromaticity for each of the R, G, and B colors is adjusted so as to fall within an appropriate range with use of the color filter.

Here, respective light-emitting efficiencies for the R, G, and B colors are 1.4 cd/A, 4.2 cd/A, and 0.23 cd/A, respectively. Also, respective functional layers of the R, G, and B colors have tolerable limits of difference in film thickness of −8 to +6 nm, tolerable limits of difference in film thickness of −(below the standard) nm, and tolerable limits of difference in film thickness of −10 to +7 nm, respectively. Furthermore, the respective functional layers of the R, G, and B colors have a tolerable margin width of 14 nm, a tolerable margin width of 0 nm, and a tolerable margin width of 17 nm, respectively.

The comparison of Example 1 and Comparative example 1 demonstrates that Example 1 is more excellent in both light-emitting efficiency and simplicity of film thickness adjustment than Comparative example 1.

Also, the following is derived with use of a general method of analyzing the cavity structure. In the cavity structure, the following Equation 1 is satisfied by an optical distance L in nm between the reflective electrode 3 and each of the organic light-emitting layers 7b, 7g, and 7r, a cavity wavelength λ in nm, and a phase shift Φ in radians.

$$\frac{2L}{\lambda} + \frac{\Phi}{2\pi} = m \quad \text{[Equation 1]}$$

The phase shift Φ in the reflective electrode 3 is calculated from the following Equation 2.

$$\Phi = \tan^{-1}\left(\frac{2n_1 k_o}{n_1^2 - n_0^2 - k_0^2}\right) \quad \text{[Equation 2]}$$

Here, $n_1$ represents a refractive index of the transparent conductive layer 4, $n_0$ represents a refractive index of the reflective electrode 3, and $k_0$ represents an extinction coefficient of the reflective electrode 3.

As shown in FIG. 9, a right member m in Equation 1 is an integer in Example 1 and Comparative example 1. Here, resonance wavelengths λ of the respective organic EL elements of the R, G, and B colors are 638 nm, 535 nm, and 468 nm, respectively. Also, in consideration that the functional layer has a tolerable margin width of the film thickness of 20 nm or more in Example 1, the right member m in Equation 1 does not need to be an integer, like Example 1' shown in FIG. 9.

<Viewing Angle Characteristics>
(Green)

Figure 10A:
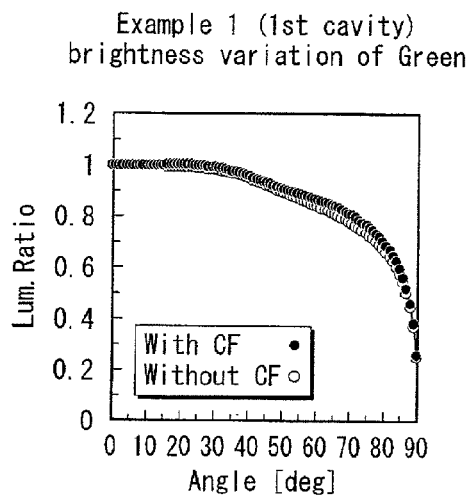
FIG. 10A to FIG. 10D explain viewing angle characteristics of a G (green) organic EL element under the same conditions as those in FIG. 7A to FIG. 7D, FIG. 10A and FIG. 10B show viewing angle dependence of brightness in Example 1 and Comparative example 1, respectively.
Figure 10B:
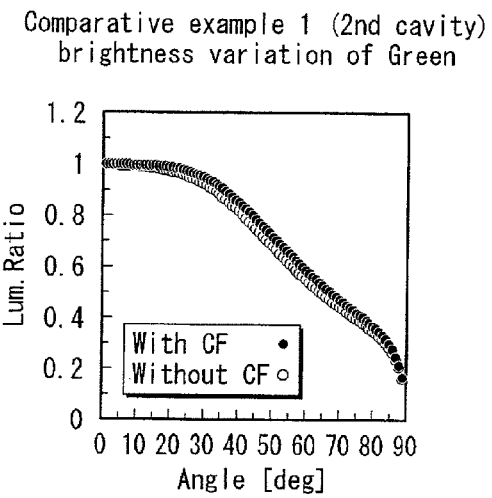

FIG. 10A to FIG. 10D explain viewing angle characteristics of a G (green) organic EL element under the same conditions as those in FIG. 7A to FIG. 7D. FIG. 10A and FIG. 10B show viewing angle dependence of brightness in Example 1 and Comparative example 1, respectively. According to these figures, in Example 1, a viewing angle of 30° corresponds to a brightness of around 100%, and a viewing angle of 45° corresponds to a brightness of around 95% (with the CF). Compared with this, in Comparative example 1, a viewing angle of 30° corresponds to a brightness of around 95%, and a viewing angle of 45° corresponds to a brightness of around 80% (with the CF). This demonstrates that both Example 1 and Comparative example 1 satisfy the allowable ranges shown in FIG. 8. Note that Example 1 exhibits a lower viewing angle dependence of brightness than Comparative example 1, and is accordingly more excellent in viewing angle characteristics than Comparative example 1.

Figure 10C:
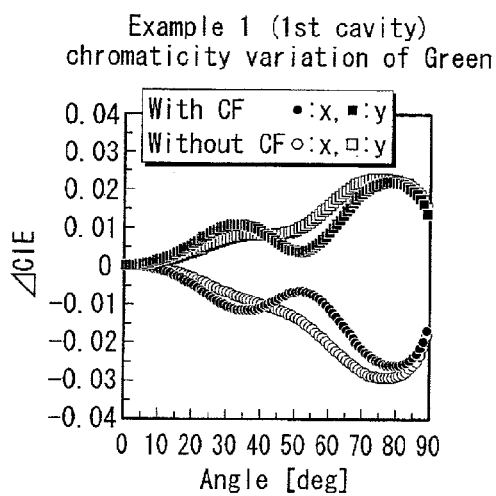
Figure 10D:
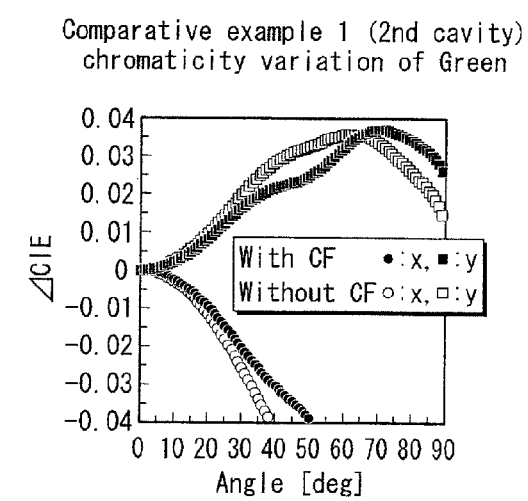

FIG. 10C and FIG. 10D show viewing angle dependence of chromaticity in Example 1 and Comparative example 1, respectively. According to these figures, in Example 1, a viewing angle of 50° corresponds to a chromaticity variation of Δx of approximately 0.005 and Δy of approximately 0.005 (with the CF). Here, Δx is the absolute value of ΔCIE with respect to x, and Δy is the absolute value of ΔCIE with respect to y. Compared with this, in Comparative example 1, a viewing angle of 50° corresponds to a chromaticity variation of Δx of approximately 0.038 and Δy of approximately 0.025 (with the CF). This demonstrates that both Example 1 and Comparative example 1 satisfy the allowable ranges shown in FIG. 8. Note that Example 1 exhibits a lower viewing angle dependence of chromaticity than Comparative example 1, and is accordingly more excellent in viewing angle characteristics than Comparative example 1.

(Red)

Figure 11A:
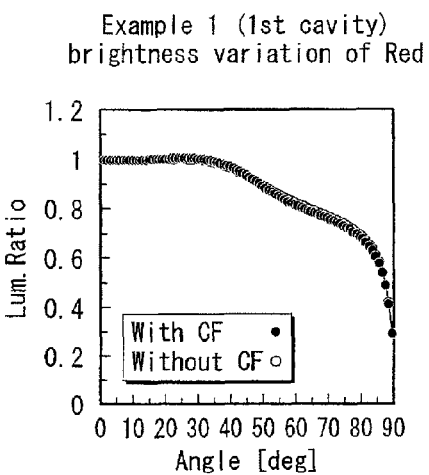
FIG. 11A to FIG. 11D explain viewing angle characteristics of an R (red) organic EL element under the same conditions as those in FIG. 7A to FIG. 7D, FIG. 11A and FIG. 11B show viewing angle dependence of brightness in Example 1 and Comparative example 1, respectively.
Figure 11B:
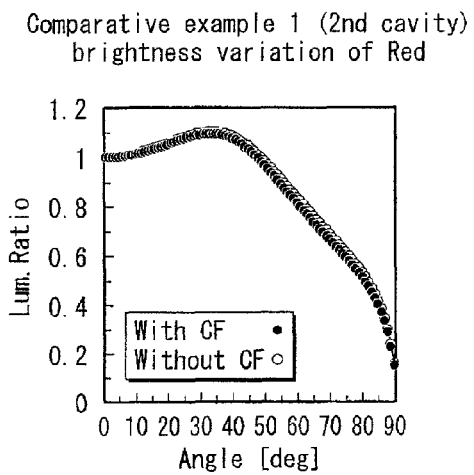

FIG. 11A to FIG. 11D explain viewing angle characteristics of an R organic EL element under the same conditions as those in FIG. 7A to FIG. 7D. FIG. 11A and FIG. 11B show viewing angle dependence of brightness in Example 1 and Comparative example 1, respectively. According to these figures, in Example 1, a viewing angle of 30° corresponds to a brightness of around 100%, and a viewing angle of 45° corresponds to a brightness of around 95% (with the CF). Compared with this, in Comparative example 1, a viewing angle of 30° corresponds to a brightness of around 110%, and a viewing angle of 45° corresponds to a brightness of around 102% (with the CF). This demonstrates that both Example 1 and Comparative example 1 satisfy the allowable ranges shown in FIG. 8. Note that Example 1 exhibits a lower viewing angle dependence of brightness than Comparative example 1, and is accordingly more excellent in viewing angle characteristics than Comparative example 1.

Figure 11C:
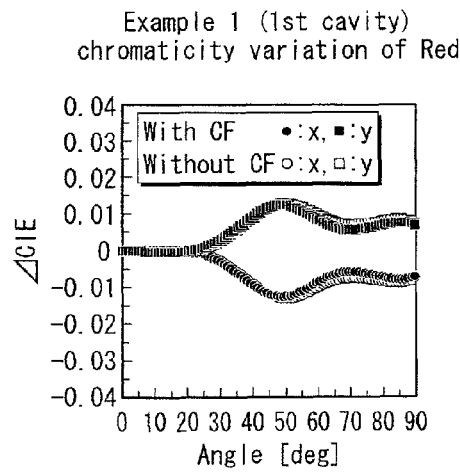
Figure 11D:
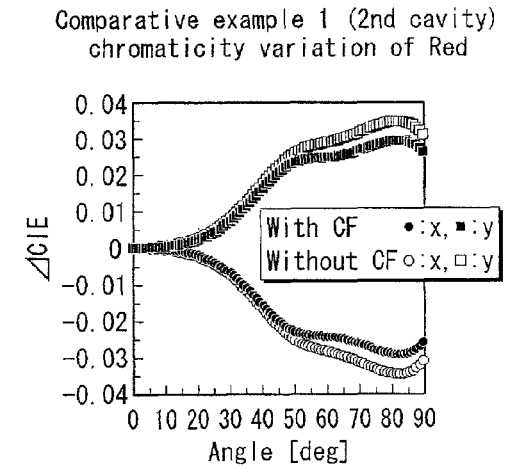

FIG. 11C and FIG. 11D show viewing angle dependence of chromaticity in Example 1 and Comparative example 1, respectively. According to these figures, in Example 1, a viewing angle of 50° corresponds to a chromaticity variation of Δx of approximately 0.012 and Δy of approximately 0.013 (with the CF). Compared with this, in Comparative example 1, a viewing angle of 50° corresponds to a chromaticity variation of Δx of approximately 0.023 and Δy of approximately 0.025 (with the CF). This demonstrates that both Example 1 and Comparative example 1 satisfy the allowable ranges shown in FIG. 8. However, Example 1 exhibits a lower viewing angle dependence of chromaticity than Comparative example 1, and is accordingly more excellent in viewing angle characteristics than Comparative example 1.

(Blue)

Figure 12A:
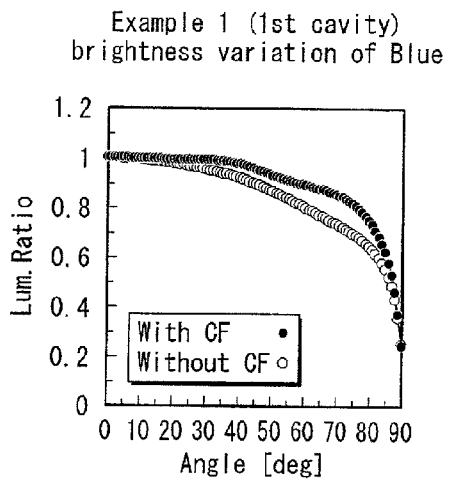
FIG. 12A to FIG. 12D explain viewing angle characteristics of a B (blue) organic EL element under the same conditions as those in FIG. 7A to FIG. 7D, FIG. 12A and FIG. 12B show viewing angle dependence of brightness in Example 1 and Comparative example 1, respectively.
Figure 12B:
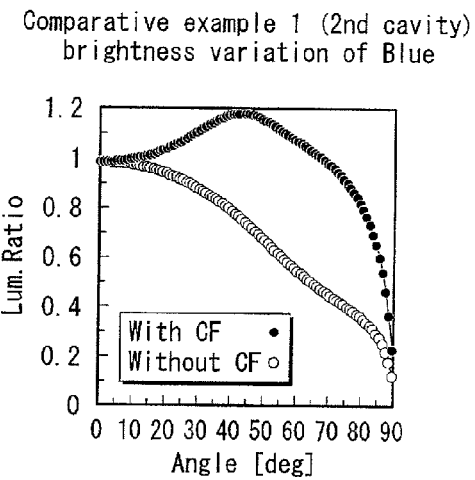

FIG. 12A to FIG. 12D explain viewing angle characteristics of a B (blue) organic EL element under the same conditions as those in FIG. 7A to FIG. 7D. FIG. 12A and FIG. 12B show viewing angle dependence of brightness in Example 1 and Comparative example 1, respectively. According to these figures, in Example 1, a viewing angle of 30° corresponds to a brightness of around 100%, and a viewing angle of 45° corresponds to a brightness of around 95% (with the CF). Compared with this, in Comparative example 1, a viewing angle of 30° corresponds to a brightness of around 110%, and a viewing angle of 45° corresponds to a brightness of around 117% (with the CF). This demonstrates that both Example 1 and Comparative example 1 satisfy the allowable ranges shown in FIG. 8. Note that Example 1 exhibits a lower viewing angle dependence of brightness than Comparative example 1, and is accordingly more excellent in viewing angle characteristics than Comparative example 1.

Figure 12C:
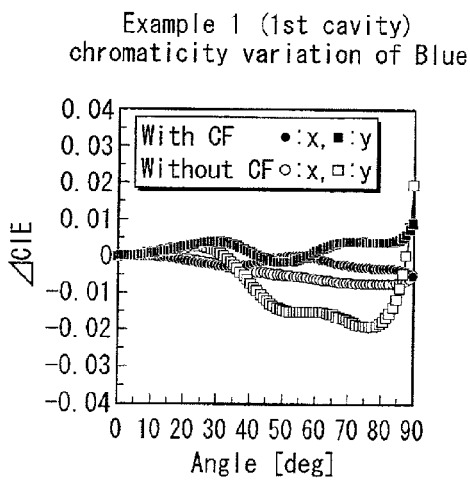
Figure 12D:
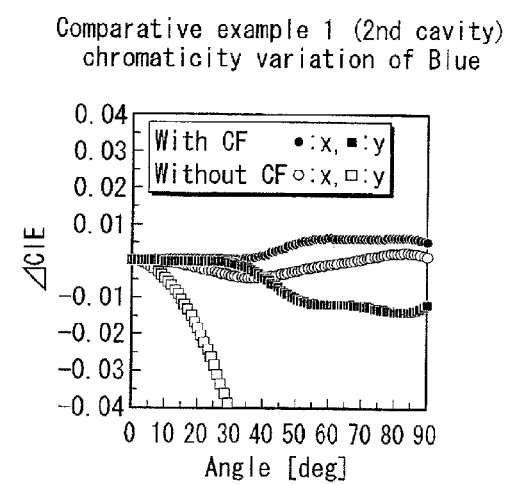

FIG. 12C and FIG. 12D show viewing angle dependence of chromaticity in Example 1 and Comparative example 1, respectively. According to these figures, in Example 1, a viewing angle of 50° corresponds to a chromaticity variation of Δx of substantially 0 and Δy of substantially 0 (with the CF). Compared with this, in Comparative example 1, a viewing angle of 50° corresponds to a chromaticity variation of Δx of approximately 0.005 and Δy of approximately 0.01 (with the CF). This demonstrates that both Example 1 and Comparative example 1 satisfy the allowable ranges shown in FIG. 8. Note that Example 1 exhibits a lower viewing angle dependence of chromaticity than Comparative example 1, and is accordingly more excellent in viewing angle characteristics than Comparative example 1.

Therefore, Example 1 is more excellent in viewing angle characteristics than Comparative example 1 with respect to the respective organic EL elements of the R, G, and B colors. Especially, with respect to the G (green) organic EL element, Example 1 is more excellent in viewing angle characteristics than Comparative example 1 for the following reasons. Comparative example 1 barely satisfies the allowable ranges shown in FIG. 8, and accordingly the film thickness margin of the functional layer cannot be reserved. On the other hand, Example 1 easily satisfies the allowable range shown in FIG. 8, and accordingly the film thickness margin of the functional layer can be reserved.

[Second Simulation]
<Conditions>

In the second simulation, a functional layer and materials for layers constituting the functional layer are the same as those in the first simulation.

<Light-Emitting Efficiency and Simplicity of Film Thickness Adjustment>

Figure 13:
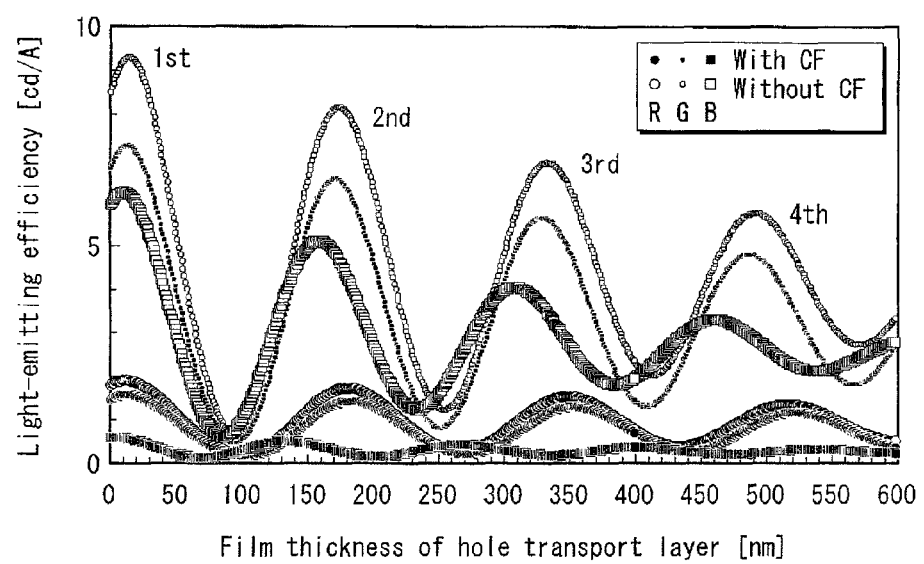
FIG. 13 shows variation of light-emitting efficiency in cd/A when setting the film thickness of the transparent conductive layer to 15 nm and varying the film thickness of the hole transport layer from 0 nm to 600 nm under the conditions in the second simulation.

FIG. 13 shows variation of light-emitting efficiency in cd/A when setting the film thickness of the transparent conductive layer to 15 nm and varying the film thickness of the hole transport layer from 0 nm to 600 nm under the above conditions. As shown in FIG. 13, the 1st cavity exhibits a higher light-emitting efficiency than the 2nd cavity. Accordingly, adoption of the 1st cavity leads to a higher light-emitting efficiency of organic EL elements compared with adoption of the 2nd cavity. FIG. 13 also shows that the 1st cavity exhibits a local maximum of light-emitting efficiency for each of the R, G, and B colors when the hole transport layer of each of the R, G, and B colors has a film thickness within a narrow range of 0 nm to 45 nm (the functional layer has a film thickness within a range of 0 nm to 60 nm). Compared with this, the 2nd cavity exhibits a local maximum of light-emitting efficiency for each of the R, G, and B colors when the hole transport layer of each of the R, G, and B colors has a film thickness within a wide range of 100 nm to 250 nm. Accordingly, with adoption of the 1st cavity for the respective organic EL elements of the R, G, and B colors, it is much less necessary to separately manufacture respective hole transport layers of the R, G, and B colors, compared with adoption of the 2nd cavity. This simplifies the film thickness adjustment during the manufacturing process.

FIG. 14 shows comparison of adoption of the 1st cavity with adoption of the 2nd cavity for organic EL elements under the same conditions as those in FIG. 13.

In Example 2 (the 1st cavity), respective transparent conductive layers of the R, G, and B colors each have a film thickness of 15 nm in common, respective hole transport layers of the R, G, and B colors have a film thickness of 13 nm, a film thickness of 12 nm, and a film thickness of 11 nm, respectively. The chromaticity for each of the R, G, and B colors is adjusted so as to fall within an appropriate range with use of the color filter. In Comparative example 2 (the 2nd cavity), respective transparent conductive layers of the R, G, and B colors each have a film thickness of 15 nm in common, respective hole transport layers of the R, G, and B colors have a film thickness of 195 nm, a film thickness of 170 nm, and a film thickness of 148 nm, respectively. The chromaticity for each of the R, G, and B colors is adjusted so as to fall within an appropriate range with use of the color filter. The comparison of Example 2 and Comparative example 2 demonstrates that Example 2 is more excellent in both light-emitting efficiency and simplicity of film thickness adjustment than Comparative example 2.

Also, as shown in FIG. 15, a right member m in Equation 1 is an integer in Example 2 and Comparative example 2. Also, in consideration that the functional layer has a margin width of the film thickness of approximately 20 nm in Example 2, the right member m in Equation 1 does not need to be an integer, like Example 2' shown in FIG. 15.

<Viewing Angle Characteristics>
(Green)

Figure 16A:
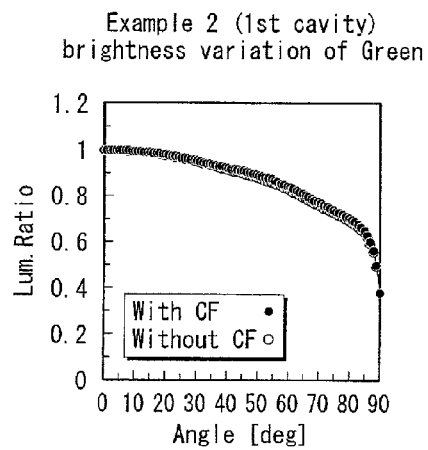
FIG. 16A to FIG. 16D explain viewing angle characteristics of a G (green) organic EL element under the same conditions as those in FIG. 14A to FIG. 14D, FIG. 16A and FIG. 16B show viewing angle dependence of brightness in Example 2 and Comparative example 2, respectively.
Figure 16B:
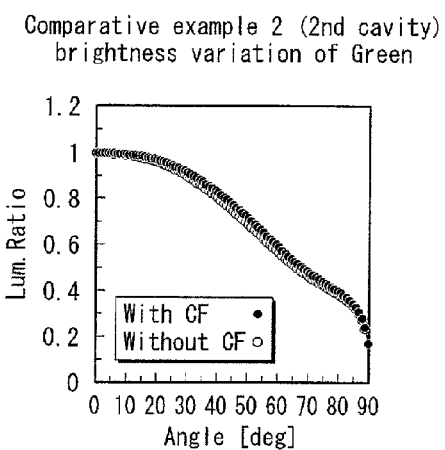

FIG. 16A to FIG. 16D explain viewing angle characteristics of a G (green) organic EL element under the same conditions as those in FIG. 14A to FIG. 14D. FIG. 16A and FIG. 16B show viewing angle dependence of brightness in Example 2 and Comparative example 2, respectively. According to these figures, in Example 2, a viewing angle of 30° corresponds to a brightness of around 95%, and a viewing angle of 45° corresponds to a brightness of around 90% (with the CF). Compared with this, in Comparative example 2, a viewing angle of 30° corresponds to a brightness of around 90%, and a viewing angle of 45° corresponds to a brightness of around 78% (with the CF). This demonstrates that while Example 2 satisfies the allowable ranges shown in FIG. 8, Comparative example 2 does not satisfy the allowable ranges shown in FIG. 8.

Figure 16C:
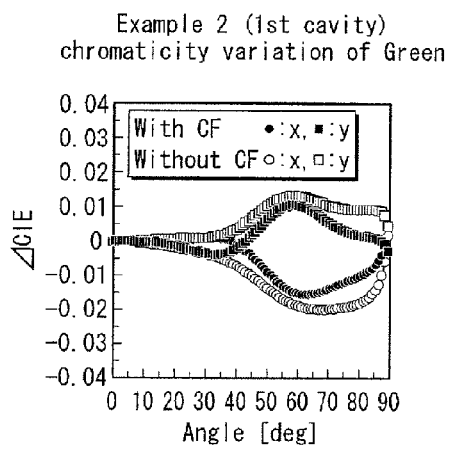
Figure 16D:
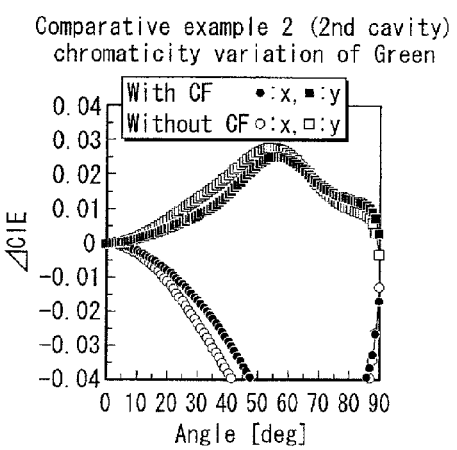

FIG. 16C and FIG. 16D show viewing angle dependence of chromaticity in Example 2 and Comparative example 2, respectively. According to these figures, in Example 2, a viewing angle of 50° corresponds to a chromaticity variation of $\Delta x$ of approximately 0.007 and $\Delta y$ of approximately 0.007 (with the CF). Compared with this, in Comparative example 2, a viewing angle of 50° corresponds to a chromaticity variation of $\Delta x$ of greater than 0.04 and $\Delta y$ of approximately 0.023 (with the CF). This demonstrates that while Example 2 satisfies the allowable ranges shown in FIG. 8, Comparative example 2 does not satisfy the allowable ranges shown in FIG. 8.

(Red)

Figure 17A:
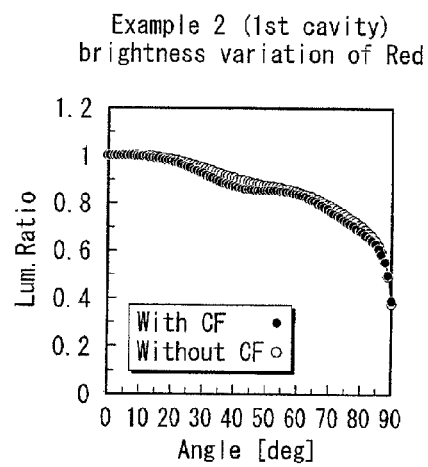
FIG. 17A to FIG. 17D explain viewing angle characteristics of an R (red) organic EL element under the same conditions as those in FIG. 14A to FIG. 14D, FIG. 17A and FIG. 17B show viewing angle dependence of brightness in Example 2 and Comparative example 2, respectively.
Figure 17B:
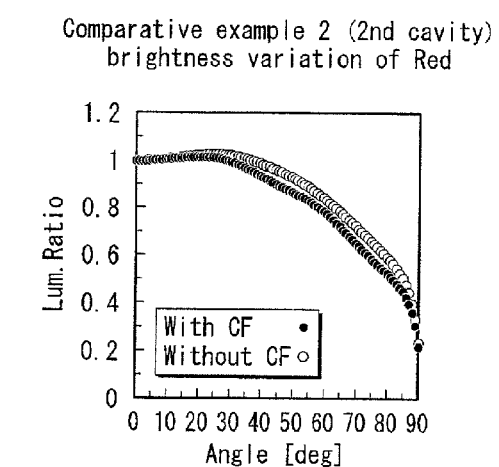

FIG. 17A to FIG. 17D explain viewing angle characteristics of an R (red) organic EL element under the same conditions as those in FIG. 14A to FIG. 14D. FIG. 17A and FIG. 17B show viewing angle dependence of brightness in Example 2 and Comparative example 2, respectively. According to these figures, in Example 2, a viewing angle of 30° corresponds to a brightness of around 93%, and a viewing angle of 45° corresponds to a brightness of around 87% (with the CF). Compared with this, in Comparative example 2, a viewing angle of 30° corresponds to a brightness of around 100%, and a viewing angle of 45° corresponds to a brightness of around 90% (with the CF). This demonstrates that both Example 2 and Comparative example 2 satisfy the allowable ranges shown in FIG. 8.

Figure 17C:
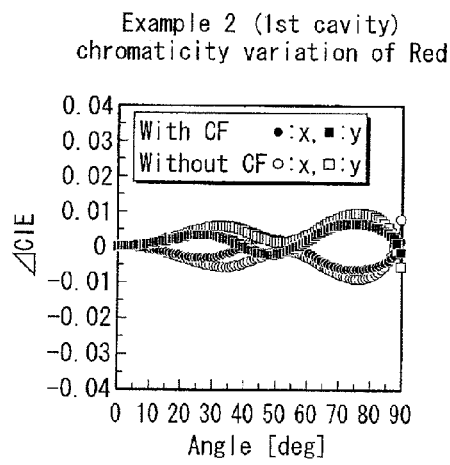
Figure 17D:
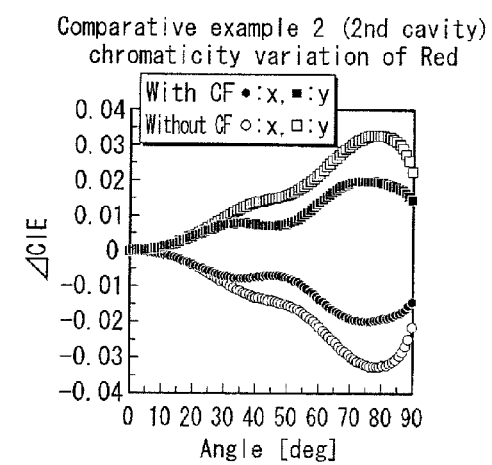

FIG. 17C and FIG. 17D show viewing angle dependence of chromaticity in Example 2 and Comparative example 2, respectively. According to these figures, in Example 2, a viewing angle of 50° corresponds to a chromaticity variation of $\Delta x$ of approximately 0.002 and $\Delta y$ of approximately 0.002 (with the CF). Compared with this, in Comparative example 2, a viewing angle of 50° corresponds to a chromaticity variation of $\Delta x$ of approximately 0.007 and $\Delta y$ of approximately 0.007 (with the CF). This demonstrates that both Example 2 and Comparative example 2 satisfy the allowable ranges shown in FIG. 8. Note that Example 2 exhibits a lower viewing angle dependence of chromaticity than Comparative example 2, and is accordingly more excellent in viewing angle characteristics than Comparative example 2.

(Blue)

Figure 18A:
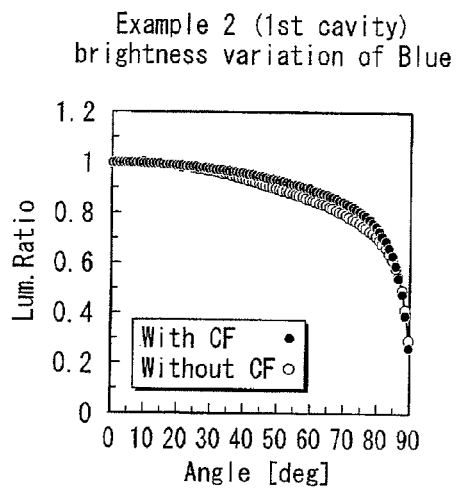
FIG. 18A to FIG. 18D explain viewing angle characteristics of a B (blue) organic EL element under the same conditions as those in FIG. 14A to FIG. 14D, FIG. 18A and FIG. 18B show viewing angle dependence of brightness in Example 2 and Comparative example 2, respectively.
Figure 18B:
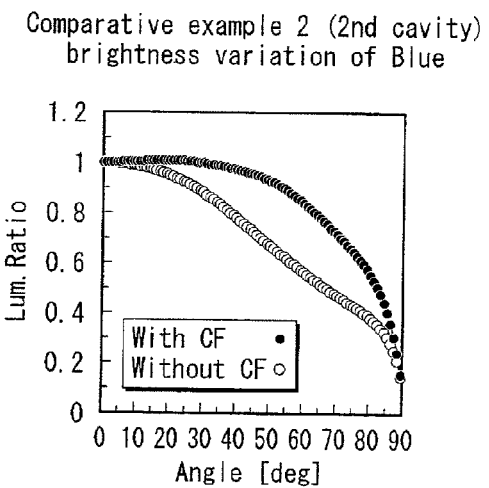

FIG. 18A to FIG. 18D explain viewing angle characteristics of a B organic EL element under the same conditions as those in FIG. 14A to FIG. 14D. FIG. 18A and FIG. 18B show viewing angle dependence of brightness in Example 2 and Comparative example 2, respectively. According to these figures, in Example 2, a viewing angle of 30° corresponds to a brightness of around 98%, and a viewing angle of 45° corresponds to a brightness of around 95% (with the CF). Compared with this, in Comparative example 2, a viewing angle of 30° corresponds to a brightness of around 100%, and a viewing angle of 45° corresponds to a brightness of around 98% (with the CF). This demonstrates that both Example 2 and Comparative example 2 satisfy the allowable ranges shown in FIG. 8.

Figure 18C:
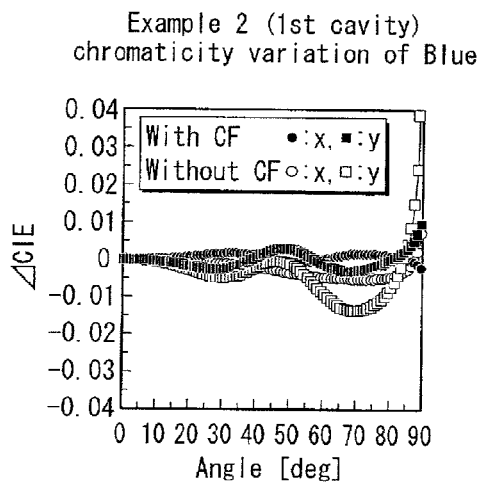
Figure 18D:
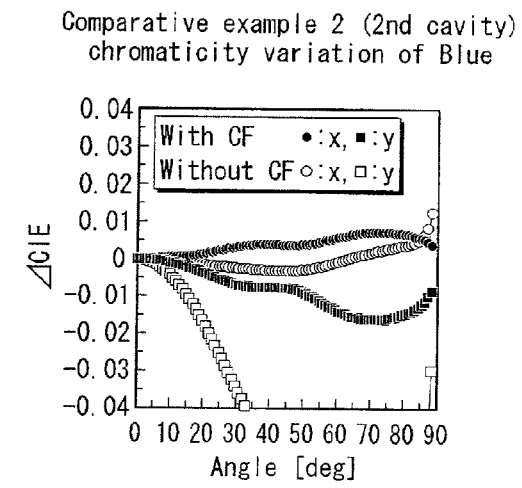

FIG. 18C and FIG. 18D show viewing angle dependence of chromaticity in Example 2 and Comparative example 2, respectively. According to these figures, in Example 2, a viewing angle of 50° corresponds to a chromaticity variation of $\Delta x$ of substantially 0 and $\Delta y$ of approximately 0.004 (with the CF). Compared with this, in Comparative example 2, a viewing angle of 50° corresponds to a chromaticity variation of $\Delta x$ of approximately 0.005 and $\Delta y$ of approximately 0.008 (with the CF). This demonstrates that both Example 2 and Comparative example 2 satisfy the allowable ranges shown in FIG. 8. Note that Example 2 exhibits a lower viewing angle dependence of chromaticity than Comparative example 2, and is accordingly more excellent in viewing angle characteristics than Comparative example 2.

Therefore, Example 2 is more excellent in viewing angle characteristics than Comparative example 2 with respect to the respective organic EL elements of the R, G, and B colors. Especially, with respect to the G (green) organic EL element, Example 2 is more excellent in viewing angle characteristics than Comparative example 2 because while Example 2 satisfies the allowable ranges shown in FIG. 8, Comparative example 2 does not satisfy the allowable ranges shown in FIG. 8.

[Third Simulation]
<Conditions>

In the third simulation, a transparent conductive layer is formed from IZO (Indium Zinc Oxide), and a reflective electrode is formed from aluminum, and the structural elements other than these are the same as those in the first simulation.
<Light-Emitting Efficiency and Simplicity of Film Thickness Adjustment>

Figure 19:
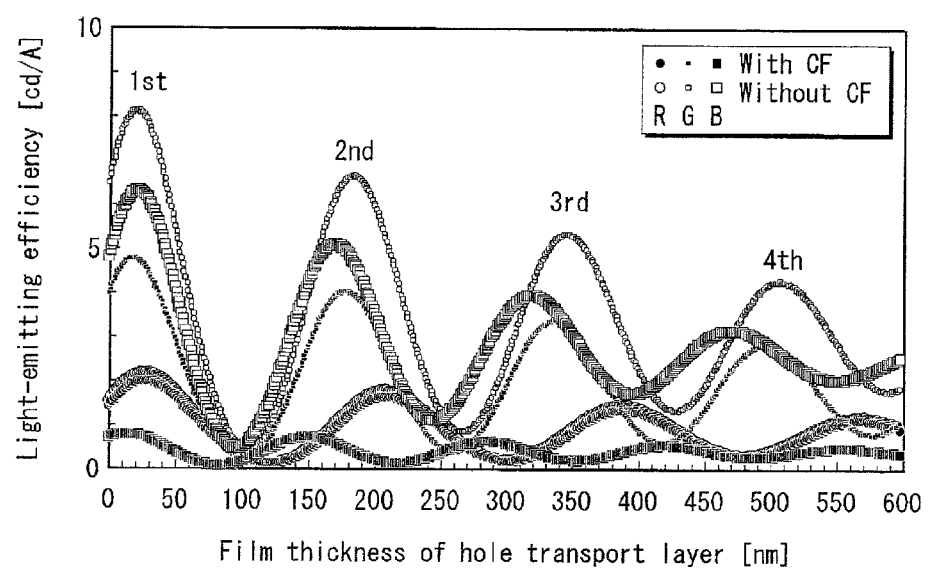
FIG. 19 shows variation of light-emitting efficiency in cd/A when setting the film thickness of the transparent conductive layer to 20 nm and varying the film thickness of the hole transport layer from 0 nm to 600 nm under the conditions in the third simulation.

FIG. 19 shows variation of light-emitting efficiency in cd/A when setting the film thickness of the transparent conductive layer to 20 nm and varying the film thickness of the hole transport layer from 0 nm to 600 nm under the above conditions. As shown in FIG. 19, the 1st cavity exhibits a higher light-emitting efficiency than the 2nd cavity. Accordingly, adoption of the 1st cavity leads to a higher light-emitting efficiency of organic EL elements compared with adoption of the 2nd cavity. FIG. 19 also shows that the 1st cavity exhibits a local maximum of light-emitting efficiency for each of the R, G, and B colors when the hole transport layer of each of the R, G, and B colors has a film thickness within a narrow range of 0 nm to 40 nm (the functional layer has a film thickness within a range of 0 nm to 60 nm). Compared with this, the 2nd cavity exhibits a local maximum of light-emitting efficiency for each of the R, G, and B colors when the hole transport layer of each of the R, G, and B colors has a film thickness within a wide range of 100 nm to 250 nm. Accordingly, with adoption of the 1st cavity for the respective organic EL elements of the R, G, and B colors, it is much less necessary to separately manufacture respective hole transport layers of the R, G, and B colors, compared with adoption of the 2nd cavity. This simplifies the film thickness adjustment during the manufacturing process.

FIG. 20 shows comparison of adoption of the 1st cavity with adoption of the 2nd cavity for organic EL elements under the same conditions as those in FIG. 19.

In Example 3 (the 1st cavity), respective transparent conductive layers of the R, G, and B colors each have a film thickness of 20 nm in common, respective hole transport layers of the R, G, and B colors have a film thickness of 30 nm, a film thickness of 21 nm, and a film thickness of 15 nm, respectively. The chromaticity for each of the R, G, and B colors is adjusted so as to fall within an appropriate range with use of the color filter. In Comparative example 3 (the 2nd cavity), respective transparent conductive layers of the R, G, and B colors each have a film thickness of 20 nm in common, respective hole transport layers of the R, G, and B colors have a film thickness of 217 nm, a film thickness of 185 nm, and a film thickness of 152 nm, respectively. The chromaticity for each of the R, G, and B colors is adjusted so as to fall within an appropriate range with use of the color filter. The comparison of Example 3 and Comparative example 3 demonstrates that Example 3 is more excellent in both light-emitting efficiency and simplicity of film thickness adjustment than Comparative example 3.

Also, as shown in FIG. 21, a right member m in Equation 1 is an integer in Example 3 and Comparative example 3. Also, in consideration that the functional layer has a margin width of the film thickness of 20 nm or more in Example 3, the right member m in Equation 1 does not need to be an integer, as shown in Example 3' in FIG. 21.
<Viewing Angle Characteristics>
(Green)

Figure 22A:
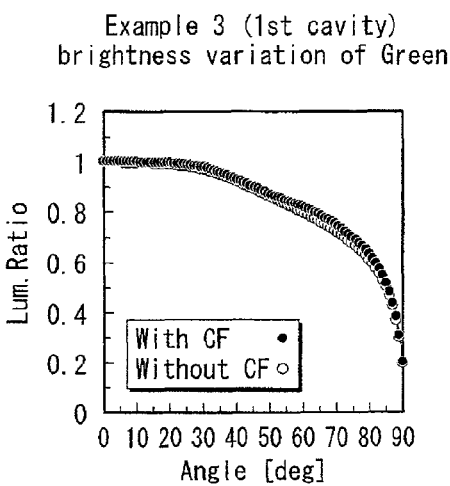
FIG. 22A to FIG. 22D explain viewing angle characteristics of a G (green) organic EL element under the same conditions as those in FIG. 20A to FIG. 20D, FIG. 22A and FIG. 22B show viewing angle dependence of brightness in Example 3 and Comparative example 3, respectively.
Figure 22B:
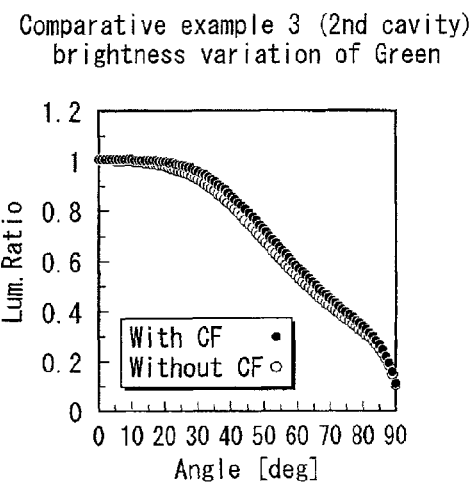

FIG. 22A to FIG. 22D explain viewing angle characteristics of a G (green) organic EL element under the same conditions as those in FIG. 20A to FIG. 20D. FIG. 22A and FIG. 22B show viewing angle dependence of brightness in Example 3 and Comparative example 3, respectively. According to these figures, in Example 3, a viewing angle of 30° corresponds to a brightness of around 100%, and a viewing angle of 45° corresponds to a brightness of around 90% (with the CF). Compared with this, in Comparative example 3, a viewing angle of 30° corresponds to a brightness of around 97%, and a viewing angle of 45° corresponds to a brightness of around 79% (with the CF). This demonstrates that while Example 3 satisfies the allowable ranges shown in FIG. 8, Comparative example 3 does not satisfy the allowable ranges shown in FIG. 8.

Figure 22C:
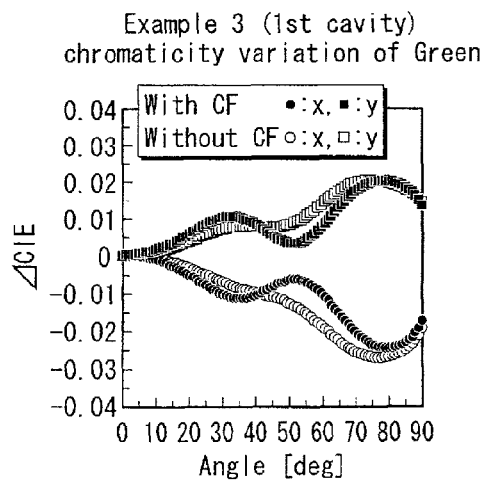
Figure 22D:
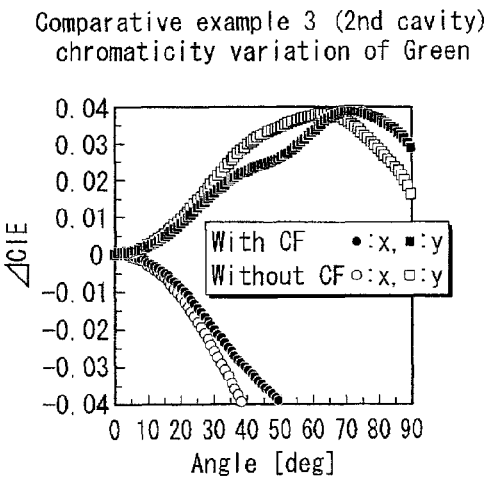

FIG. 22C and FIG. 22D show viewing angle dependence of chromaticity in Example 3 and Comparative example 3, respectively. According to these figures, in Example 3, a viewing angle of 50° corresponds to a chromaticity variation of $\Delta x$ of approximately 0.005 and $\Delta y$ of approximately 0.005 (with the CF). Compared with this, in Comparative example 3, a viewing angle of 50° corresponds to a chromaticity variation of $\Delta x$ of approximately 0.04 and $\Delta y$ of approximately 0.025 (with the CF). This demonstrates that both Example 3 and Comparative example 3 satisfy the allowable ranges shown in FIG. 8. Note that Example 3 exhibits a lower viewing angle dependence of chromaticity than Comparative example 3, and is accordingly more excellent in viewing angle characteristics than Comparative example 3.
(Red)

Figure 23A:
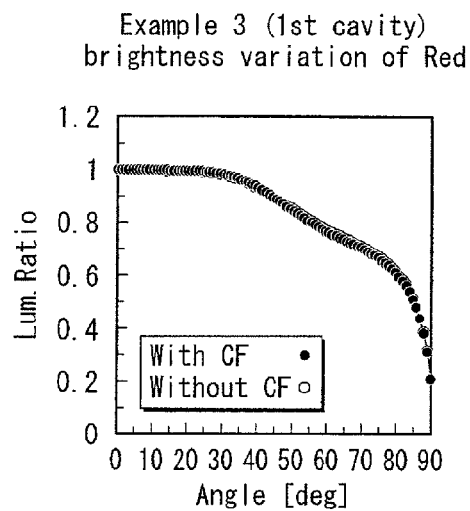
FIG. 23A to FIG. 23D explain viewing angle characteristics of an R (red) organic EL element under the same conditions as those in FIG. 20A to FIG. 20D, FIG. 23A and FIG. 23B show viewing angle dependence of brightness in Example 3 and Comparative example 3, respectively.
Figure 23B:
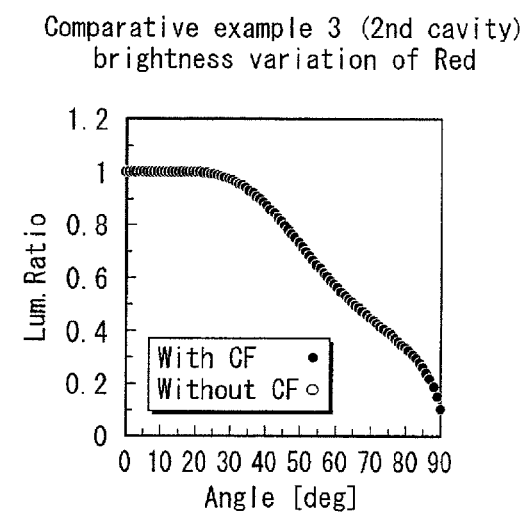

FIG. 23A to FIG. 23D explain viewing angle characteristics of an R (red) organic EL element under the same conditions as those in FIG. 20A to FIG. 20D. FIG. 23A and FIG. 23B show viewing angle dependence of brightness in Example 3 and Comparative example 3, respectively. According to these figures, in Example 3, a viewing angle of 30° corresponds to a brightness of around 98%, and a viewing angle of 45° corresponds to a brightness of around 90% (with the CF). Compared with this, in Comparative example 3, a viewing angle of 30° corresponds to a brightness of around 98%, and a viewing angle of 45° corresponds to a brightness of around 80% (with the CF). This demonstrates that both Example 3 and Comparative example 3 satisfy the allowable ranges shown in FIG. 8. Note that Example 3 exhibits a lower viewing angle dependence of brightness than Comparative example 3, and is accordingly more excellent in viewing angle characteristics than Comparative example 3.

Figure 23C:
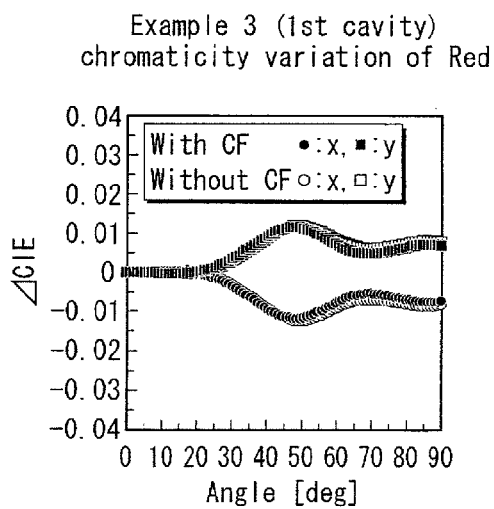
Figure 23D:
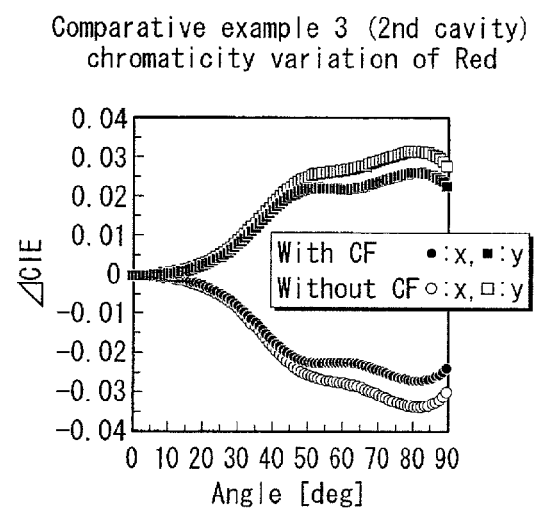

FIG. 23C and FIG. 23D show viewing angle dependence of chromaticity in Example 3 and Comparative example 3, respectively. According to these figures, in Example 3, a viewing angle of 50° corresponds to a chromaticity variation of $\Delta x$ of approximately 0.012 and $\Delta y$ of approximately 0.012 (with the CF). Compared with this, in Comparative example 3, a viewing angle of 50° corresponds to a chromaticity variation of $\Delta x$ of approximately 0.023 and $\Delta y$ of approximately 0.023 (with the CF). This demonstrates that both Example 3 and Comparative example 3 satisfy the allowable ranges shown in FIG. 8. Note that Example 3 exhibits a lower viewing angle dependence of chromaticity than Comparative example 3, and is accordingly more excellent in viewing angle characteristics than Comparative example 3.

(Blue)

Figure 24A:
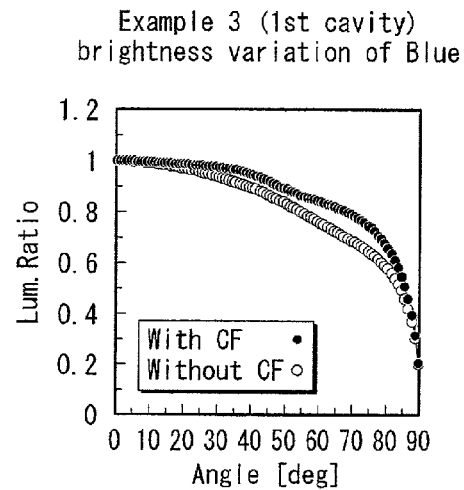
FIG. 24A to FIG. 24D explain viewing angle characteristics of a B (blue) organic EL element under the same conditions as those in FIG. 20A to FIG. 20D, FIG. 24A and FIG. 24B show viewing angle dependence of brightness in Example 3 and Comparative example 3, respectively.
Figure 24B:
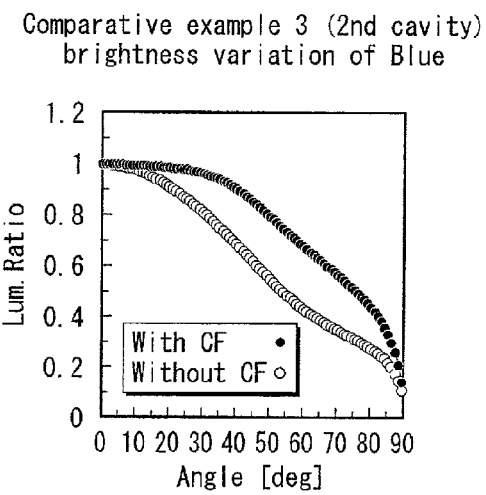

FIG. 24A to FIG. 24D explain viewing angle characteristics of a B (blue) organic EL element under the same conditions as those in FIG. 20A to FIG. 20D. FIG. 24A and FIG. 24B show viewing angle dependence of brightness in Example 3 and Comparative example 3, respectively. According to these figures, in Example 3, a viewing angle of 30° corresponds to a brightness of around 98%, and a viewing angle of 45° corresponds to a brightness of around 95% (with the CF). Compared with this, in Comparative example 3, a viewing angle of 30° corresponds to a brightness of around 97%, and a viewing angle of 45° corresponds to a brightness of around 87% (with the CF). This demonstrates that both Example 3 and Comparative example 3 satisfy the allowable ranges shown in FIG. 8. Note that Example 3 exhibits a lower viewing angle dependence of brightness than Comparative example 3, and is accordingly more excellent in viewing angle characteristics than Comparative example 3.

Figure 24C:
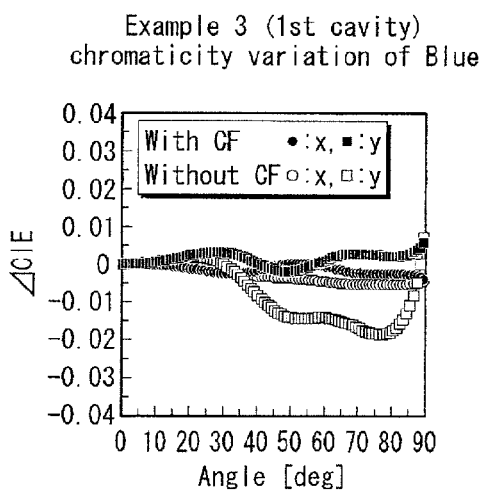
Figure 24D:
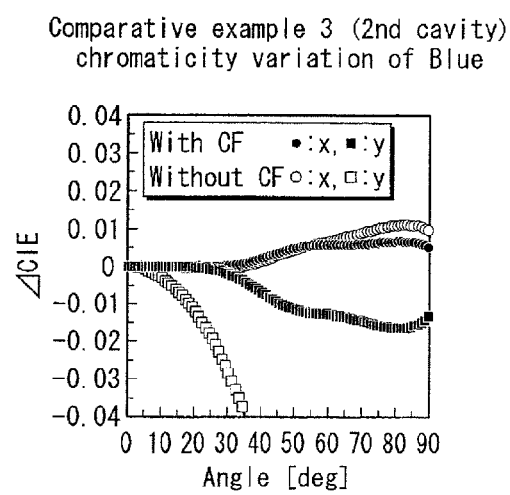

FIG. 24C and FIG. 24D show viewing angle dependence of chromaticity in Example 3 and Comparative example 3, respectively. According to these figures, in Example 3, a viewing angle of 50° corresponds a chromaticity variation of $\Delta x$ of substantially 0 and $\Delta y$ of substantially 0 (with the CF). Compared with this, in Comparative example 3, a viewing angle of 50° corresponds to a chromaticity variation of $\Delta x$ of approximately 0.005 and $\Delta y$ of approximately 0.01 (with the CF). This demonstrates that both Example 3 and Comparative example 3 satisfy the allowable ranges shown in FIG. 8. Note that Example 3 exhibits a lower viewing angle dependence of chromaticity than Comparative example 3, and is accordingly more excellent in viewing angle characteristics than Comparative example 3.

Therefore, Example 3 is more excellent in viewing angle characteristics than Comparative example 3 with respect to the respective organic EL elements of the R, G, and B colors. Especially, with respect to the G (green) organic EL element, Example 3 is more excellent in viewing angle characteristics than Comparative example 3 because while Example 3 satisfies the allowable ranges shown in FIG. 8, Comparative example 3 does not satisfy the allowable ranges shown in FIG. 8.

[Fourth Simulation]

<Conditions>

In the fourth simulation, a functional layer has a three-layer structure of a transparent conductive layer, a hole injection layer, and a hole transport layer. Also, the transparent conductive layer is formed from IZO, the hole injection layer is formed from an inorganic material, the hole transport layer is formed from an organic material, a reflective electrode is formed from aluminum, and respective organic light emitting layers of the R, G, and B colors are formed from RP 158, GP1200, and BP105 manufactured by Sumation Co., Ltd. respectively.

<Light-Emitting Efficiency and Simplicity of Film Thickness Adjustment>

Figure 25:
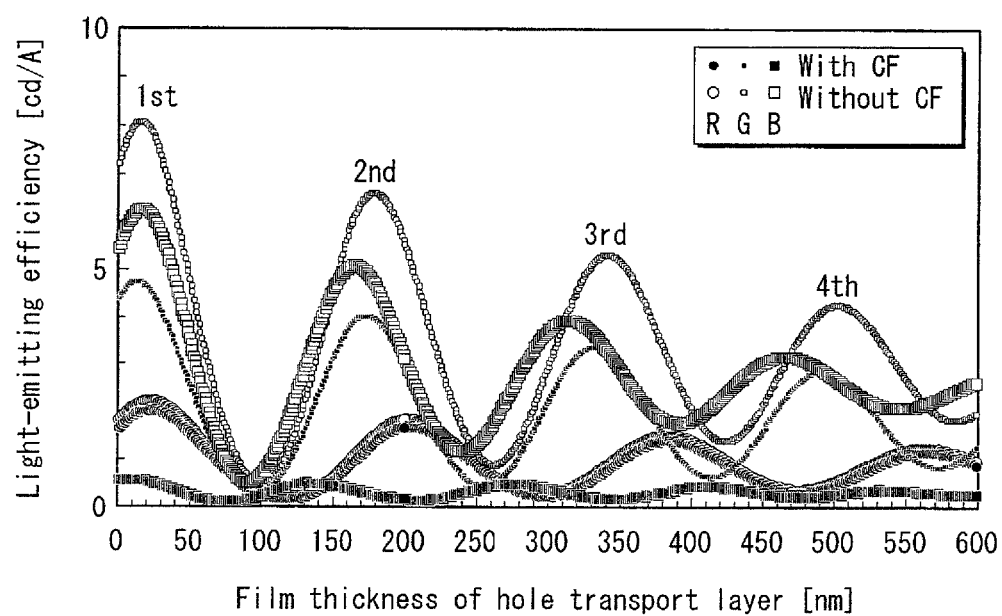
FIG. 25 shows variation of light-emitting efficiency in cd/A when setting the film thickness of the transparent conductive layer to 20 nm, setting the film thickness of the hole injection layer to 5 nm, and varying the film thickness of the hole transport layer from 0 nm to 600 nm under the conditions in the fourth simulation.

FIG. 25 shows variation of light-emitting efficiency in cd/A when setting the film thickness of the transparent conductive layer to 20 nm, setting the film thickness of the hole injection layer to 5 nm, and varying the film thickness of the hole transport layer from 0 nm to 600 nm under the above conditions. As shown in FIG. 25, the 1st cavity exhibits a higher light-emitting efficiency than the 2nd cavity. Accordingly, adoption of the 1st cavity leads to a higher light-emitting efficiency of organic EL elements compared with adoption of the 2nd cavity. FIG. 25 also shows that the 1st cavity exhibits a local maximum of light-emitting efficiency for each of the R, G, and B colors when the hole transport layer of each of the R, G, and B colors has a film thickness within a narrow range of 0 nm to 35 nm (the functional layer has a film thickness within a range of 0 nm to 60 nm). Compared with this, the 2nd cavity exhibits a local maximum of light-emitting efficiency for each of the R, G, and B colors when the hole transport layer of each of the R, G, and B colors has a film thickness within a wide range of 100 nm to 250 nm Accordingly, with adoption of the 1st cavity for the respective organic EL elements of the R, G, and B colors, it is much less necessary to separately manufacture respective hole transport layers of the R, G, and B colors, compared with adoption of the 2nd cavity. This simplifies the film thickness adjustment during the manufacturing process.

FIG. 26 shows comparison of adoption of the 1st cavity with adoption of the 2nd cavity for organic EL elements under the same conditions as those in FIG. 25.

In Example 4 (1st cavity), respective transparent conductive layers of the R, G, and B colors each have a film thickness of 20 nm in common, respective hole injection layers of the R, G, and B colors each have a film thickness of 5 nm in common, and respective hole transport layers of the R, G, and B colors have a film thickness of 25 nm, a film thickness of 16 nm, and a film thickness of 9 nm, respectively. The chromaticity for each of the R, G, and B colors is adjusted so as to fall within an appropriate range with use of CF (color filter). In Comparative example 4 (the 2nd cavity), respective transparent conductive layers of the R, G, and B colors each have a film thickness of 20 nm in common, respective hole injection layers of the R, G, and B colors each have a film thickness of 5 nm in common, and respective hole transport layers of the R, G, and B colors have a film thickness of 212 nm, a film thickness of 180 nm, and a film thickness of 146 nm, respectively. The chromaticity for each of the R, G, and B colors is adjusted so as to fall within an appropriate range with use of the color filter. The comparison of Example 4 and Comparative example 4 demonstrates that Example 4 is more excellent in both light-emitting efficiency and simplicity of film thickness adjustment than Comparative example 4.

Also, as shown in FIG. 27, a right member m in Equation 1 is an integer in Example 4 and Comparative example 4. Also, in consideration that the functional layer has a margin width of the film thickness of 20 nm or more in Example 4, the right member m in Equation 1 does not need to be an integer, like Example 4' shown in FIG. 27.

<Viewing Angle Characteristics>
(Green)

Figure 28A:
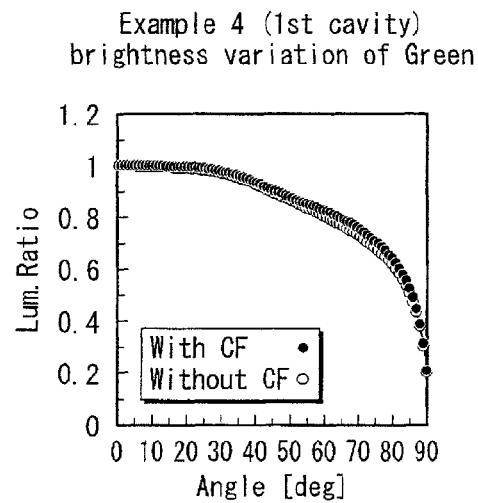
FIG. 28A to FIG. 28D explain viewing angle characteristics of a G (green) organic EL element under the same conditions as those in FIG. 26A to FIG. 26D, FIG. 28A and FIG. 28B show viewing angle dependence of brightness in Example 4 and Comparative example 4, respectively.
Figure 28B:
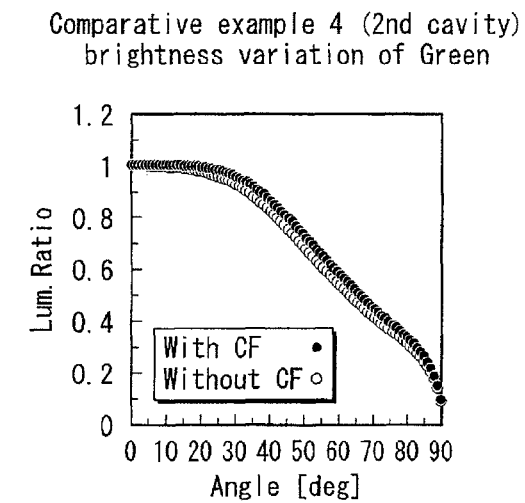

FIG. 28A to FIG. 28D explain viewing angle characteristics of a G (green) organic EL element under the same conditions as those in FIG. 26A to FIG. 26D. FIG. 28A and FIG. 28B show viewing angle dependence of brightness in Example 4 and Comparative example 4, respectively. According to these figures, in Example 4, a viewing angle of 30° corresponds to a brightness of around 98%, and a viewing angle of 45° corresponds to a brightness of around 92% (with the CF). Compared with this, in Comparative example 4, a viewing angle of 30° corresponds to a brightness of around 97%, and a viewing angle of 45° corresponds to a brightness of around 80% (with the CF). This demonstrates that both Example 4 and Comparative example 4 satisfy the allowable ranges shown in FIG. 8. Note that Example 4 exhibits a lower viewing angle dependence of brightness than Comparative example 4, and is accordingly more excellent in viewing angle characteristics than Comparative example 4.

Figure 28C:
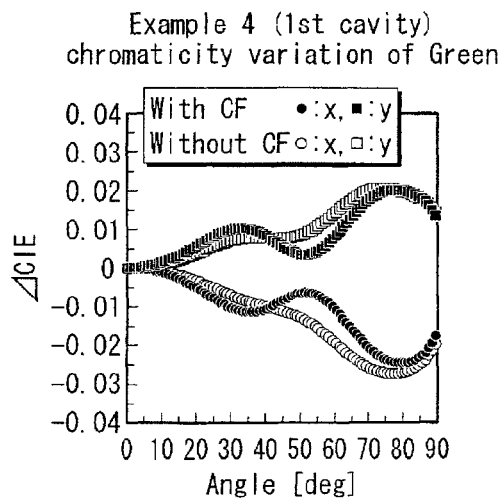
Figure 28D:
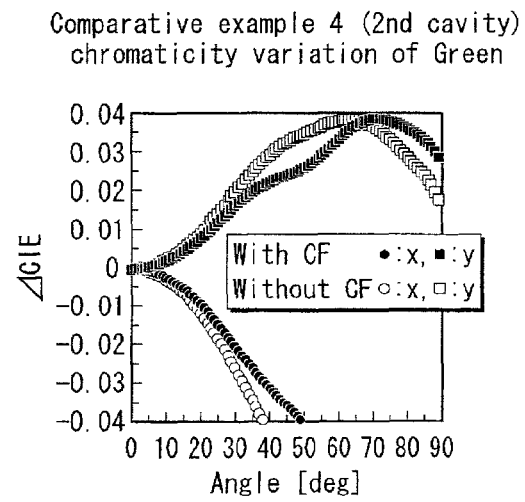

FIG. 28C and FIG. 28D show viewing angle dependence of chromaticity in Example 4 and Comparative example 4, respectively. According to these figures, in Example 4, a viewing angle of 50° corresponds to a chromaticity variation of $\Delta x$ of approximately 0.006 and $\Delta y$ of approximately 0.004 (with the CF). Compared with this, in Comparative example 4, a viewing angle of 50° corresponds to a chromaticity variation of $\Delta x$ of approximately 0.04 and $\Delta y$ of approximately 0.026 (with the CF). This demonstrates that both Example 4 and Comparative example 4 satisfy the allowable ranges shown in FIG. 8. Note that Example 4 exhibits a lower viewing angle dependence of chromaticity than Comparative example 4, and is accordingly more excellent in viewing angle characteristics than Comparative example 4.

(Red)

Figure 29A:
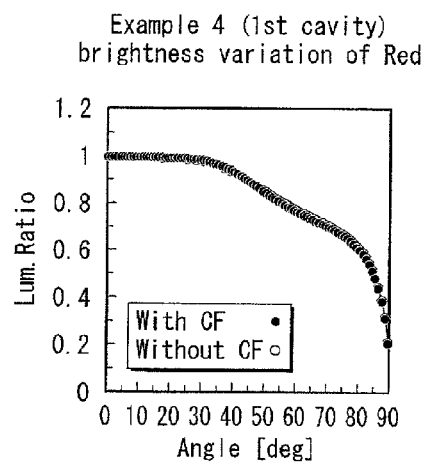
FIG. 29A to FIG. 29D explain viewing angle characteristics of an R (red) organic EL element under the same conditions as those in FIG. 26A to FIG. 26D, FIG. 29A and FIG. 29B show viewing angle dependence of brightness in Example 4 and Comparative example 4, respectively.
Figure 29B:
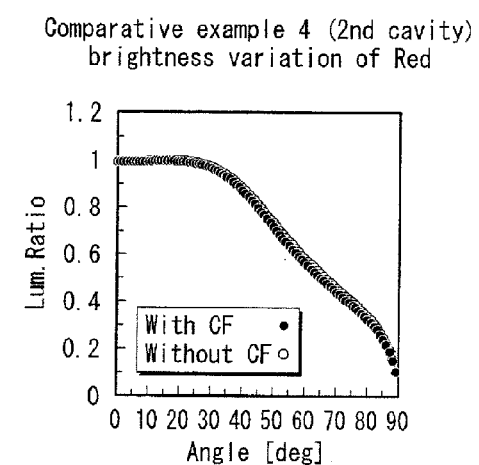

FIG. 29A to FIG. 29D explain viewing angle characteristics of an R (red) organic EL element under the same conditions as those in FIG. 26A to FIG. 26D. FIG. 29A and FIG. 29B show viewing angle dependence of brightness in Example 4 and Comparative example 4, respectively. According to these figures, in Example 4, a viewing angle of 30° corresponds to a brightness of around 98%, and a viewing angle of 45° corresponds to a brightness of around 90% (with the CF). Compared with this, in Comparative example 4, a viewing angle of 30° corresponds to a brightness of around 98%, and a viewing angle of 45° corresponds to a brightness of around 80% (with the CF). This demonstrates that both Example 4 and Comparative example 4 satisfy the allowable ranges shown in FIG. 8. Note that Example 4 exhibits a lower viewing angle dependence of brightness than Comparative example 4, and is accordingly more excellent in viewing angle characteristics than Comparative example 4.

Figure 29C:
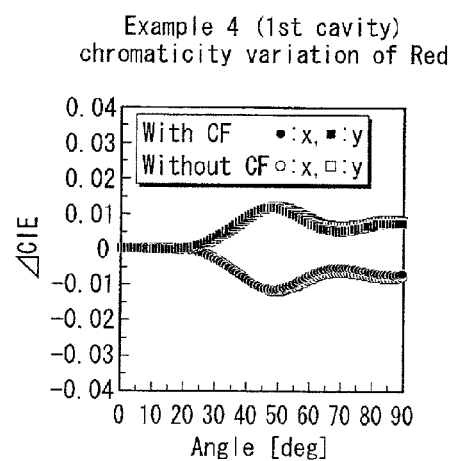
Figure 29D:
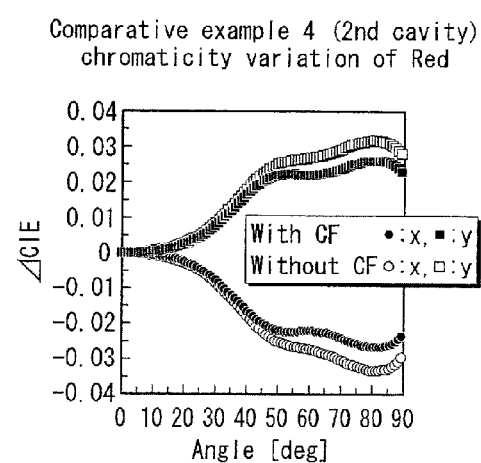

FIG. 29C and FIG. 29D show viewing angle dependence of chromaticity in Example 4 and Comparative example 4, respectively. According to these figures, in Example 4, a viewing angle of 50° corresponds to a chromaticity variation of $\Delta x$ of approximately 0.011 and $\Delta y$ of approximately 0.013 (with the CF). Compared with this, in Comparative example 4, a viewing angle of 50° corresponds to a chromaticity variation of $\Delta x$ of approximately 0.022 and $\Delta y$ of approximately 0.023 (with the CF). This demonstrates that both Example 4 and Comparative example 4 satisfy the allowable ranges shown in FIG. 8. Note that Example 4 exhibits a lower viewing angle dependence of chromaticity than Comparative example 4, and is accordingly more excellent in viewing angle characteristics than Comparative example 4.

(Blue)

Figure 30A:
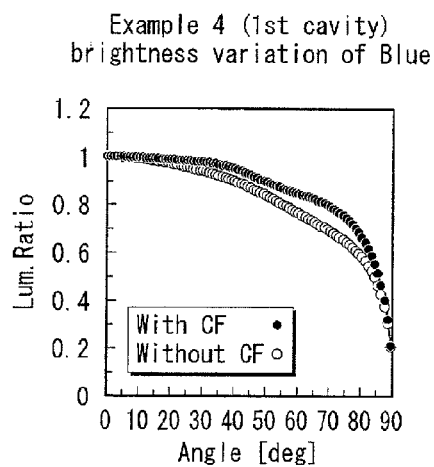
FIG. 30A to FIG. 30D explain viewing angle characteristics of a B (blue) organic EL element under the same conditions as those in FIG. 26A to FIG. 26D, FIG. 30A and FIG. 30B show viewing angle dependence of brightness in Example 4 and Comparative example 4, respectively.
Figure 30B:
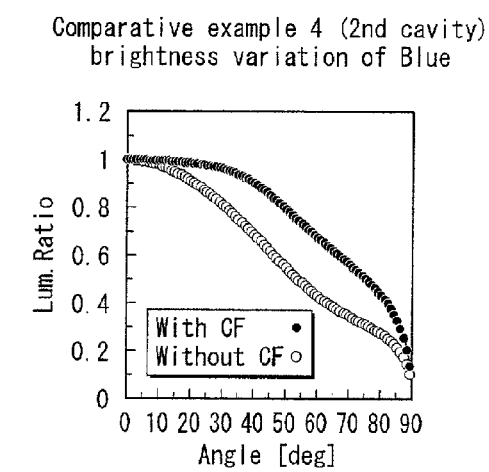

FIG. 30A to FIG. 30D explain viewing angle characteristics of a B (blue) organic EL element under the same conditions as those in FIG. 26A to FIG. 26D. FIG. 30A and FIG. 30B show viewing angle dependence of brightness in Example 4 and Comparative example 4, respectively. According to these figures, in Example 4, a viewing angle of 30° corresponds to a brightness of around 98%, and a viewing angle of 45° corresponds to a brightness of around 92% (with the CF). Compared with this, in Comparative example 4, a viewing angle of 30° corresponds to a brightness of around 97%, and a viewing angle of 45° corresponds to a brightness of around 85% (with the CF). This demonstrates that both Example 4 and Comparative example 4 satisfy the allowable ranges shown in FIG. 8. Note that Example 4 exhibits a lower viewing angle dependence of brightness than Comparative example 4, and is accordingly more excellent in viewing angle characteristics than Comparative example 4.

Figure 30C:
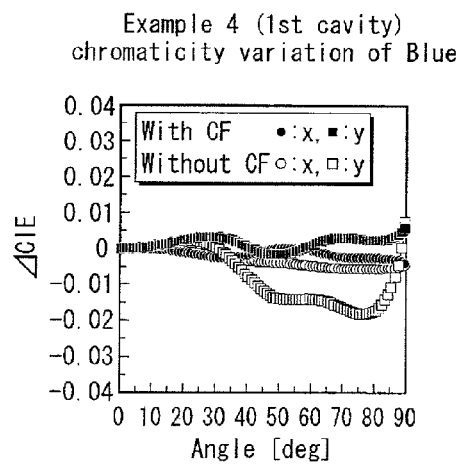
Figure 30D:
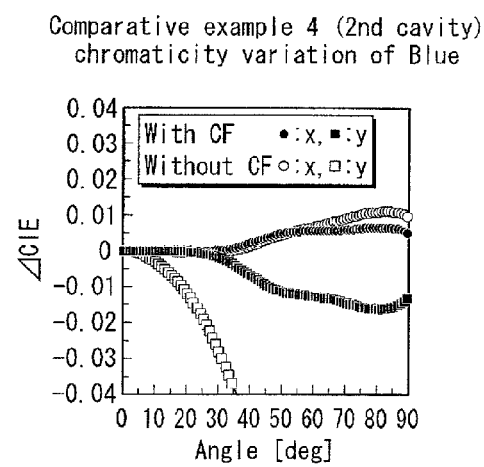

FIG. 30C and FIG. 30D show viewing angle dependence of chromaticity in Example 4 and Comparative example 4, respectively. According to these figures, in Example 4, a viewing angle of 50° corresponds a chromaticity variation of $\Delta x$ of substantially 0 and $\Delta y$ of substantially 0 (with the CF). Compared with this, in Comparative example 4, a viewing angle of 50° corresponds to a chromaticity variation of $\Delta x$ of approximately 0.005 and $\Delta y$ of approximately 0.011 (with the CF). This demonstrates that both Example 4 and Comparative example 4 satisfy the allowable ranges shown in FIG. 8. Note that Example 4 exhibits a lower viewing angle dependence of chromaticity than Comparative example 4, and is accordingly more excellent in viewing angle characteristics than Comparative example 4.

Therefore, Example 4 is more excellent in viewing angle characteristics than Comparative example 4 with respect to the respective organic EL elements of the R, G, and B colors. Especially, with respect to the G (green) organic EL element, Example 4 is more excellent in viewing angle characteristics than Comparative example 4 for the following reasons. Comparative example 4 barely satisfies the allowable ranges shown in FIG. 8, and accordingly the film thickness margin of the functional layer cannot be reserved. On the other hand, Example 4 easily satisfies the allowable range shown in FIG. 8, and accordingly the film thickness margin of the functional layer can be reserved.

[Fifth Simulation]
<Conditions>

In the fifth simulation, a transparent conductive layer is formed from IZO, and a reflective electrode is formed from aluminum, and the structural elements other than these are the same as those in the fourth simulation.

<Light-Emitting Efficiency and Simplicity of Film Thickness Adjustment>

Figure 31:
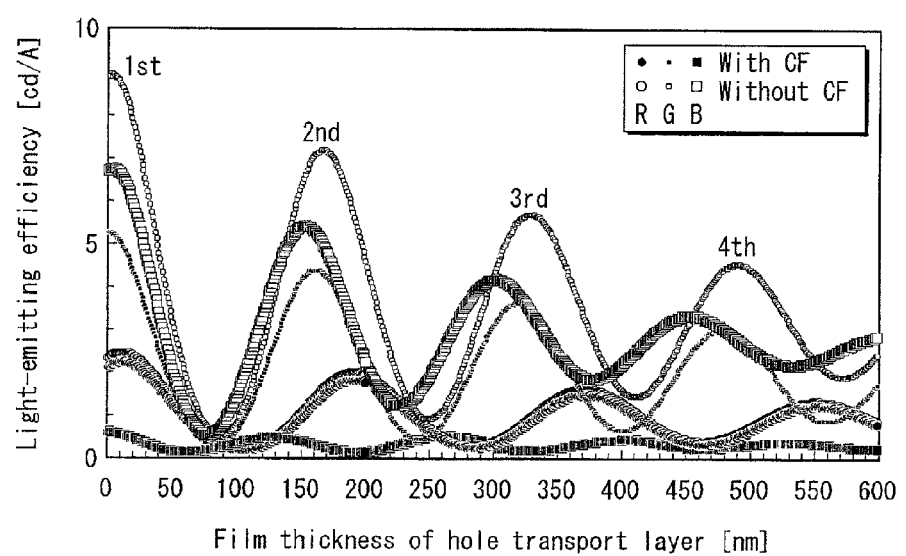
FIG. 31 shows variation of light-emitting efficiency in cd/A when setting the film thickness of the transparent conductive layer to 20 nm, setting the film thickness of the hole injection layer to 5 nm, and varying the film thickness of the hole transport layer from 0 nm to 600 nm under the conditions in the fifth simulation.

FIG. 31 shows variation of light-emitting efficiency in cd/A when setting the film thickness of the transparent conductive layer to 20 nm, setting the film thickness of the hole injection layer to 5 nm, and varying the film thickness of the hole transport layer from 0 nm to 600 nm under the above conditions. As shown in FIG. 31, the 1st cavity exhibits a higher light-emitting efficiency than the 2nd cavity. Accordingly, adoption of the 1st cavity leads to a higher light-emitting efficiency of organic EL elements compared with adoption of the 2nd cavity. FIG. 31 also shows that the 1st cavity exhibits a local maximum of light-emitting efficiency for each of the R, G, and B colors when the hole transport layer of each of the R, G, and B colors has a film thickness within a narrow range of 0 nm to 35 nm (the functional layer has a film thickness within a range of 0 nm to 60 nm). Compared with this, the 2nd cavity exhibits a local maximum of light-emitting efficiency for each of the R, G, and B colors when the hole transport layer of each of the R, G, and B colors has a film thickness within a wide range of 100 nm to 250 nm. Accordingly, with adoption of the 1st cavity for the respective organic EL elements of the R, G, and B colors, it is much less necessary to separately manufacture respective hole transport layers of the R, G, and B colors, compared with adoption of the 2nd cavity. This simplifies the film thickness adjustment during the manufacturing process.

FIG. 32 shows comparison of adoption of the 1st cavity with adoption of the 2nd cavity for organic EL elements under the same conditions as those in FIG. 31.

In Example 5 (the 1st cavity), respective transparent conductive layers of the R, G, and B colors each have a film thickness of 20 nm in common, respective hole injection layers of the R, G, and B colors each have a film thickness of 5 nm in common, and respective hole transport layers of the R, G, and B colors have a film thickness of 15 rim, a film thickness of 9 nm, and a film thickness of 5 nm, respectively. The chromaticity for each of the R, G, and B colors is adjusted so as to fall within an appropriate range with use of the color filter. In Comparative example 5 (the 2nd cavity), respective transparent conductive layers of the R, G, and B colors each have a film thickness of 20 nm in common, respective hole injection layers of the R, G, and B colors each have a film thickness of 5 nm in common, and respective hole transport layers of the R, G, and B colors have a film thickness of 213 nm, a film thickness of 166 nm, and a film thickness of 143 nm, respectively. The chromaticity for each of the R, G, and B colors is adjusted so as to fall within an appropriate range with use of the color filter. The comparison of Example 5 and Comparative example 5 demonstrates that Example 5 is more excellent in both light-emitting efficiency and simplicity of film thickness adjustment than Comparative example 5.

Also, as shown in FIG. 33, a right member m in Equation 1 is an integer in Example 5 and Comparative example 5. Also, in consideration that the functional layer has a margin width of the film thickness of 20 nm or more in Example 5, the right member m in Equation 1 does not need to be an integer, like Example 5' in FIG. 33.

<Viewing Angle Characteristics>
(Green)

Figure 34A:
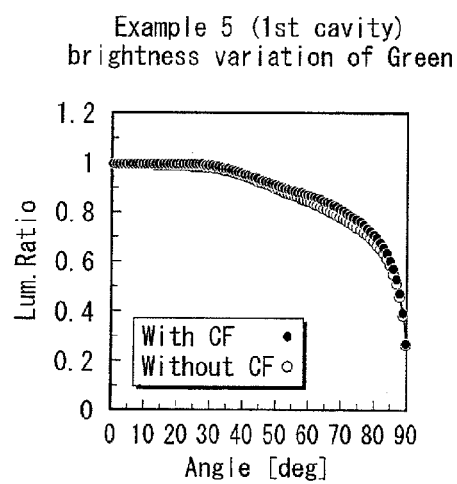
FIG. 34A to FIG. 34D explain viewing angle characteristics of a G (green) organic EL element under the same conditions as those in FIG. 32A to FIG. 32D, FIG. 34A and FIG. 34B show viewing angle dependence of brightness in Example 5 and Comparative example 5, respectively.
Figure 34B:
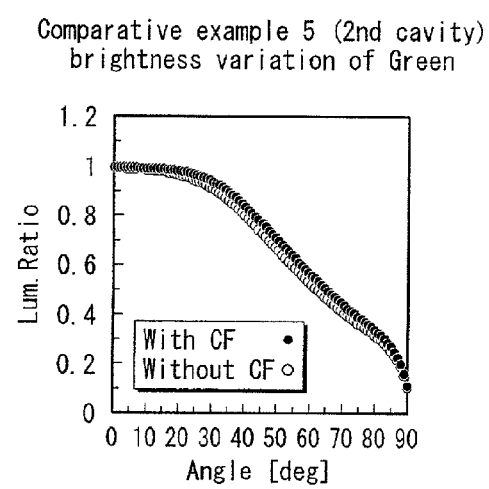

FIG. 34A to FIG. 34D explain viewing angle characteristics of a G (green) organic EL element under the same conditions as those in FIG. 32A to FIG. 32D. FIG. 34A and FIG. 34B show viewing angle dependence of brightness in Example 5 and Comparative example 5, respectively. According to these figures, in Example 5, a viewing angle of 30° corresponds to a brightness of around 100%, and a viewing angle of 45° corresponds to a brightness of around 98% (with the CF). Compared with this, in Comparative example 5, a viewing angle of 30° corresponds to a brightness of around 95%, and a viewing angle of 45° corresponds to a brightness of around 78% (with the CF). This demonstrates that while Example 5 satisfies the allowable ranges shown in FIG. 8, Comparative example 5 does not satisfy the allowable ranges shown in FIG. 8.

Figure 34C:
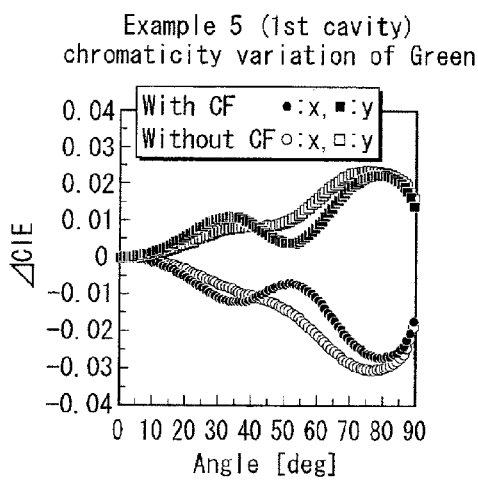
Figure 34D:
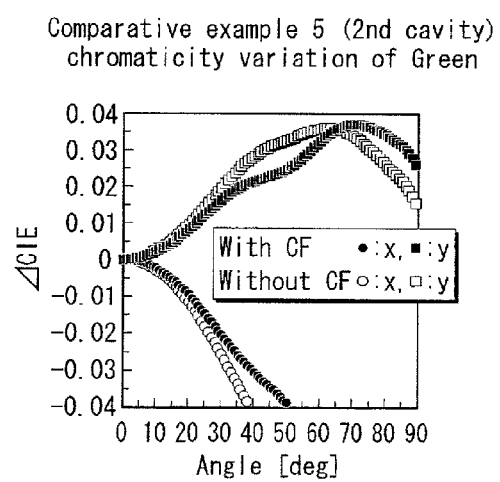

FIG. 34C and FIG. 34D show viewing angle dependence of chromaticity in Example 5 and Comparative example 5, respectively. According to these figures, in Example 5, a viewing angle of 50° corresponds to a chromaticity variation of $\Delta x$ of approximately 0.007 and $\Delta y$ of approximately 0.005 (with the CF). Compared with this, in Comparative example 5, a viewing angle of 50° corresponds to a chromaticity variation of $\Delta x$ of approximately 0.038 and $\Delta y$ of approximately 0.025 (with the CF). This demonstrates that both Example 5 and Comparative example 5 satisfy the allowable ranges shown in FIG. 8. Note that Example 5 exhibits a lower viewing angle dependence of chromaticity than Comparative example 5, and is accordingly more excellent in viewing angle characteristics than Comparative example 5.

(Red)

Figure 35A:
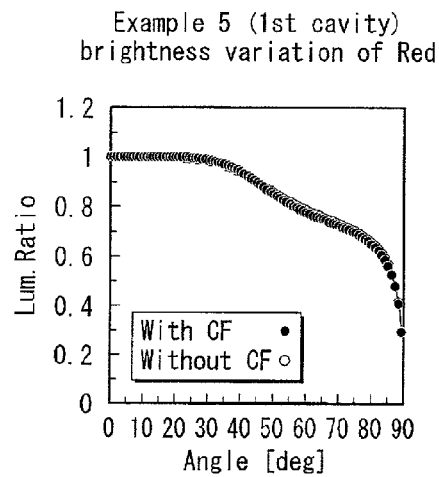
FIG. 35A to FIG. 35D explain viewing angle characteristics of an R (red) organic EL element under the same conditions as those in FIG. 32A to FIG. 32D, FIG. 35A and FIG. 35B show viewing angle dependence of brightness in Example 5 and Comparative example 5, respectively.
Figure 35B:
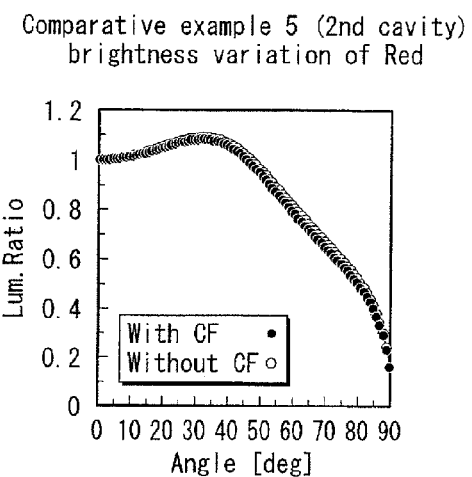

FIG. 35A to FIG. 35D explain viewing angle characteristics of an R (red) organic EL element under the same conditions as those in FIG. 32A to FIG. 32D. FIG. 35A and FIG. 35B show viewing angle dependence of brightness in Example 5 and Comparative example 5, respectively. According to these figures, in Example 5, a viewing angle of 30° corresponds to a brightness of around 100%, and a viewing angle of 45° corresponds to a brightness of around 90% (with the CF). Compared with this, in Comparative example 5, a viewing angle of 30° corresponds to a brightness of around 110%, and a viewing angle of 45° corresponds to a brightness of around 100% (with the CF). This demonstrates that both Example 5 and Comparative example 5 satisfy the allowable ranges shown in FIG. 8.

Figure 35C:
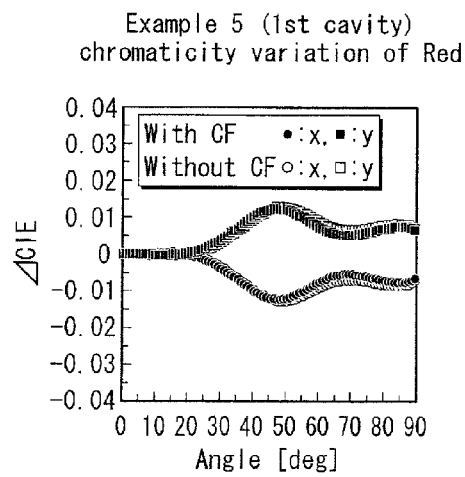
Figure 35D:
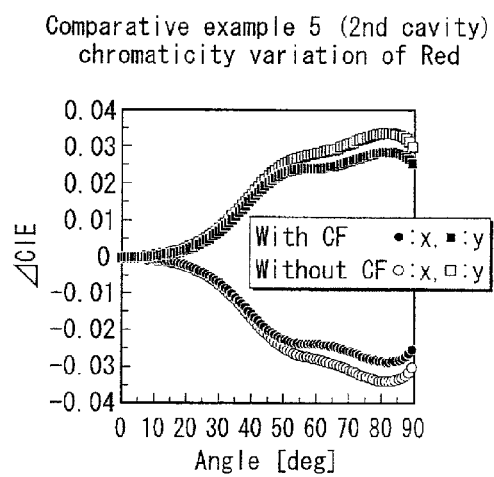

FIG. 35C and FIG. 35D show viewing angle dependence of chromaticity in Example 5 and Comparative example 5, respectively. According to these figures, in Example 5, a viewing angle of 50° corresponds to a chromaticity variation of $\Delta x$ of approximately 0.012 and $\Delta y$ of approximately 0.013 (with the CF). Compared with this, in Comparative example 5, a viewing angle of 50° corresponds to a chromaticity variation of $\Delta x$ of approximately 0.023 and $\Delta y$ of approximately 0.023 (with the CF). This demonstrates that both Example 5 and Comparative example 5 satisfy the allowable ranges shown in FIG. 8. Note that Example 5 exhibits a lower viewing angle dependence of chromaticity than Comparative example 5, and is accordingly more excellent in viewing angle characteristics than Comparative example 5.

(Blue)

Figure 36A:
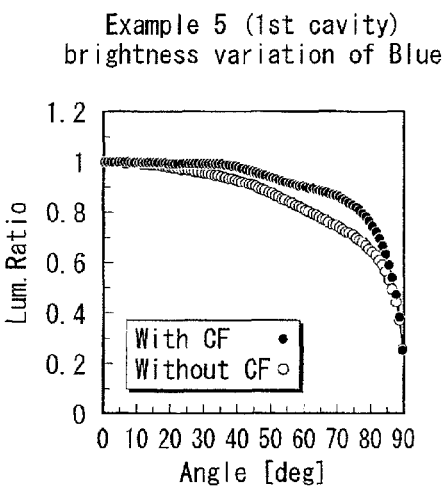
FIG. 36A to FIG. 36D explain viewing angle characteristics of a B (blue) organic EL element under the same conditions as those in FIG. 32A to FIG. 32D, FIG. 36A and FIG. 36B show viewing angle dependence of brightness in Example 5 and Comparative example 5, respectively.
Figure 36B:
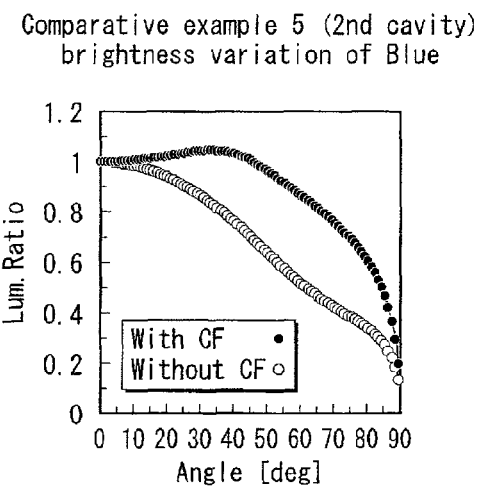

FIG. 36A to FIG. 36D explain viewing angle characteristics of a B (blue) organic EL element under the same conditions as those in FIG. 32A to FIG. 32D. FIG. 36A and FIG. 36B show viewing angle dependence of brightness in Example 5 and Comparative example 5, respectively. According to these figures, in Example 5, a viewing angle of 30° corresponds to a brightness of around 100%, and a viewing angle of 45° corresponds to a brightness of around 98% (with the CF). Compared with this, in Comparative example 5, a viewing angle of 30° corresponds to a brightness of around 104%, and a viewing angle of 45° corresponds to a brightness of around 100% (with the CF). This demonstrates that both Example 5 and Comparative example 5 satisfy the allowable ranges shown in FIG. 8. Note that Example 5 exhibits a lower viewing angle dependence of brightness than Comparative example 5, and is accordingly more excellent in viewing angle characteristics than Comparative example 5.

Figure 36C:
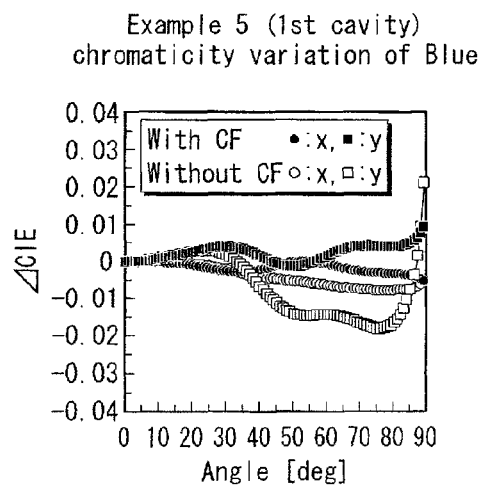
Figure 36D:
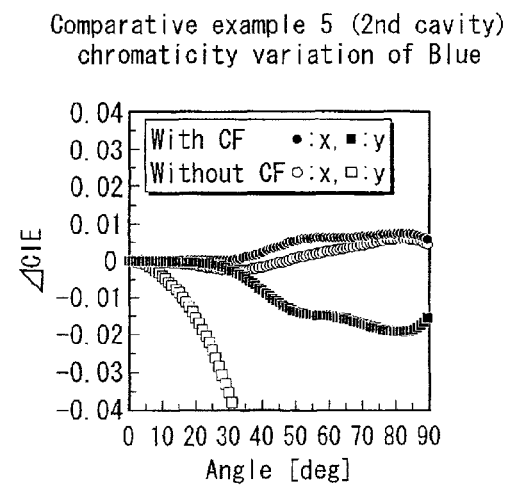

FIG. 36C and FIG. 36D show viewing angle dependence of chromaticity in Example 5 and Comparative example 5, respectively. According to these figures, in Example 5, a viewing angle of 50° corresponds to a chromaticity variation of $\Delta x$ of substantially 0 and $\Delta y$ of substantially 0 (with the CF). Compared with this, in Comparative example 5, a viewing angle of 50° corresponds to a chromaticity variation of $\Delta x$ of approximately 0.006 and $\Delta y$ of approximately 0.014 (with the CF). This demonstrates that both Example 5 and Comparative example 5 satisfy the allowable ranges shown in FIG. 8. Note that Example 5 exhibits a lower viewing angle dependence of chromaticity than Comparative example 5, and is accordingly more excellent in viewing angle characteristics than Comparative example 5.

Therefore, Example 5 is more excellent in viewing angle characteristics than Comparative example 5 with respect to the respective organic EL elements of the R, G, and B colors. Especially, with respect to the G (green) organic EL element, Example 5 is more excellent in viewing angle characteristics than Comparative example 5 because while Example 5 satisfies the allowable ranges shown in FIG. 8, Comparative example 5 does not satisfy the allowable ranges shown in FIG. 8.

[Summary of Simulations]

FIG. 37 is a list of film thickness of the functional layer of each of the R, G, and B colors obtained in the simulations. FIG. 38 is a list of difference in film thickness of the functional layers between the R and G colors, between the G and B colors, and between the R and B colors obtained in the simulations. The results of the simulations demonstrates that Examples 1 to 5 are desirable. The following summary is drawn from Examples 1 to 5.

(1) The respective functional layers of the R, G, and B colors each should have a film thickness of 26 nm to 50 nm. Each difference in film thickness of the functional layers between the R and G colors, between the G and B colors, and between the R and B colors should be 1 nm to 16 nm. Furthermore, the respective organic light-emitting layers of the R, G, and B colors each should have an optical distance of 49 nm to 90 nm from the corresponding reflective electrode. The respective organic light-emitting layers of the R, G, and B colors differ in optical distance from the respective reflective electrodes by 0 nm to 25 nm between the R and G colors, between the G and B colors, and between the R and B colors. Note that the value of the optical distance is rounded off to a whole number.

(2) In the case where the functional layer has a two-layer structure of a transparent conductive layer and a hole transport layer, the respective hole transport layers of the R, G, and B colors should have a film thickness of 13 nm to 30 nm, a film thickness of 12 nm to 21 nm, and a film thickness of 10 nm to 15 nm, respectively, and the respective transparent conductive layers of the R, G, and B colors each should have a film thickness of 15 nm to 20 nm.

(3) In the case where the functional layer has a three-layer structure of a transparent conductive layer, a hole injection layer, and a hole transport layer, the respective hole injection layers of the R, G, and B colors each should have a film thickness of more than 0 nm to 5 nm, the respective hole transport layers of the R, G, and B colors have a film thickness of 15 nm to 25 nm, a film thickness of 9 nm to 16 nm, and a film thickness of 5 nm to 9 nm, respectively, and the respective transparent conductive layers of the R, G, and B colors each should have a film thickness of 15 nm 20 nm.

(4) The respective functional layers of the R, G, and B colors should have a film thickness of 28 nm to 50 nm, a film thickness of 27 nm to 41 nm, and a film thickness of 26 nm to 35 nm, respectively.

(5) In order to further improve the optical characteristics, it is sometimes desirable that the respective functional layers of the R, G, and B colors each have a different film thickness within substantially the same range. Here, in the case where the functional layer has the two-layer structure of the transparent conductive layer and the hole transport layer, the respective transparent conductive layers of the R, G, and B colors, for example, have the same film thickness, and the respective hole transport layers of the R, G, and B colors each, for example, have a different film thickness. In the case where the functional layers has the three-layer structure of the transparent conductive layer, the hole injection layer, and the hole transport layer, the respective transparent conductive layers of the R, G, and B colors, for example, have the same film thickness, the respective hole injection layers of the R, G, and B colors, for example, preferably have the same film thickness, and the respective hole transport layers of the R, G, and B colors each preferably have a different film thickness. This is because it is assumed that while the transparent conductive layer and the hole injection layer are formed by vapor deposition or sputtering, the hole transport layer is formed by the inkjet method. According to the inkjet method, by only adjusting the number of drops of ink to drop, it is possible to adjust the film thickness of the hole transport layer of each of the R, G, and B colors. This leads to easy adjustment of film thickness for each of the R, G, and B colors compared with the vapor deposition and sputtering. For this reason, by forming the respective hole transport layers of the R, G, and B colors to each have a different film thickness, it is possible to perform fine adjustment of the film thicknesses of the functional layers with simplicity and accuracy, thereby further improving the optical characteristics.

[Specific Examples of Each Layer]

<Substrate>

The substrate 1 is a Thin Film Transistor (TFT) substrate, for example. The substrate 1 is a glass plate or quartz plate of soda glass, nonfluorescent glass, phosphate glass, borate glass, or the like; a plastic plate or plastic film of acrylic resin, styrenic resin, polycarbonate resin, epoxy resin, polyethylene, polyester, silicone resin, or the like; or a metal plate or metal foil of alumina or the like.

<Banks>

The banks 2 should be formed from an insulating material, and it is desirable that the banks 2 have organic solvent resistance. Furthermore, since the banks 2 undergo etching, baking, and the like, it is desirable that the banks 12 be formed from a material that is highly resistant to such processes. The material for the banks 2 may be an organic material such as resin, or an inorganic material such as glass. As an organic material, acrylic resin, polyimide resin, novolac-type phenolic resin, and the like can be used, and as an inorganic material, silicon dioxide ($SiO_2$), silicon nitride ($Si_3N_4$), and the like can be used.

<Reflective Electrode>

The reflective electrode 3 is electrically connected to the TFT provided on the substrate 1. In addition to functioning as a positive terminal of the organic EL element, the reflective electrode 3 has the function of reflecting light emitted from the organic light-emitting layers 7b, 7g, and 7r towards the reflective electrode 3. The reflecting function may be achieved by the structural material of the reflective electrode 3 or by applying a reflective coating to the surface portion of the reflective electrode 3. For example, the reflective electrode 3 is formed from Ag (silver), APC (alloy of silver, palladium, and copper), ARA (alloy of silver, rubidium, and gold), MoCr (alloy of molybdenum and chromium), NiCr (alloy of nickel and chromium), or the like.

<Transparent Conductive Layer>

The transparent conductive layer 4 functions as a protective layer to prevent the reflective electrode 3 from naturally oxidizing during the manufacturing process. The material for the transparent conductive layer 4 should be formed from a conductive material sufficiently translucent with respect to light emitted by the organic light-emitting layers 7b, 7g, and 7r. For example, the transparent conductive layer 4 is preferably formed from ITO or IZO, which achieve good conductivity even when a film thereof is formed at room temperature.

<Hole Injection Layer>

The hole injection layer 5 has the function of injecting holes into the organic light-emitting layers 7b, 7g, and 7r. The hole injection layer 5 is formed from an oxide of a transition metal, such as tungsten oxide (WOx), molybdenum oxide (MoOx), molybdenum tungsten oxide (MoxWyOz), or the like. Forming the hole injection layer 5 from an oxide of a transition metal allows for improvement of voltage-current density characteristics, and for an increase in emission intensity by increasing current density. Note that other metal compounds, such as a transition metal nitride, may also be used.

<Hole Transport Layer>

Examples of the material for the hole transport layer 6 include a triazole derivative, an oxadiazole derivative, an imidazole derivative, a polyarylalkane derivative, a pyrazoline derivative and pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a porphyrin compound, an aromatic tertiary amine compound and styrylamine compound, a butadiene compound, a polystyrene derivative, a hydrazone derivative, a triphenylmethane derivative, or a tetraphenylbenzene derivative, as disclosed in Japanese Patent Application Publication No. 5-163488. In particular, a porphyrin compound, as well as an aromatic tertiary amine compound and styrylamine compound, are desirable.

<Organic Light-Emitting Layer>

The organic light-emitting layers 7b, 7g, and 7r are formed from a fluorescent material such as, for example, an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, and the like, as recited in Japanese Patent Application Publication No. H5-163488.

<Electron Transport Layer>

Examples of the material for the electron transport layer 8 include a nitro-substituted fluorenone derivative, a thiopyran dioxide derivative, a diphenylquinone derivative, a perylene tetracarboxyl derivative, an anthraquinodimethane derivative, a fluoronylidene methane derivative, an anthrone derivative, an oxadiazole derivative, a perinone derivative, and a quinolone complex derivative, as recited in Japanese Patent Application Publication No. H5-163488.

Note that from the perspective of further improving electron injection characteristics, the above materials for forming the electron transport layer may be doped with an alkali metal or an alkaline-earth metal, such as Na, Ba, or Ca.

<Transparent Electrode>

The transparent electrode 9 functions as a negative electrode for the organic light-emitting element. The material for the transparent electrode 9 should be formed from a conductive material sufficiently translucent with respect to light emitted by the organic light-emitting layers 7b, 7g, and 7r. For example, the transparent electrode 9 is preferably formed from ITO or IZO.

<Thin-Film Passivation Layer>

The thin-film passivation layer 10 has the function of preventing the layers interposed between the substrate 1 and the thin-film passivation layer 10 from being exposed to moisture or air. The material for the thin-film passivation layer 10 is, for example, silicon nitride (SiN), silicon oxynitride (SiON), resin, or the like.

<Resin Passivation Layer>

The resin passivation layer 11 has the functions of adhering the back panel, which is composed of the layers from the substrate 1 to the thin-film passivation layer 10, to the front panel, on which are formed the color filters 12b, 12g, and 12r, and of preventing the layers from being exposed to moisture or air. The material for the resin passivation layer 11 is, for example, a resin adhesive or the like.

<Color Filters>

The color filters 12b, 12g, and 12r have the function of correcting the chromaticity of light emitted by the organic light-emitting elements.

[Display Device]

Figure 40:
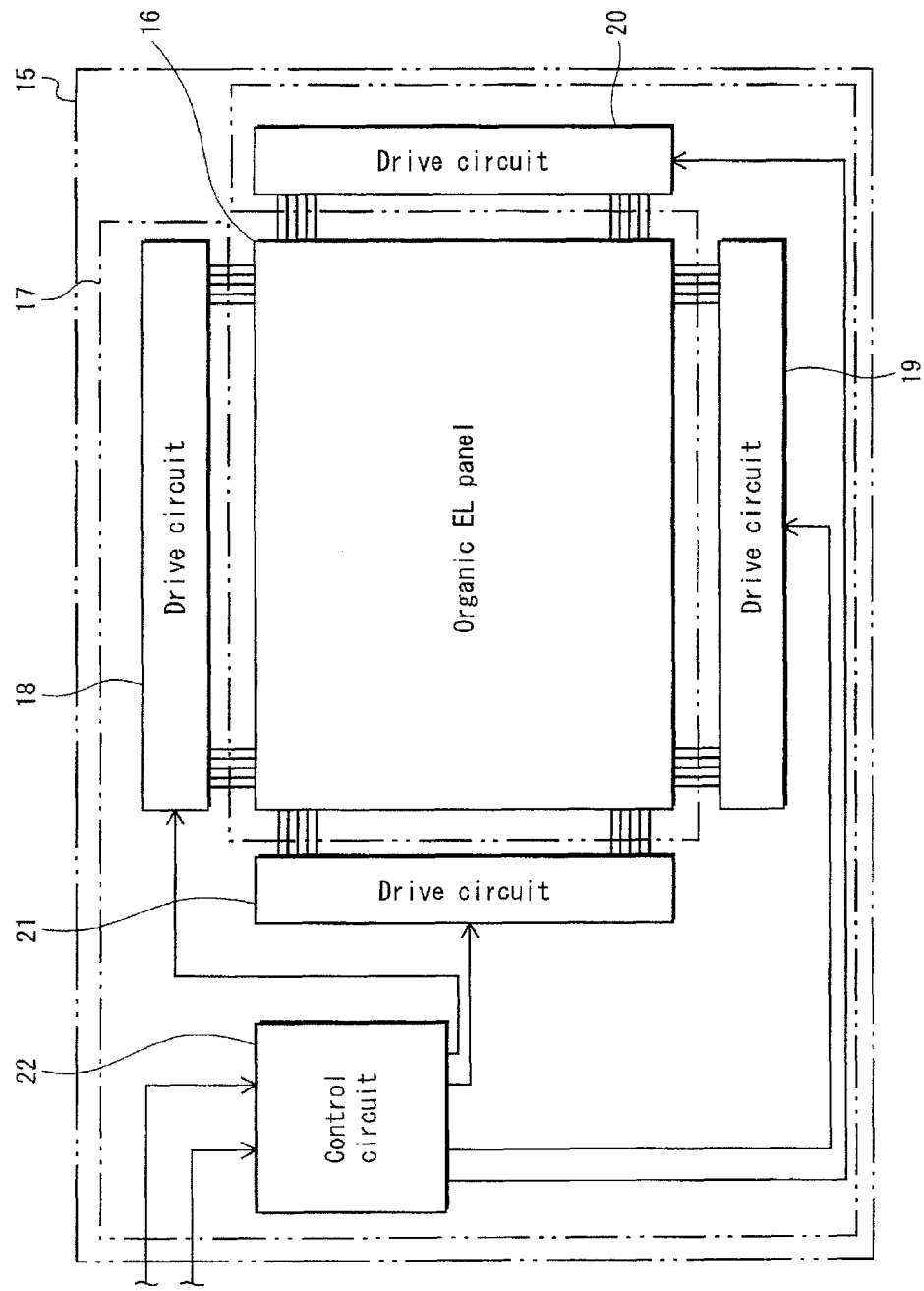
FIG. 40 shows a functional block for the display device according to the embodiment of the present invention.

FIG. 39 shows an external view of a display device according to the embodiment of the present invention. FIG. 40 shows a functional block for the display device according to the embodiment of the present invention. The display device 15 includes an organic EL panel 16 and a drive control unit 17 that are electrically connected to each other. The organic EL panel 16 has the pixel structure shown in FIG. 3. The drive control unit 17 includes drive circuits 18 to 21 that apply voltage between the reflective electrode 3 corresponding to each organic EL element and a transparent electrode 9, and a control circuit 22 that controls operations of drive circuits 18 to 21.

[Method of Manufacturing Organic EL Panel]

Next, the method of manufacturing an organic EL panel is described. FIG. 41A to FIG. 41D and FIG. 42A to FIG. 42C show a method of manufacturing an organic EL panel according to the embodiment of the present invention.

Figure 41A:
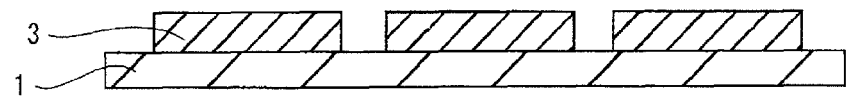
FIG. 41A to FIG. 41D show a method of manufacturing an organic EL panel according to the embodiment of the present invention.
Figure 41B:
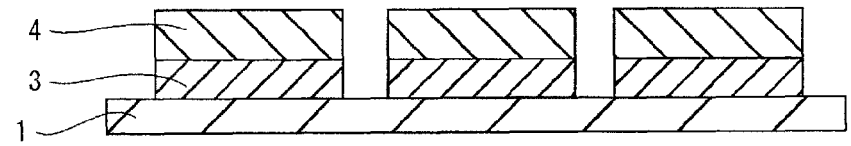
Figure 41C:
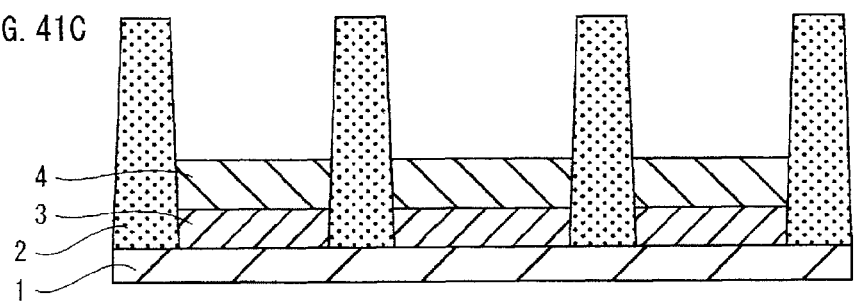
Figure 41D:
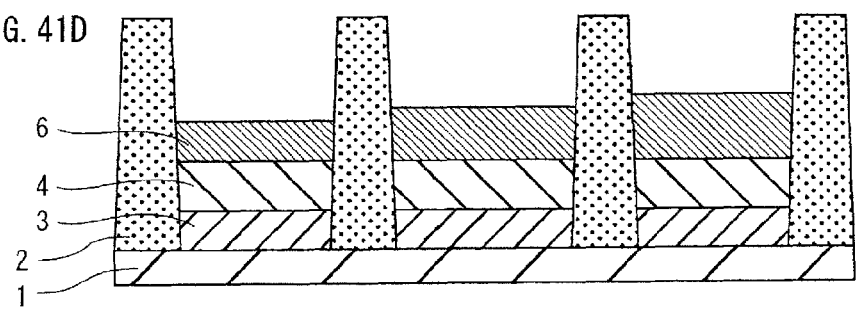
Figure 42A:
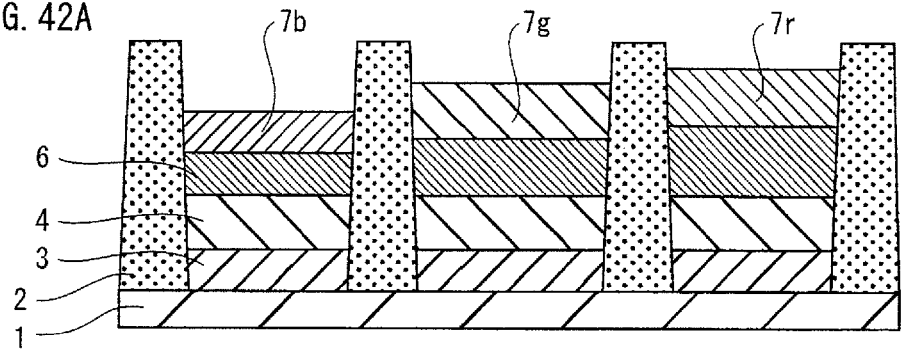
FIG. 42A to FIG. 42C show the method of manufacturing the organic EL panel according to the embodiment of the present invention.
Figure 42B:
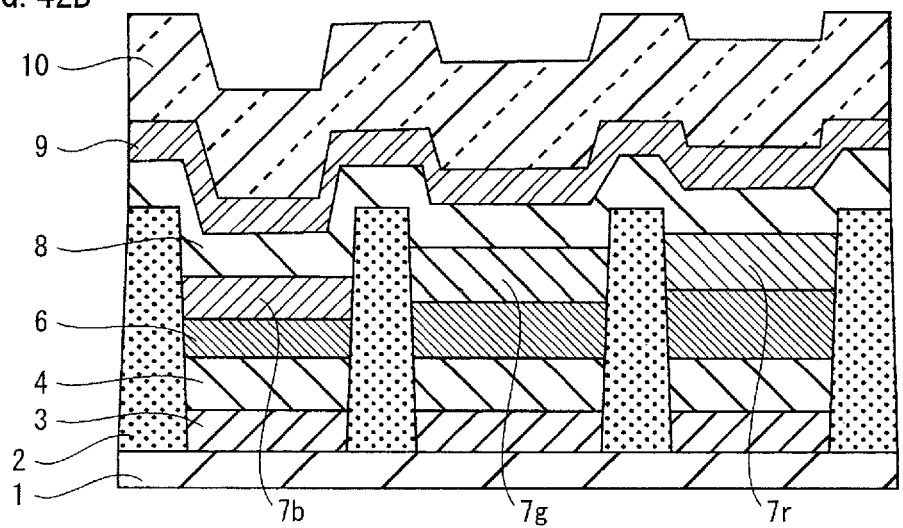
Figure 42C:
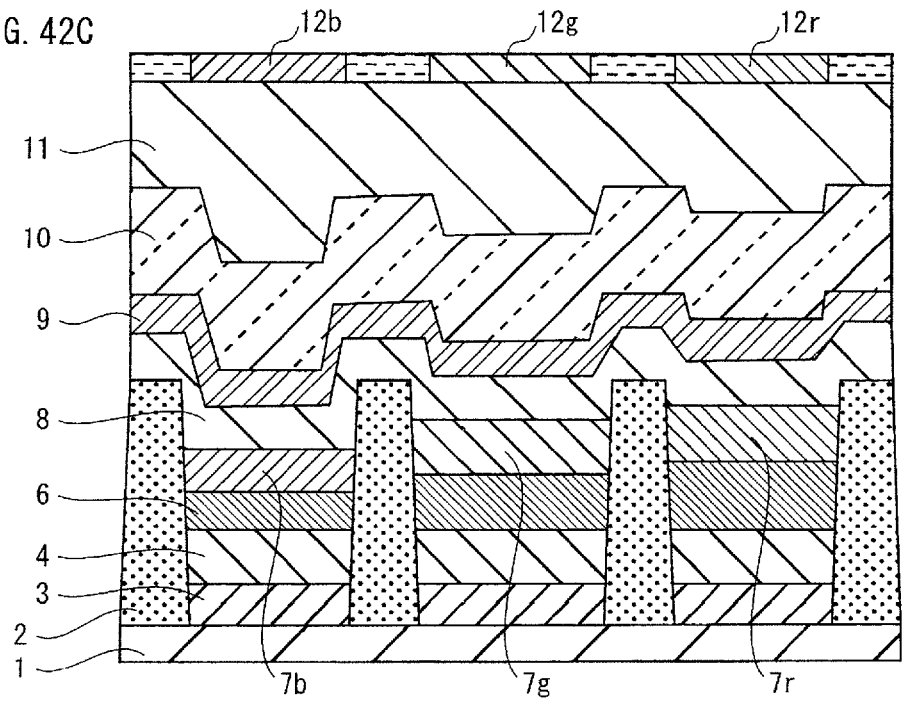

First, reflective electrodes 3 are formed on a substrate 1 by vapor deposition, sputtering, or the like (FIG. 41A). Next, transparent conductive layers 4 are formed on the respective reflective electrodes 3 by vapor deposition, sputtering, or the like (FIG. 41B). Banks 2 are formed (FIG. 41C). Then, hole transport layers 6 are formed on the respective transparent conductive layers 4 by the inkjet method or the like (FIG. 41D). Organic light-emitting layers 7b, 7g, and 7r are formed on the respective hole transport layers 6 (FIG. 42A). An electron transport layer 8, a transparent electrode 9, and a thin-film passivation layer 10 are layered (FIG. 42B). Next, a front panel in which color filters 12b, 12g, and 12r are formed is adhered to the thin-film passivation layer 10 using a resin passivation layer 11 (FIG. 42C). The film thickness of each of the transparent conductive layers 4 and the film thickness of each of the hole transport layers 6 are adjusted so as to fall within the above ranges described above as a desirable example of the thickness of the functional layer. Fine adjustment of the film thickness of the functional layer of each of the R, G, and B colors is performed by the inkjet method more simply than by vapor deposition and sputtering. For this reason, it is preferable that the respective transparent conductive layers 4 of the R, G, and B colors have the same film thickness and fine adjustment of film thickness is performed on the hole transport layers 6 separately for each of the R, G, and B colors.

In order to achieve the structure shown in FIG. 4, it is necessary to form the hole injection layers 5 on the respective transparent conductive layers 4, and then form the hole transport layers 6 on the respective hole injection layers 5. The hole injection layers 5 are formed from a metal oxide by vapor deposition, sputtering, or the like. Again in this case, for the above same reason, it is desirable that the respective transparent conductive layers 4 of the R, G, and B colors have the same film thickness, the respective hole injection layers 5 of the R, G, and B colors have the same film thickness, and fine adjustment of film thickness is performed on the hole transport layers 6 separately for each of the R, G, and B colors.

INDUSTRIAL APPLICABILITY

The present invention is applicable to organic EL displays and the like.

REFERENCE SIGNS LIST

1: substrate
2: bank
3: reflective electrode
4: transparent conductive layer
5: hole injection layer
6: hole transport layer
7b, 7g, and 7r: organic light-emitting layer
8: electron transport layer
9: reflective electrode
10: thin-film passivation layer
11: resin passivation layer
12b, 12g, and 12r: color filter
15: display device
16: organic EL panel
17: drive control unit
18, 19, 20, and 21: drive circuit
22: control circuit

The invention claimed is:

1. An organic electro luminescence (EL) panel, comprising:
   first electrodes that reflect incident light;
   a second electrode that faces the first electrodes, and transmits incident light therethrough;
   an organic light-emitting layer of each of red (R), green (G), and blue (B) colors that is disposed between a corresponding one of the first electrodes and the second electrode, and emits light of a corresponding color due to voltage application between the corresponding first electrode and the second electrode;
   a functional layer of each of the R, G, and B colors that is composed of one or more layers, and is disposed between a corresponding one of the first electrodes and the organic light-emitting layer of the corresponding color; and
   a color filter of each of the R, G, and B colors that is disposed above the organic light-emitting layer of the corresponding color, with the second electrode being interposed therebetween, wherein
   a first portion of light of each of the R, G, and B colors emitted from the organic light-emitting layer of the corresponding color travels through the second electrode instead of towards the corresponding first electrode, and is emitted externally after passing through the second electrode and the color filter of the corresponding color,
   a second portion of the light of each of the R, G, and B colors travels through the functional layer of the corresponding color towards the corresponding first electrode, strikes and is reflected by the corresponding first electrode, and is emitted externally after passing through the functional layer of the corresponding color, the organic light-emitting layer of the corresponding color, the second electrode, and the color filter of the corresponding color,
   the respective functional layers of the R, G, and B colors each have a different film thickness of 60 nm or less that falls within substantially a same range,
   the film thickness of each of the respective functional layers of the R, G, and B colors corresponds to a local maximum of light-emitting efficiency with respect to the light of the corresponding color emitted externally through the color filter of the corresponding color,
   respective optical distances between the respective organic light-emitting layers of the R, G, and B colors and the respective first electrodes are each 100 nm or less and are different within substantially a same range, and
   with respect to at least the B color, a film thickness of the functional layer is within a first optimal film thickness range that corresponds to a local maximum of light-emitting efficiency with respect to the light emitted externally from the color filter, the first optimal film thickness range being different than a second optimal film thickness range which corresponds to a local maximum of light-emitting efficiency with respect to the light emitted internally to the color filter.

2. The organic EL panel of claim 1, wherein
   the respective functional layers of the R, G, and B colors are composed of transparent conductive layers of the R, G, and B colors formed on the respective first electrodes, and hole transport layers of the R, G, and B colors formed on the respective transparent conductive layers, respectively.

3. The organic EL panel of claim 2, wherein
   the respective hole transport layers of the R, G, and B colors each have a different film thickness, and
   the respective transparent conductive layers of the R, G, and B colors have a same film thickness.

4. The organic EL panel of claim 3, wherein
   the respective hole transport layers of the R, G, and B colors have a film thickness of 13 nm to 30 nm, a film thickness of 12 nm to 21 nm, and a film thickness of 10 nm to 15 nm, respectively and
   the respective transparent conductive layers of the R, G, and B colors each have a film thickness of 15 nm to 20 nm.

5. The organic EL panel of claim 2, wherein
   the respective hole transport layers of the R, G, and B colors each have a function of injecting holes into the organic light-emitting layer of the corresponding color, in addition to a function of transporting the holes.

6. The organic EL panel of claim 1, wherein
   the respective functional layers of the R, G, and B colors are composed of transparent conductive layers of the R, G, and B colors formed on the respective first electrodes, hole injection layers of the R, G, and B colors formed on the respective transparent conductive layers of the R, G, and B colors, and hole transport layers of the R, G, and B colors formed on the respective hole injection layer of the R, G, and B colors, respectively.

7. The organic EL panel of claim 6, wherein
the respective hole transport layers of the R, G, and B colors each have a different film thickness,
the respective transparent conductive layers of the R, G, and B colors have a same film thickness, and
the respective hole injection layers of the R, G, and B colors have a same film thickness.

8. The organic EL panel of claim 7, wherein
the respective hole injection layers of the R, G, and B colors each have a film thickness of greater than 0 nm to 5 nm,
the respective hole transport layers of the R, G, and B colors have a film thickness of 15 nm to 25 nm, a film thickness of 9 nm to 16 nm, and a film thickness of 5 nm to 9 nm, respectively, and
the respective transparent conductive layers of the R, G, and B colors each have a film thickness of 15 nm to 20 nm.

9. The organic EL panel of claim 1, wherein
the respective functional layers of the R, G, and B colors have a film thickness of 28 nm to 50 nm, a film thickness of 27 nm to 41 nm, and a film thickness of 26 nm to 35 nm, respectively.

10. The organic EL panel of claim 1, wherein
the optical distance is a sum of a product of the film thickness and a refractive index for each of the layers constituting the functional layer.

11. A display device comprising the organic EL panel of claim 1 and a drive circuit that applies voltage between each of the first electrodes and the second electrode.

12. An organic electro luminescence (EL) panel, comprising:
first electrodes that reflect incident light;
a second electrode that faces the first electrodes, and transmits incident light therethrough;
an organic light-emitting layer of each of red (R), green (G), and blue (B) colors that is disposed between a corresponding one of the first electrodes and the second electrode, and emits light of a corresponding color due to voltage application between the corresponding first electrode and the second electrode;
a functional layer of each of the R, G, and B colors that is composed of one or more layers, and is disposed between a corresponding one of the first electrodes and the organic light-emitting layer of the corresponding color; and
a color filter of each of the R, G, and B colors that is disposed above the organic light-emitting layer of the corresponding color, with the second electrode being interposed therebetween, wherein
a first portion of light of each of the R, G, and B colors emitted from the organic light-emitting layer of the corresponding color travels through the second electrode instead of towards the corresponding first electrode, and is emitted externally after passing through the second electrode and the color filter of the corresponding color,
a second portion of the light of each of the R, G, and B colors travels through the functional layer of the corresponding color towards the corresponding first electrode, strikes and is reflected by the corresponding first electrode, and is emitted externally after passing through the functional layer of the corresponding color, the organic light-emitting layer of the corresponding color, the second electrode, and the color filter of the corresponding color,
the respective functional layers of the R, G, and B colors each have a different film thickness of 26 nm to 50 nm,
the respective functional layers of the R, G, and B colors differ in film thickness by 1 nm to 16 nm between the R and G colors, between the G and B colors, and between the R and B colors,
the film thickness of each of the respective functional layers of the R, G, and B colors corresponds to a local maximum of light-emitting efficiency with respect to the light of the corresponding color emitted externally through the color filter of the corresponding color,
the respective organic light-emitting layers of the R, G, and B colors each have an optical distance of 49 nm to 90 nm from the corresponding first electrode,
the respective functional layers of the R, G, and B colors differ in optical distance from the respective first electrodes by 0 nm to 25 nm between the R and G colors, between the G and B colors, and between the R and B colors, and
with respect to at least the B color, a film thickness of the functional layer is within a first optimal film thickness range that corresponds to a local maximum of light-emitting efficiency with respect to the light emitted externally from the color filter, the first optimal film thickness range being different than a second optimal film thickness range which corresponds to a local maximum of light-emitting efficiency with respect to the light emitted internally to the color filter.

13. The organic EL panel of claim 12, wherein
the respective functional layers of the R, G, and B colors are composed of transparent conductive layers of the R, G, and B colors formed on the respective first electrodes, and hole transport layers of the R, G, and B colors formed on the respective transparent conductive layers, respectively.

14. The organic EL panel of claim 13, wherein
the respective hole transport layers of the R, G, and B colors have a film thickness of 13 nm to 30 nm, a film thickness of 12 nm to 21 nm, and a film thickness of 10 nm to 15 nm, respectively and
the respective transparent conductive layers of the R, G, and B colors each have a film thickness of 15 nm to 20 nm.

15. The organic EL panel of claim 13, wherein
the respective hole transport layers of the R, G, and B colors each have a function of injecting holes into the organic light-emitting layer of the corresponding color, in addition to a function of transporting the holes.

16. The organic EL panel of claim 12, wherein
the respective functional layers of the R, G, and B colors are composed of transparent conductive layers of the R, G, and B colors formed on the respective first electrodes, hole injection layers of the R, G, and B colors formed on the respective transparent conductive layers of the R, G, and B colors, and hole transport layers of the R, G, and B colors formed on the respective hole injection layer of the R, G, and B colors, respectively.

17. The organic EL panel of claim 16, wherein
the respective hole injection layers of the R, G, and B colors each have a film thickness of greater than 0 nm to 5 nm,
the respective hole transport layers of the R, G, and B colors have a film thickness of 15 nm to 25 nm, a film thickness of 9 nm to 16 nm, and a film thickness of 5 nm to 9 nm, respectively, and
the respective transparent conductive layers of the R, G, and B colors each have a film thickness of 15 nm to 20 nm.

18. The organic EL panel of claim 12, wherein
the respective functional layers of the R, G, and B colors have a film thickness of 28 nm to 50 nm, a film thickness of 27 nm to 41 nm, and a film thickness of 26 nm to 35 nm, respectively.

19. The organic EL panel of claim 12, wherein
the optical distance is a sum of a product of the film thickness and a refractive index for each of the layers constituting the functional layer.

20. A display device comprising the organic EL panel of claim 12 and a drive circuit that applies voltage between each of the first electrodes and the second electrode.

21. A method of manufacturing an organic electro luminescence (EL) panel, comprising:
preparing first electrodes that reflect incident light;
disposing a functional layer of each of red (R), green (G), and blue (B) colors, which is composed of one or more layers, on a corresponding one of the first electrodes;
disposing an organic light-emitting layer of each of the R, G, and B colors, which emits light of a corresponding color, on the functional layer of the corresponding color;
disposing a second electrode, which transmits incident light therethrough, above the respective first electrodes with the organic light-emitting layers of the R, G, and B colors being interposed therebetween; and
disposing a color filter of each of the R, G, and B colors above the second electrode, wherein
in the disposing of the functional layer, the respective functional layers of the R, G, and B colors are formed so as to have a different film thickness of 60 nm or less that falls within substantially a same range,
the film thickness of each of the respective functional layers of the R, G, and B colors is set, such that when the film thickness is varied, the film thickness corresponds to a local maximum of light-emitting efficiency with respect to the light of the corresponding color emitted externally through the color filter of the corresponding color,
respective optical distances between the respective organic light-emitting layers of the R, G, and B colors and the respective first electrodes are each 100 nm or less and are different within substantially a same range, and
with respect to at least the B color, a film thickness of the functional layer is set in accordance with a first optimal film thickness range that corresponds to a local maximum of light-emitting efficiency with respect to the light emitted externally from the color filter, the first optimal film thickness range being different than a second optimal film thickness range which corresponds to a local maximum of light-emitting efficiency with respect to the light emitted internally to the color filter.

22. The method of manufacturing the organic EL panel of claim 21, wherein
the disposing of the functional layer includes:
forming respective transparent conductive layers of the R, G, and B colors on the respective first electrodes; and
forming respective hole transport layers of the R, G, and B colors on the respective transparent conductive layers.

23. The method of manufacturing the organic EL panel of claim 22, wherein
in the forming of the respective transparent conductive layers, the respective transparent conductive layers of the R, G, and B colors are formed so as to have a same film thickness, and
in the forming of the respective hole transport layers, the respective hole transport layers of the R, G, and B colors are formed so as to each have a different film thickness.

24. The method of manufacturing the organic EL panel of claim 23, wherein
in the forming of the respective transparent conductive layers, the respective transparent conductive layers of the R, G, and B colors are formed by vapor deposition or sputtering, and
in the forming of the respective hole transport layers, the respective hole transport layers of the R, G, and B colors are formed by an inkjet method.

25. The method of manufacturing the organic EL panel of claim 23, wherein
in the forming of the respective transparent conductive layers, the respective transparent conductive layers of the R, G, and B colors are formed so as to each have a film thickness of 15 nm to 20 nm, and
in the forming of the respective hole transport layers, the respective hole transport layers of the R, G, and B colors are formed so as to have a film thickness of 13 nm to 30 nm, a film thickness of 12 nm to 21 nm, and a film thickness of 10 nm to 15 nm, respectively.

26. The method of manufacturing the organic EL panel of claim 21, wherein
the disposing of the functional layer includes:
forming respective transparent conductive layers of the R, G, and B colors on respective first electrodes;
forming respective hole injection layers of the R, G, and B colors on the respective transparent conductive layers of the R, G, and B colors, respectively; and
forming respective hole transport layers of the R, G, and B colors on the respective hole injection layers of the R, G, and B colors, respectively.

27. The method of manufacturing the organic EL panel of claim 26, wherein
in the forming of the respective transparent conductive layers, the respective transparent conductive layers of the R, G, and B colors are formed so as to have a same film thickness,
in the forming of the respective hole injection layers, the respective hole injection layers of the R, G, and B colors are formed so as to have a same film thickness, and
in the forming of the respective hole transport layers, the respective hole transport layers of the R, G, and B colors are formed so as to each have a different film thickness.

28. The method of manufacturing the organic EL panel of claim 27, wherein
in the forming of the respective transparent conductive layers, the respective transparent conductive layers of the R, G, and B colors are formed by vapor deposition or sputtering,
in the forming of the respective hole injection layers, the respective hole injection layers of the R, G, and B colors are formed by vapor deposition or sputtering, and
in the forming of the respective hole transport layers, the respective hole transport layers of the R, G, and B colors are formed by an inkjet method.

29. The method of manufacturing the organic EL panel of claim 27, wherein
in the forming of the respective hole injection layers, the respective hole injection layers of the R, G, and B colors are formed so as to each have a film thickness of greater than 0 nm to 5 nm,
in the forming of the respective hole transport layers, the respective hole transport layers of the R, G, and B colors are formed so as to have a film thickness of 15 nm to 25 nm, a film thickness of 9 nm to 16 nm, and a film thickness of 5 nm to 9 nm, respectively, and in the forming of the respective transparent conductive layers, the respective transparent conductive layers of the R, G, and B colors are formed so as to each have a film thickness of 15 nm to 20 nm.

30. The method of manufacturing the organic EL panel of claim 21, wherein in the disposing of the functional layer, the respective functional layers of the R, G, and B colors are formed so as to have a film thickness of 28 nm to 50 nm, a film thickness of 27 nm to 41 nm, and a film thickness of 26 nm to 35 nm, respectively.

31. A method of manufacturing an organic electro luminescence (EL) panel, comprising:

preparing first electrodes that reflect incident light;

disposing a functional layer of each of red (R), green (G), and blue (B) colors, which is composed of one or more layers, on a corresponding one of the first electrodes;

disposing an organic light-emitting layer of each of the R, G, and B colors, which emits light of a corresponding color, on the functional layer of the corresponding color;

disposing a second electrode, which transmits incident light therethrough, above the respective first electrodes with the organic light-emitting layers of the R, G, and B colors being interposed therebetween; and disposing a color filter of each of the R, G, and B colors above the second electrode, wherein in the disposing of the functional layer, the respective functional layers of the R, G, and B colors are formed so as to differ in film thickness by 1 nm to 16 nm between the R and G colors, between the G and B colors, and between the R and B colors, the film thickness of each of the respective functional layers of the R, G, and B colors is set, such that when the film thickness is varied, the film thickness corresponds to a local maximum of light-emitting efficiency with respect to the light of the corresponding color emitted externally through the color filter of the corresponding color, the respective organic light-emitting layers of the R, G, and B colors each have an optical distance of 49 nm to 90 nm from the corresponding first electrode, the respective functional layers of the R, G, and B colors differ in optical distance from the respective first electrodes by 0 nm to 25 nm between the R and G colors, between the G and B colors, and between the R and B colors, and with respect to at least the B color, a film thickness of the functional layer is set in accordance with a first optimal film thickness range that corresponds to a local maximum of light-emitting efficiency with respect to the light emitted externally from the color filter, the first optimal film thickness range being different than a second optimal film thickness range which corresponds to a local maximum of light-emitting efficiency with respect to the light emitted internally to the color filter.

32. The method of manufacturing the organic EL panel of claim 31, wherein the disposing of the functional layer includes:

forming respective transparent conductive layers of the R, G, and B colors on the respective first electrodes; and forming respective hole transport layers of the R, G, and B colors on the respective transparent conductive layers.

33. The method of manufacturing the organic EL panel of claim 32, wherein in the forming of the respective transparent conductive layers, the respective transparent conductive layers of the R, G, and B colors are formed so as to have a same film thickness, and in the forming of the respective hole transport layers, the respective hole transport layers of the R, G, and B colors are formed so as to each have a different film thickness.

34. The method of manufacturing the organic EL panel of claim 33, wherein in the forming of the respective transparent conductive layers, the respective transparent conductive layers of the R, G, and B colors are formed by vapor deposition or sputtering, and in the forming of the respective hole transport layers, the respective hole transport layers of the R, G, and B colors are formed by an inkjet method.

35. The method of manufacturing the organic EL panel of claim 33, wherein in the forming of the respective transparent conductive layers, the respective transparent conductive layers of the R, G, and B colors are formed so as to each have a film thickness of 15 nm to 20 nm, and in the forming of the respective hole transport layers, the respective hole transport layers of the R, G, and B colors are formed so as to have a film thickness of 13 nm to 30 nm, a film thickness of 12 nm to 21 nm, and a film thickness of 10 nm to 15 nm, respectively.

36. The method of manufacturing the organic EL panel of claim 31, wherein the disposing of the functional layer includes:

forming respective transparent conductive layers of the R, G, and B colors on respective first electrodes;

forming respective hole injection layers of the R, G, and B colors on the respective transparent conductive layers of the R, G, and B colors, respectively; and forming respective hole transport layers of the R, G, and B colors on the respective hole injection layers of the R, G, and B colors, respectively.

37. The method of manufacturing the organic EL panel of claim 36, wherein in the forming of the respective transparent conductive layers, the respective transparent conductive layers of the R, G, and B colors are formed so as to have a same film thickness, in the forming of the respective hole injection layers, the respective hole injection layers of the R, G, and B colors are formed so as to have a same film thickness, and in the forming of the respective hole transport layers, the respective hole transport layers of the R, G, and B colors are formed so as to each have a different film thickness.

38. The method of manufacturing the organic EL panel of claim 37, wherein in the forming of the respective transparent conductive layers, the respective transparent conductive layers of the R, G, and B colors are formed by vapor deposition or sputtering, in the forming of the respective hole injection layers, the respective hole injection layers of the R, G, and B colors are formed by vapor deposition or sputtering, and in the forming of the respective hole transport layers, the respective hole transport layers of the R, G, and B colors are formed by an inkjet method.

39. The method of manufacturing the organic EL panel of claim 37, wherein
- in the forming of the respective hole injection layers, the respective hole injection layers of the R, G, and B colors are formed so as to each have a film thickness of greater than 0 nm to 5 nm,
- in the forming of the respective hole transport layers, the respective hole transport layers of the R, G, and B colors are formed so as to have a film thickness of 15 nm to 25 nm, a film thickness of 9 nm to 16 nm, and a film thickness of 5 nm to 9 nm, respectively, and
- in the forming of the respective transparent conductive layers, the respective transparent conductive layers of the R, G, and B colors are formed so as to each have a film thickness of 15 nm to 20 nm.

40. The method of manufacturing the organic EL panel of claim 31, wherein
- in the disposing of the functional layer, the respective functional layers of the R, G, and B colors are formed so as to have a film thickness of 28 nm to 50 nm, a film thickness of 27 nm to 41 nm, and a film thickness of 26 nm to 35 nm, respectively.

* * * * *